United States Patent
Uesaka et al.

(10) Patent No.: US 9,660,220 B2
(45) Date of Patent: May 23, 2017

(54) MULTIPLE LIGHT-EMITTING ELEMENT DEVICE

(71) Applicant: Semiconductor Energy Laboratory Co., Ltd., Kanagawa-ken (JP)

(72) Inventors: Shogo Uesaka, Kanagawa (JP); Toshiki Sasaki, Kanagawa (JP); Riho Kataishi, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/920,281

(22) Filed: Oct. 22, 2015

(65) Prior Publication Data

US 2016/0126500 A1    May 5, 2016

(30) Foreign Application Priority Data

Oct. 24, 2014  (JP) .................................. 2014-216876

(51) Int. Cl.
*H01L 51/52* (2006.01)
*H01L 51/50* (2006.01)
*H01L 27/32* (2006.01)

(52) U.S. Cl.
CPC ...... *H01L 51/5265* (2013.01); *H01L 51/5044* (2013.01); *H01L 27/323* (2013.01); *H01L 2251/5376* (2013.01)

(58) Field of Classification Search
CPC .......................... H01L 51/5265; H01L 51/5044
See application file for complete search history.

(56) References Cited

U.S. PATENT DOCUMENTS

| | | | |
|---|---|---|---|
| 6,281,634 B1 | 8/2001 | Yokoyama | |
| 8,288,784 B2 * | 10/2012 | Cho | H01L 51/5036 257/40 |
| 8,294,143 B2 * | 10/2012 | Imai | H01L 27/322 257/40 |
| 8,729,795 B2 * | 5/2014 | Nomura | H01L 51/5092 257/40 |
| 8,957,442 B2 * | 2/2015 | Seo | H01L 27/3209 257/40 |
| 9,000,458 B2 * | 4/2015 | Seo | H01L 51/5044 257/89 |

(Continued)

FOREIGN PATENT DOCUMENTS

JP           2012-182127 A       9/2012

*Primary Examiner* — Ida M Soward
(74) *Attorney, Agent, or Firm* — Husch Blackwell LLP

(57) ABSTRACT

To provide a novel light-emitting element or a novel light-emitting device with high emission efficiency and low power consumption, a light-emitting element having a plurality of light-emitting layers between a pair of electrodes includes a lower electrode, a first light-emitting layer over the lower electrode, a charge-generation layer over the first light-emitting layer, a second light-emitting layer over the charge-generation layer, and an upper electrode over the second light-emitting layer. An emission spectrum of the first light-emitting layer peaks at a longer wavelength than an emission spectrum of the second light-emitting layer. A distance of between a bottom surface of the upper electrode and a bottom surface of the first light-emitting layer is less than or equal to 130 nm.

7 Claims, 34 Drawing Sheets

(56) References Cited

U.S. PATENT DOCUMENTS

| | | | |
|---|---|---|---|
| 9,006,755 B2* | 4/2015 | Seo | H01L 51/504 |
| | | | 257/88 |
| 9,093,404 B2* | 7/2015 | Yokoyama | H01L 51/5056 |
| 9,111,882 B1* | 8/2015 | Chen | H01L 27/322 |
| 9,153,627 B2* | 10/2015 | Ohsawa | H01L 27/3206 |
| 9,287,332 B2* | 3/2016 | Hatano | H01L 51/504 |
| 9,391,128 B2* | 7/2016 | Nomura | H01L 51/5265 |
| 2007/0035243 A1 | 2/2007 | Lee | |
| 2007/0176161 A1 | 8/2007 | Seo et al. | |
| 2009/0242911 A1* | 10/2009 | Ishihara | H01L 27/3211 |
| | | | 257/89 |
| 2010/0231484 A1 | 9/2010 | Cok et al. | |
| 2012/0099054 A1* | 4/2012 | Takeuchi | G02B 5/201 |
| | | | 349/98 |
| 2012/0205676 A1 | 8/2012 | Seo et al. | |
| 2012/0205685 A1 | 8/2012 | Seo et al. | |
| 2012/0205686 A1 | 8/2012 | Seo et al. | |
| 2012/0206675 A1 | 8/2012 | Seo et al. | |
| 2012/0241726 A1* | 9/2012 | Kijima | H01L 51/5278 |
| | | | 257/40 |
| 2012/0243219 A1 | 9/2012 | Ohsawa et al. | |
| 2013/0001532 A1* | 1/2013 | Hwang | H01L 51/0058 |
| | | | 257/40 |
| 2013/0001607 A1* | 1/2013 | Goda | H01L 51/5096 |
| | | | 257/88 |
| 2013/0264549 A1 | 10/2013 | Yamazaki et al. | |
| 2013/0265320 A1 | 10/2013 | Yamazaki et al. | |
| 2014/0117339 A1 | 5/2014 | Seo | |
| 2014/0134771 A1 | 5/2014 | Noda et al. | |
| 2014/0225102 A1 | 8/2014 | Ikeda et al. | |
| 2014/0284575 A1 | 9/2014 | Sugisawa et al. | |
| 2014/0284576 A1 | 9/2014 | Sugisawa et al. | |
| 2015/0214273 A1* | 7/2015 | Seo | H01L 27/3209 |
| | | | 257/89 |
| 2015/0214506 A1* | 7/2015 | Seo | H01L 51/5044 |
| | | | 257/98 |
| 2015/0221703 A1* | 8/2015 | Seo | H01L 51/504 |
| | | | 257/40 |
| 2015/0236266 A1* | 8/2015 | Kho | H01L 51/006 |
| | | | 257/40 |
| 2015/0311250 A1 | 10/2015 | Seo et al. | |
| 2016/0027849 A1* | 1/2016 | Ohsawa | H01L 27/3206 |
| | | | 257/40 |

* cited by examiner

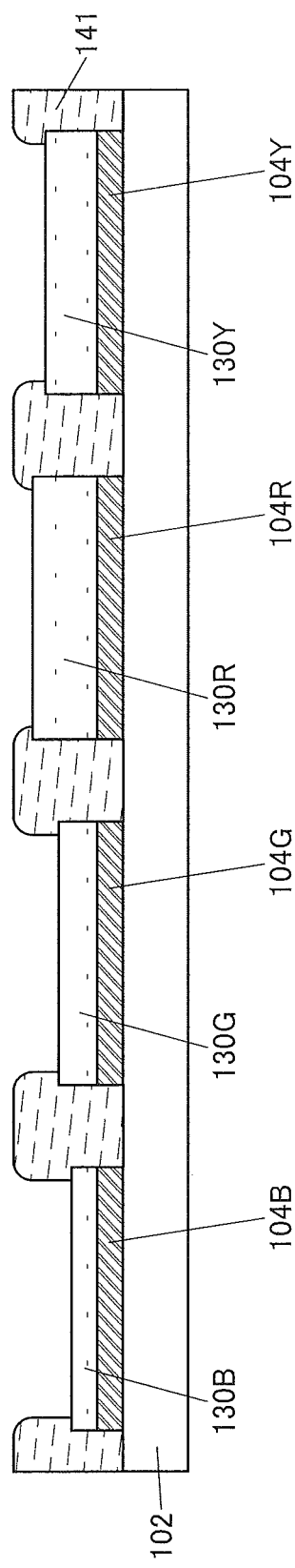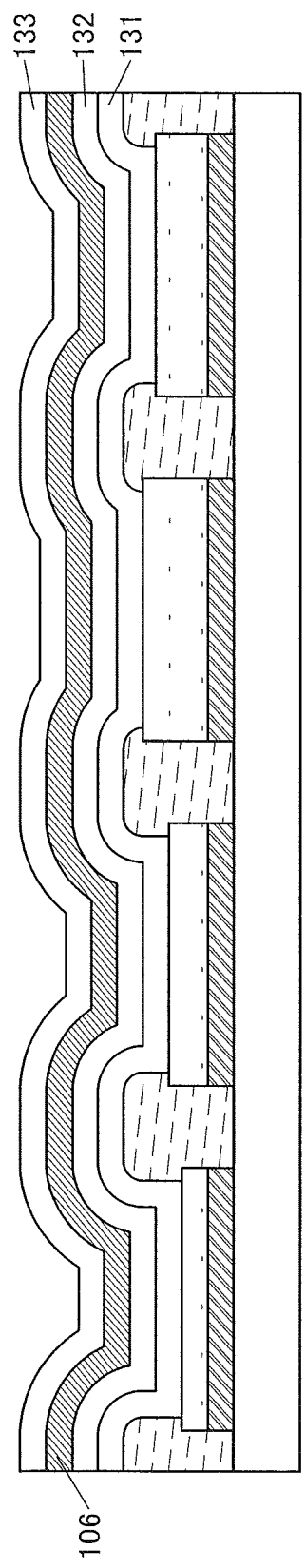

MULTIPLE LIGHT-EMITTING ELEMENT DEVICE

BACKGROUND OF THE INVENTION

1. Field of the Invention

One embodiment of the present invention relates to a light-emitting element in which a light-emitting layer capable of providing light emission by application of an electric field is provided between a pair of electrodes, and also relates to a light-emitting device, an electronic device, and a lighting device each including such a light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a driving method thereof, and a manufacturing method thereof.

2. Description of the Related Art

In recent years, research and development have been extensively conducted on light-emitting elements utilizing electroluminescence (EL). In a basic structure of these light-emitting elements, a layer containing a light-emitting substance is provided between a pair of electrodes. By application of a voltage to this element, light emitted from the light-emitting substance can be obtained.

Since the above light-emitting element is a self-luminous type, a light-emitting device using this light-emitting element has advantages such as high visibility, no necessity of a backlight, and low power consumption. The light-emitting device using the light-emitting element also has advantages in that it can be manufactured to be thin and lightweight and has high response speed.

In order to improve the extraction efficiency of light from a light-emitting element, a method has been proposed, in which a micro optical resonator (microcavity) structure utilizing a resonant effect of light between a pair of electrodes is used to increase the intensity of light having a specific wavelength (e.g., see Patent Document 1).

REFERENCE

Patent Document

[Patent Document 1] Japanese Published Patent Application No. 2012-182127

SUMMARY OF THE INVENTION

When a metal film with high reflectance (e.g., a metal film containing silver) is used as one of a pair of electrodes in a micro optical resonator structure (hereinafter referred to as a microcavity structure) utilizing a resonant effect of light between the pair of electrodes, light might be scattered or absorbed in the vicinity of a surface of the metal film with high reflectance under the influence of surface plasmon resonance (SPR), resulting in lower light extraction efficiency.

In view of the above problems, an object of one embodiment of the present invention is to provide a novel light-emitting element. Another object of one embodiment of the present invention is to provide a novel light-emitting device. Another object is to provide a novel light-emitting element or a novel light-emitting device with high emission efficiency and low power consumption. Another object is to provide a method for manufacturing the novel light-emitting device.

Note that the description of the above objects does not disturb the existence of other objects. In one embodiment of the present invention, there is no need to achieve all the objects. Other objects will be apparent and can be derived from the description of the specification and the like.

One embodiment of the present invention is a light-emitting element having a plurality of light-emitting layers between a pair of electrodes. The light-emitting element includes a lower electrode, a first light-emitting layer over the lower electrode, a charge-generation layer over the first light-emitting layer, a second light-emitting layer over the charge-generation layer, and an upper electrode over the second light-emitting layer. An emission spectrum of the first light-emitting layer peaks at a longer wavelength than an emission spectrum of the second light-emitting layer. A distance between a bottom surface of the upper electrode and a bottom surface of the first light-emitting layer is less than or equal to 130 nm.

Another embodiment of the present invention is a light-emitting element having a plurality of light-emitting layers between a pair of electrodes. The light-emitting element includes a lower electrode, a hole-injection layer over the lower electrode, a first hole-transport layer over the hole-injection layer, a first light-emitting layer over the first hole-transport layer, a charge-generation layer over the first light-emitting layer, a second hole-transport layer over the charge-generation layer, a second light-emitting layer over the second hole-transport layer, an electron-transport layer over the second light-emitting layer, and an upper electrode over the electron-transport layer. An emission spectrum of the first light-emitting layer peaks at a longer wavelength than an emission spectrum of the second light-emitting layer. A distance between a bottom surface of the upper electrode and a bottom surface of the first light-emitting layer is less than or equal to 130 nm.

Another embodiment of the present invention is a light-emitting device that emits light of a plurality of colors. The light-emitting device includes a first light-emitting element having a function of emitting blue light, a second light-emitting element having a function of emitting green light, and a third light-emitting element having a function of emitting red light. The first light-emitting element includes a first lower electrode, a first transparent conductive layer over the first lower electrode, a first light-emitting layer over the first transparent conductive layer, a charge-generation layer over the first light-emitting layer, a second light-emitting layer over the charge-generation layer, and an upper electrode over the second light-emitting layer. The second light-emitting element includes a second lower electrode, a second transparent conductive layer over the second lower electrode, the first light-emitting layer over the second transparent conductive layer, the charge-generation layer over the first light-emitting layer, the second light-emitting layer over the charge-generation layer, and the upper electrode over the second light-emitting layer. The third light-emitting element includes a third lower electrode, a third transparent conductive layer over the third lower electrode, the first light-emitting layer over the third transparent conductive layer, the charge-generation layer over the first light-emitting layer, the second light-emitting layer over the charge-generation layer, and the upper electrode over the second light-emitting layer. An emission spectrum of the first light-emitting layer peaks at a longer wavelength than an emission spectrum of the second light-emitting layer. A distance between a bottom surface of the upper electrode and a bottom surface of the first light-emitting layer is less than or equal to 130 nm.

Another embodiment of the present invention is a light-emitting device that emits light of a plurality of colors. The light-emitting device includes a first light-emitting element having a function of emitting blue light, a second light-emitting element having a function of emitting green light, a third light-emitting element having a function of emitting red light, and a fourth light-emitting element having a function of emitting yellow light. The first light-emitting element includes a first lower electrode, a first transparent conductive layer over the first lower electrode, a first light-emitting layer over the first transparent conductive layer, a charge-generation layer over the first light-emitting layer, a second light-emitting layer over the charge-generation layer, and an upper electrode over the second light-emitting layer. The second light-emitting element includes a second lower electrode, a second transparent conductive layer over the second lower electrode, the first light-emitting layer over the second transparent conductive layer, the charge-generation layer over the first light-emitting layer, the second light-emitting layer over the charge-generation layer, and the upper electrode over the second light-emitting layer. The third light-emitting element includes a third lower electrode, a third transparent conductive layer over the third lower electrode, the first light-emitting layer over the third transparent conductive layer, the charge-generation layer over the first light-emitting layer, the second light-emitting layer over the charge-generation layer, and the upper electrode over the second light-emitting layer. The fourth light-emitting element includes a fourth lower electrode, a fourth transparent conductive layer over the fourth lower electrode, the first light-emitting layer over the fourth transparent conductive layer, the charge-generation layer over the first light-emitting layer, the second light-emitting layer over the charge-generation layer, and the upper electrode over the second light-emitting layer. An emission spectrum of the first light-emitting layer peaks at a longer wavelength than an emission spectrum of the second light-emitting layer. A distance between a bottom surface of the upper electrode and a bottom surface of the first light-emitting layer is less than or equal to 130 nm.

In any one of the above embodiments, it is preferable that a spectrum of light emitted from the first light-emitting layer have a peak of any one of green, yellow green, yellow, orange, and red, and a spectrum of light emitted from the second light-emitting layer have a peak of any one of violet, blue, and blue green. Moreover, in any of the above embodiments, it is preferable that the first light-emitting layer include a phosphorescent material and the second light-emitting layer include a fluorescent material.

In any one of the above embodiments, a distance between the bottom surface of the upper electrode and a bottom surface of the second light-emitting layer is preferably less than 80 nm. Moreover, in any one of the above embodiments, a distance between a top surface of the first light-emitting layer and the bottom surface of the second light-emitting layer is preferably less than or equal to 40 nm.

In any one of the above embodiments, it is preferable that a light-emitting region of the first light-emitting layer be formed at a distance of approximately $\lambda_Y/4$ from the bottom surface of the upper electrode ($\lambda_Y$ represents a yellow wavelength) and a light-emitting region of the second light-emitting layer be formed at a distance of approximately $\lambda_B/4$ from the bottom surface of the upper electrode ($\lambda_B$ represents a blue wavelength). Note that in this specification and the like, approximately $\lambda_X/4$ ($\lambda_X$ represents any one of $\lambda_R$, $\lambda_G$, $\lambda_B$, and $\lambda_Y$) is within the range of ±20 nm of $\lambda_X/4$, preferably ±10 nm of $\lambda_X/4$.

Another embodiment of the present invention is an electronic device including the light-emitting element according to any one of the above embodiments or the light-emitting device according to any one of the above embodiments, and a housing or a touch sensor. Another embodiment of the present invention is a lighting device including the light-emitting element according to any one of the above embodiments or the light-emitting device according to any one of the above embodiments, and a housing. Note that a light-emitting device in this specification refers to an image display device or a light source (including a lighting device). Furthermore, a light-emitting device might include, in its category, all of a module in which a light-emitting device is connected to a connector such as a flexible printed circuit (FPC) or a tape carrier package (TCP), a module in which a printed wiring board is provided on the tip of a TCP, and a module in which an integrated circuit (IC) is directly mounted on a light-emitting element by a chip on glass (COG) method.

According to one embodiment of the present invention, a novel light-emitting element can be provided. According to another embodiment of the present invention, a novel light-emitting device can be provided. According to another embodiment of the present invention, a novel light-emitting element or a novel light-emitting device with high emission efficiency and low power consumption can be provided. According to another embodiment of the present invention, a method for manufacturing the novel light-emitting device can be provided.

Note that the description of these effects does not disturb the existence of other effects. One embodiment of the present invention does not necessarily achieve all the effects listed above. Other effects will be apparent and can be derived from the description of the specification, the drawings, the claims, and the like.

BRIEF DESCRIPTION OF THE DRAWINGS

FIGS. 14A and 14B are cross-sectional views illustrating a method for manufacturing a light-emitting device.

DETAILED DESCRIPTION OF THE INVENTION

Figure 1A:
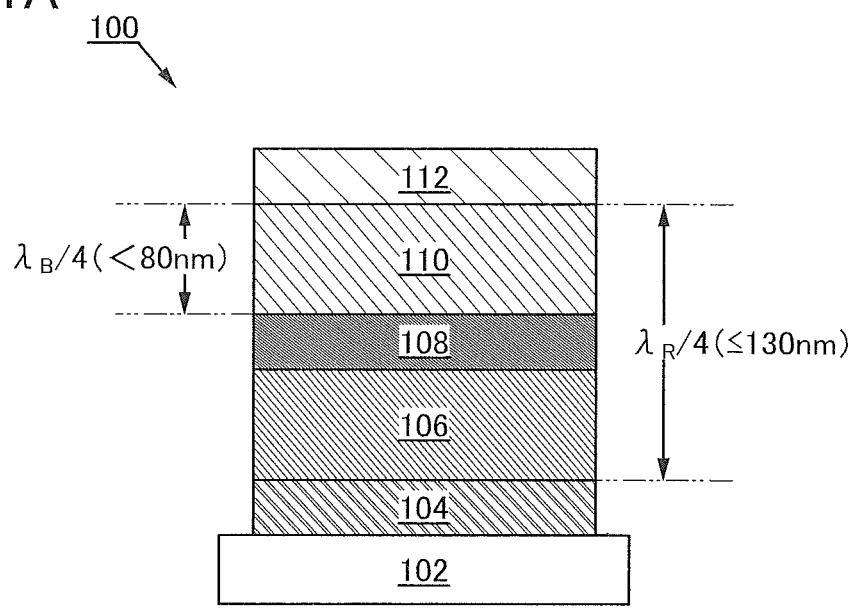
FIGS. 1A and 1B are cross-sectional views each illustrating a light-emitting element.

Embodiments of the present invention will be described in detail below with reference to the drawings. Note that one embodiment of the present invention is not limited to the following description, and the modes and details thereof can be modified in various ways without departing from the spirit and scope of the present invention. Accordingly, one embodiment of the present invention should not be interpreted as being limited to the content of the embodiments below.

Note that the position, the size, the range, or the like of each structure illustrated in drawings and the like is not accurately represented in some cases for easy understanding. Therefore, one embodiment of the disclosed invention is not necessarily limited to the position, the size, the range, or the like disclosed in the drawings and the like.

The ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In order to describe structures of the invention with reference to the drawings in this specification and the like, the same reference numerals are used in common for the same portions in different drawings.

In this specification and the like, the wavelength range of blue light is greater than or equal to 400 nm and less than 480 nm, the wavelength range of green light is greater than or equal to 480 nm and less than 540 nm, the wavelength range of yellow light is greater than or equal to 540 nm and less than 600 nm, and the wavelength range of red light is greater than or equal to 600 nm and less than or equal to 780 nm.

In this specification and the like, a transparent conductive layer transmits visible light and has conductivity. Examples of the transparent conductive layer include an oxide conductor film typified by an indium tin oxide (ITO) film, an oxide semiconductor film, an organic conductive film containing an organic substance, and the like. Examples of the organic conductive film containing an organic substance include a film containing a composite material in which an organic compound and an electron donor (donor) are mixed, a film containing a composite material in which an organic compound and an electron acceptor (acceptor) are mixed, and the like. The resistivity of the transparent conductive layer is preferably lower than or equal to $1 \times 10^5$ Ω·cm and further preferably lower than or equal to $1 \times 10^4$ Ω·cm.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Embodiment 1

In this embodiment, a light-emitting element of one embodiment of the present invention will be described below with reference to FIGS. 1A and 1B, FIGS. 2A and 2B, FIGS. 3A and 3B, and FIG. 4.

<Structural Example 1 of Light-Emitting Element>

FIG. 1A is a cross-sectional view illustrating an example of a light-emitting element of one embodiment of the present invention. A light-emitting element 100 illustrated in FIG. 1A includes a lower electrode 104 over a substrate 102, a first light-emitting layer 106 over the lower electrode 104, a charge-generation layer 108 over the first light-emitting layer 106, a second light-emitting layer 110 over the charge-generation layer 108, and an upper electrode 112 over the second light-emitting layer 110. The emission spectrum of the first light-emitting layer 106 peaks at a longer wavelength than that of the second light-emitting layer 110. In addition, the first light-emitting layer 106 is formed such that the distance between the bottom surface of the upper electrode 112 and the bottom surface of the first light-emitting layer 106 is less than or equal to 130 nm.

The first light-emitting layer 106 and the second light-emitting layer 110 each contain a light-emitting substance. A spectrum of light emitted from the first light-emitting layer 106 has a peak of one of green, yellow green, yellow, orange, and red, and a spectrum of light emitted from the second light-emitting layer 110 has a peak of one of violet, blue, and blue green.

The following description is made assuming that the lower electrode 104 is an anode and the upper electrode 112 is a cathode in this embodiment.

By application of a voltage to the light-emitting element 100, holes injected from the lower electrode 104 side and electrons injected from the upper electrode 112 side are recombined in the first light-emitting layer 106 and the second light-emitting layer 110, and light-emitting substances contained in the first light-emitting layer 106 and the second light-emitting layer 110 are excited. Then, light is emitted when the excited light-emitting substances return to the ground state. That is, a spectrum of light emitted from the first light-emitting layer 106 can have a peak of any one of green, yellow green, yellow, orange, and red, and a spectrum of light emitted from the second light-emitting layer 110 can have a peak of any one of violet, blue, and blue green.

For example, the first light-emitting layer 106 can be formed using a phosphorescent material emitting yellow light as a light-emitting substance, and the second light-emitting layer 110 can be formed using a fluorescent material emitting blue light as a light-emitting substance.

The charge-generation layer 108 between the first light-emitting layer 106 and the second light-emitting layer 110 has a function of injecting electrons into one of the light-emitting layers (e.g., the first light-emitting layer 106) and injecting holes into the other light-emitting layer (e.g., the second light-emitting layer 110), when a voltage is applied between the lower electrode 104 and the upper electrode 112.

Furthermore, the light-emitting element 100 illustrated in FIG. 1A has a microcavity structure. The microcavity structure is described below.

Light emitted from the first light-emitting layer 106 and the second light-emitting layer 110 resonates between a pair of electrodes (the lower electrode 104 and the upper electrode 112). The first light-emitting layer 106 is formed on a wavelength side where the wavelength of the emitted light is intensified. For example, the optical path length between the lower electrode 104 and the charge-generation layer 108 and the optical path length between the upper electrode 112 and the lower electrode 104 are adjusted, so that the wavelength of the light emitted from the first light-emitting layer 106 can be intensified. In addition, the second light-emitting layer 110 is formed on a wavelength side where the wavelength of the light emission is intensified. For example, the optical path length between the lower electrode 104 and the upper electrode 112 and the optical path length between the upper electrode 112 and the charge-generation layer 108 are adjusted, so that the wavelength of the light emitted from the second light-emitting layer 110 can be intensified.

Furthermore, in the light-emitting element 100, the above-described optical path lengths are satisfied and the optical path length between the lower electrode 104 and the upper electrode 112 is adjusted so as to be $m\lambda_X/2$ (m is a natural number and $\lambda_X$ is a wavelength of light of a desired color).

In the case of what is called a tandem light-emitting element having a structure in which a plurality of light-emitting layers (here, the first light-emitting layer 106 and the second light-emitting layer 110) are stacked with the charge-generation layer 108 provided therebetween as in the light-emitting element 100 illustrated in FIG. 1A, it is necessary to optimize the optical path lengths of the first light-emitting layer 106 and the second light-emitting layer 110. A conventional tandem light-emitting element has been difficult to form on a wavelength side where the wavelengths of light emitted from light-emitting layers are intensified with each other by optimizing optical path lengths.

Thus, in the light-emitting element 100 of one embodiment of the present invention, the emission spectrum of the first light-emitting layer 106, which is distant from the upper electrode 112, peaks at a longer wavelength than that of the second light-emitting layer 110, which is close to the upper electrode 112. In addition, the distance between the bottom surface of the upper electrode 112 and the bottom surface of each light-emitting layer (the first light-emitting layer 106 and the second light-emitting layer 110) is adjusted so that the optical path length is approximately $\lambda_X/4$ ($\lambda_X$ represents a wavelength of light of a desired color) which corresponds to a minimum wavelength that is obtained from the intensified wavelengths of light from the light-emitting layers.

For example, in the case where the wavelength range of light emitted from the first light-emitting layer 106, which is red, is greater than or equal to 600 nm and less than or equal to 780 nm, the optical path length between the bottom surface of the upper electrode 112 and the bottom surface of the first light-emitting layer 106 is less than or equal to 195 nm. In the case where the wavelength range of light emitted from the second light-emitting layer 110, which is blue, is greater than or equal to 400 nm and less than 480 nm, the optical path length between the bottom surface of the upper electrode 112 and the bottom surface of the second light-emitting layer 110 is less than 120 nm. Note that an optical path length is represented by "actual distance×refractive index"; thus, when the refractive index of an organic compound which forms the first light-emitting layer 106, the charge-generation layer 108, and the second light-emitting layer 110 is set to be greater than or equal to 1.5 and less than or equal to 2.0, the distance between the bottom surface of the upper electrode 112 and the bottom surface of the first light-emitting layer 106 is less than or equal to 130 nm. That is, the first light-emitting layer 106 is formed at a distance of less than or equal to 130 nm from the bottom surface of the upper electrode 112. The distance between the bottom surface of the upper electrode 112 and the bottom surface of the second light-emitting layer 110 is less than 80 nm. That is, the second light-emitting layer 110 is formed at a distance of less than 80 nm from the bottom surface of the upper electrode 112.

Furthermore, when the distance between the bottom surface of the upper electrode 112 and the bottom surface of the first light-emitting layer 106 is set to less than or equal to 130 nm and the distance between the bottom surface of the upper electrode 112 and the bottom surface of the second light-emitting layer 110 is set to less than 80 nm, the distance between the bottom surface of the second light-emitting layer 110 and the bottom surface of the first light-emitting layer 106 can be set to less than or equal to 50 nm. The distance between the first light-emitting layer 106 and the second light-emitting layer 110 can be further obtained by subtracting the thickness of the first light-emitting layer 106 from 50 nm. For example, in the case where the thickness of the first light-emitting layer 106 is 10 nm, the distance between the first light-emitting layer 106 and the second light-emitting layer 110 is less than or equal to 40 nm. In the case where the thickness of the first light-emitting layer 106 is 20 nm, the distance between the first light-emitting layer 106 and the second light-emitting layer 110 is less than or equal to 30 nm. The distance between the first light-emitting layer 106 and the second light-emitting layer 110 is in the above range, whereby the first light-emitting layer 106 and the second light-emitting layer 110 can be formed on a wavelength side where the wavelengths of light emitted from the light-emitting layers are intensified with each other, and the optical path lengths of the first light-emitting layer 106 and the second light-emitting layer 110 can be optimized.

Figure 1B:
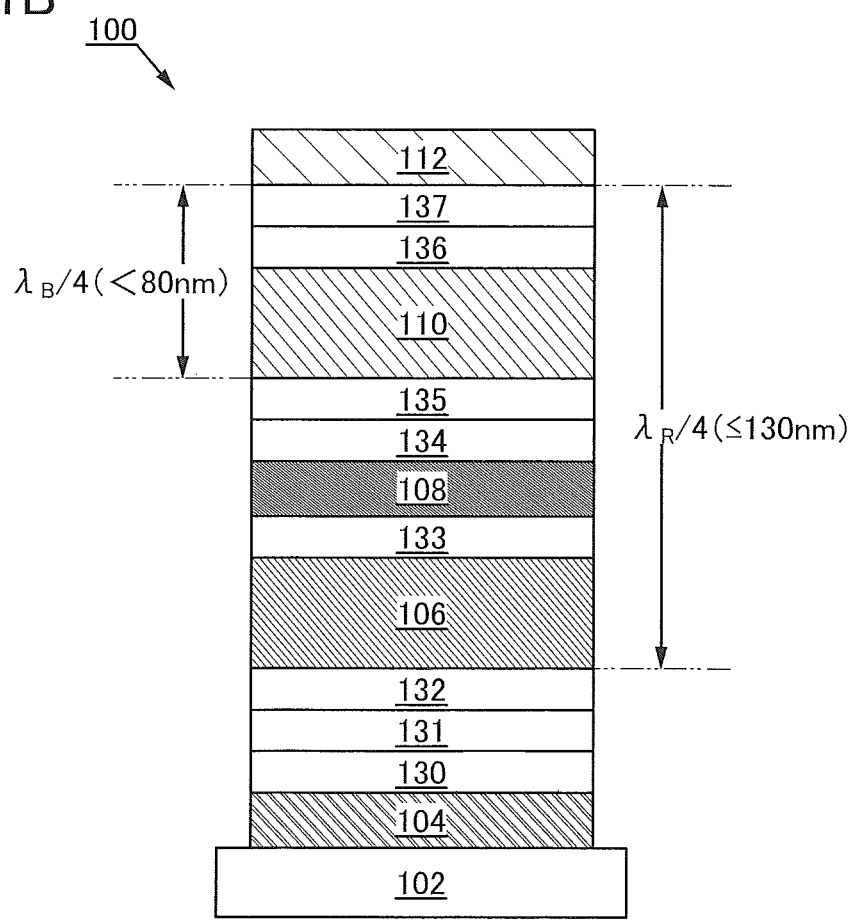

Alternatively, the light-emitting element 100 illustrated in FIG. 1A may have a structure illustrated in FIG. 1B.

The light-emitting element 100 illustrated in FIG. 1B includes the lower electrode 104 over the substrate 102, a transparent conductive layer 130 over the lower electrode 104, a hole-injection layer 131 over the transparent conductive layer 130, a hole-transport layer 132 over the hole-injection layer 131, the first light-emitting layer 106 over the hole-transport layer 132, an electron-transport layer 133 over the first light-emitting layer 106, the charge-generation layer 108 over the electron-transport layer 133, a hole-injection layer 134 over the charge-generation layer 108, a hole-transport layer 135 over the hole-injection layer 134, the second light-emitting layer 110 over the hole-transport layer 135, an electron-transport layer 136 over the second light-emitting layer 110, an electron-injection layer 137 over the electron-transport layer 136, and the upper electrode 112 over the electron-injection layer 137.

In the case where, in FIG. 1B, the wavelength range of light emitted from the first light-emitting layer 106, which is red, is greater than or equal to 600 nm and less than or equal to 780 nm and the wavelength range of light emitted from the second light-emitting layer 110, which is blue, is greater than or equal to 400 nm and less than 480 nm, the emission spectrum of the first light-emitting layer 106 peaks at a longer wavelength than that of the second light-emitting layer 110, which is similar to the case of the light-emitting element 100 illustrated in FIG. 1A. In addition, the distance between the bottom surface of the upper electrode 112 and the bottom surface of the first light-emitting layer 106 is less than or equal to 130 nm. The distance between the bottom surface of the upper electrode 112 and the bottom surface of the second light-emitting layer 110 is less than 80 nm. That is, the second light-emitting layer 110 is formed at a distance of less than 80 nm from the bottom surface of the upper electrode 112.

As described above, in the light-emitting element 100 of one embodiment of the present invention, the emission spectrum of the first light-emitting layer 106, which is distant from the upper electrode 112, peaks at a longer wavelength than that of the second light-emitting layer 110, which is close to the upper electrode 112. In addition, the distance between the bottom surface of the upper electrode 112 and the bottom surface of each light-emitting layer is set to approximately $\lambda_X/4$ ($\lambda_X$ represents a wavelength of light of a desired color) which corresponds to a minimum wavelength that is obtained from the intensified wavelengths of light from the light-emitting layers. Accordingly, the wavelength of light emitted from the light-emitting layers can be intensified. The light-emitting layer that emits light of the desired color can be distant from the top surface of the lower electrode 104 with the above optical path length between the bottom surface of the upper electrode 112 and the bottom surface of each light-emitting layer, so that absorption or scattering of light that might be generated in the vicinity of the top surface of the lower electrode 104 can be suppressed. Therefore, a light-emitting element with high emission efficiency can be provided.

In addition, the optical path length between the bottom surface of the upper electrode 112 and the bottom surface of each light-emitting layer is set to approximately $\lambda_X/4$ ($\lambda_X$ represents a wavelength of light of a desired color) which corresponds to a minimum wavelength that is obtained from the intensified wavelengths of light from the light-emitting layers, so that the distance between the top surface of the lower electrode 104 and the bottom surface of the upper electrode 112 can be set to $\lambda_X$ ($\lambda_X$ represents a wavelength of light of a desired color).

<Structural Example 2 of Light-Emitting Element>

Figure 2A:
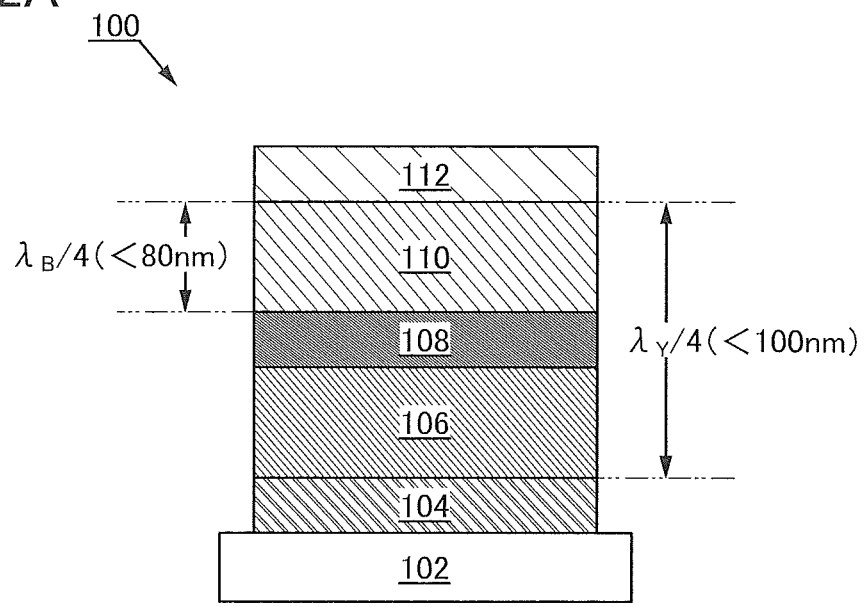
FIGS. 2A and 2B are cross-sectional views each illustrating a light-emitting element.
Figure 2B:
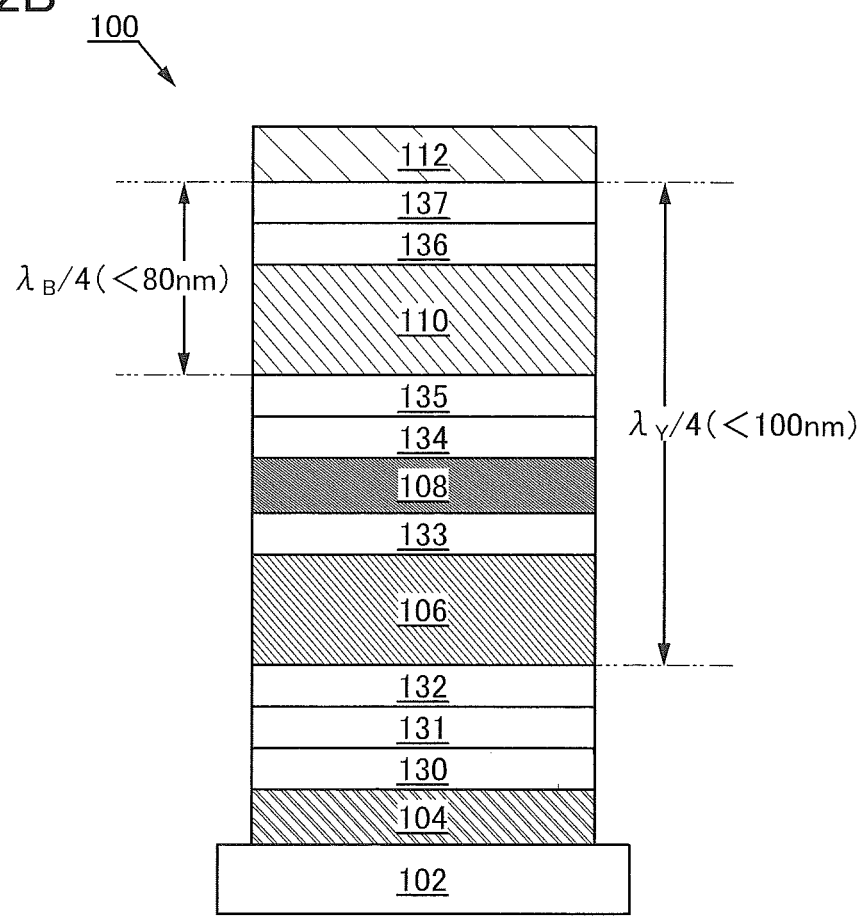

Next, light-emitting elements which are different in structure from the light-emitting elements 100 illustrated in FIGS. 1A and 1B are described with reference to FIGS. 2A and 2B. FIGS. 2A and 2B are cross-sectional views each illustrating an example of a light-emitting element of one embodiment of the present invention.

The light-emitting elements 100 illustrated in FIGS. 2A and 2B each have a structure in which light emitted from the first light-emitting layer 106 of the light-emitting element 100 illustrated in each of FIGS. 1A and 1B is in the yellow wavelength range.

In the case where the wavelength range of light emitted from the first light-emitting layer 106, which is yellow, is greater than or equal to 550 nm and less than 600 nm, the optical path length between the bottom surface of the upper electrode 112 and the bottom surface of the first light-emitting layer 106 is less than 150 nm. In the case where the wavelength range of light emitted from the second light-emitting layer 110, which is blue, is greater than or equal to 400 nm and less than 480 nm, the optical path length between the bottom surface of the upper electrode 112 and the bottom surface of the second light-emitting layer 110 is less than 120 nm. If the optical path length is replaced with the distance in consideration of the refractive index with the use of the above description, the distance between the bottom surface of the upper electrode 112 and the bottom surface of the second light-emitting layer 110 is less than 100 nm. That is, the first light-emitting layer 106 is formed at a distance of less than 100 nm from the bottom surface of the upper electrode 112. The distance between the bottom surface of the upper electrode 112 and the bottom surface of the second light-emitting layer 110 is less than 80 nm. That is, the second light-emitting layer 110 is formed at a distance of less than 80 nm from the bottom surface of the upper electrode 112.

Note that it is sufficient that the wavelength range of light emitted from the first light-emitting layer 106 have an emission spectrum of any one of green, yellow green, yellow, orange, and red; in contrast, when the wavelength range of light emitted from the first light-emitting layer 106 is yellow as illustrated in FIGS. 2A and 2B, the emission efficiency can be increased because of a high luminosity factor.

The other components of the light-emitting elements 100 illustrated in FIGS. 2A and 2B are the same as those of the light-emitting elements illustrated in FIGS. 1A and 1B, and the effects similar to those in the case of the above-described light-emitting elements are obtained.

<Structural Example 3 of Light-Emitting Element>

Figure 3A:
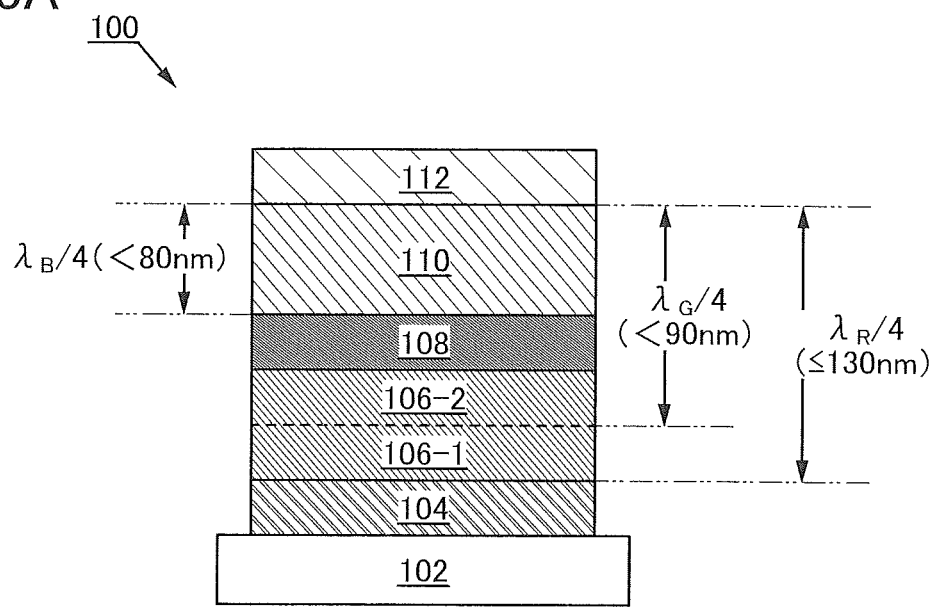
FIGS. 3A and 3B are cross-sectional views each illustrating a light-emitting element.
Figure 3B:
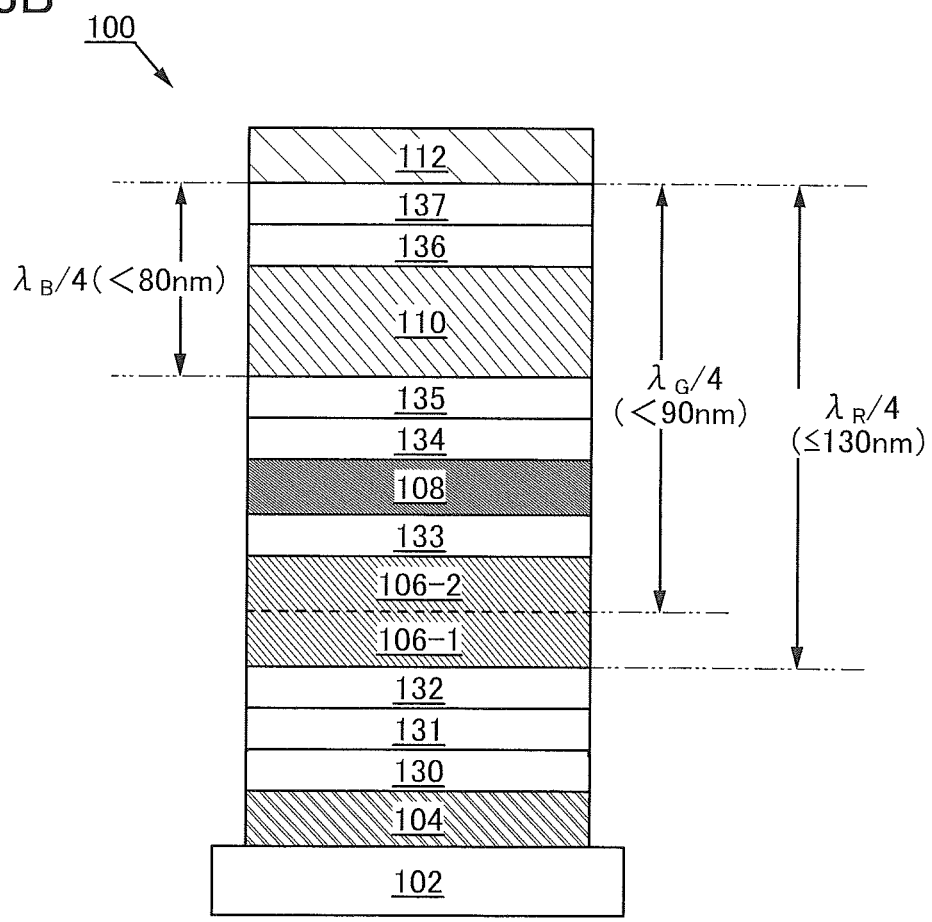

Next, light-emitting elements which are different in structure from the light-emitting elements 100 illustrated in FIGS. 1A and 1B are described with reference to FIGS. 3A and 3B. FIGS. 3A and 3B are cross-sectional views each illustrating an example of a light-emitting element of one embodiment of the present invention.

The light-emitting elements 100 illustrated in FIGS. 3A and 3B each have a structure in which the first light-emitting layer 106 of the light-emitting element 100 illustrated in each of FIGS. 1A and 1B has a stacked-layer structure of a first light-emitting layer 106-1 and a first light-emitting layer 106-2. For example, the wavelength range of light emitted from the first light-emitting layer 106-1, which is red, is greater than or equal to 600 nm and less than or equal to 780 nm, and the wavelength range of light emitted from the first light-emitting layer 106-2, which is green, is greater than or equal to 480 nm and less than 540 nm.

In each case of the above-described structures, the optical path length between the bottom surface of the upper electrode 112 and the bottom surface of the first light-emitting layer 106-1 is less than or equal to 195 nm, and the optical path length between the bottom surface of the upper electrode 112 and the bottom surface of the first light-emitting layer 106-2 is less than 135 nm. If the optical path length is replaced with the distance in consideration of the refractive index with the use of the above description, the distance between the bottom surface of the upper electrode 112 and the bottom surface of the first light-emitting layer 106-1 is less than or equal to 130 nm. That is, the first light-emitting layer 106-1 is formed at a distance of less than or equal to 130 nm from the bottom surface of the upper electrode 112. The distance between the bottom surface of the upper electrode 112 and the bottom surface of the first light-emitting layer 106-2 is less than 90 nm. That is, the first light-emitting layer 106-2 is formed at a distance of less than 90 nm from the bottom surface of the upper electrode 112.

As illustrated in each of FIGS. 3A and 3B, the stacked-layer structure of the first light-emitting layer 106 is preferable, with which light in a plurality of wavelength ranges can be extracted. However, when the number of stacked layers is increased in the first light-emitting layer, the productivity might decrease; thus, in the case where productivity is valued, it is preferable that the first light-emitting layer 106 have a single-layer structure as in the light-emitting elements 100 illustrated in FIGS. 1A and 1B or FIGS. 2A and 2B.

The other components of the light-emitting elements 100 illustrated in FIGS. 3A and 3B are the same as those of the light-emitting elements illustrated in FIGS. 1A and 1B, and the effects similar to those in the case of the above-described light-emitting elements are obtained.

Here, each component of the above-described light-emitting element 100 is described below in detail.

<Substrate>

The substrate 102 is used as a support of the light-emitting elements. For the substrate 102, glass, quartz, plastic, or the like can be used, for example. Alternatively, a flexible substrate can be used. The flexible substrate is a substrate that can be bent, for example, a plastic substrate made of polycarbonate, polyarylate, or polyethersulfone, and the like. A film (made of polypropylene, polyester, poly(vinyl fluoride), poly(vinyl chloride), or the like), an inorganic film formed by evaporation, or the like can be used. Another material may be used as long as the substrate functions as a support in a manufacturing process of the light-emitting elements.

The light-emitting elements and the optical elements can be formed using a variety of substrates, for example. The type of substrate is not limited to a particular type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. Examples of the glass substrate include a barium borosilicate glass substrate, an alumino-borosilicate glass substrate, a soda lime glass substrate, and the like. Examples of the flexible substrate, the attachment film, the base film, and the like are substrates of plastics typified by polyethylene terephthalate (PET), polyethylene naphthalate (PEN), polyether sulfone (PES), and polytetrafluoroethylene (PTFE). Another example is a resin such as acrylic. Other examples are polypropylene, polyester, polyvinyl fluoride, polyvinyl chloride, and the like. Other examples are polyamide, polyimide, aramid, epoxy, an inorganic film formed by evaporation, paper, and the like.

Alternatively, a flexible substrate may be used as the substrate, and the light-emitting elements and the optical elements may be provided directly on the flexible substrate. Alternatively, a separation layer may be provided between the substrate and the light-emitting element. Alternatively, a separation layer may be provided between the substrate and the optical element. The separation layer can be used when part or the whole of the light-emitting elements and the optical elements formed over the separation layer is completed, separated from the substrate, and transferred to another substrate. In such a case, the light-emitting elements and the optical elements can be transferred to a substrate having low heat resistance or a flexible substrate as well. For the above-described separation layer, a stack including inorganic films, which are a tungsten film and a silicon oxide film, or an organic resin film of polyimide or the like formed over a substrate can be used, for example.

In other words, after the light-emitting elements and the optical elements is formed using a substrate, the light-emitting elements and the optical elements may be transferred to another substrate. Examples of a substrate to which the light-emitting elements and the optical elements are transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, a light-emitting element and optical element with high durability, a light-emitting element and optical element with high heat resistance, a lightweight light-emitting element and optical element, or a thin light-emitting element and optical element can be obtained.

<Lower Electrode>

The lower electrode 104 functions as an anode of each light-emitting element. The lower electrode is preferably formed using a reflective conductive material. As the conductive material, a conductive material having a visible-light reflectance higher than or equal to 40% and lower than or equal to 100%, preferably higher than or equal to 70% and lower than or equal to 100%, and a resistivity lower than or equal to $1 \times 10^{-2}$ Ωcm can be used. Specifically, as the lower electrode, silver, aluminum, an alloy containing silver or aluminum, or the like can be used. As the alloy containing aluminum, an alloy containing aluminum, nickel, and lanthanum can be used, for example. Examples of the alloy containing silver include an alloy containing silver, palladium, and copper, an alloy containing silver and copper, an alloy containing silver and magnesium, an alloy containing silver and nickel, and an alloy containing silver and gold. The lower electrode can be formed by a sputtering method, an evaporation method, a printing method, a coating method, or the like.

<Transparent Conductive Layer>

The transparent conductive layer 130 functions as part of the lower electrode of each light-emitting element, or the anode of each light-emitting element. Furthermore, the transparent conductive layer is used to adjust the optical path length between the lower electrode and the upper electrode in accordance with the desired light wavelength so as to produce resonance of the desired light emitted from the light-emitting layer and intensify its wavelength. For example, the thickness of the transparent conductive layer is adjusted so that the optical path length between the electrodes can be $m\lambda/2$ (m is a natural number), where $\lambda$ is the wavelength of a desired light.

As the transparent conductive layer, for example, indium oxide-tin oxide (indium tin oxide (hereinafter referred to as ITO)), indium oxide-tin oxide containing silicon or silicon oxide, indium oxide-zinc oxide (indium zinc oxide), indium oxide containing tungsten oxide and zinc oxide, or the like can be used. In particular, a material with a high work function (4.0 eV or more) is preferably used as the transparent conductive layer. The transparent conductive layer can be formed by a sputtering method, an evaporation method, a printing method, a coating method, or the like.

<Upper Electrode>

The upper electrode 112 functions as a cathode in each of the light-emitting elements. The upper electrode 112 is preferably formed using a reflective and light-transmitting conductive material. As the conductive material, a conductive material having a visible-light reflectance higher than or equal to 20% and lower than or equal to 80%, preferably higher than or equal to 40% and lower than or equal to 70%, and a resistivity lower than or equal to $1\times10^{-2}$ $\Omega$cm can be used. The upper electrode 114 can be formed using one or more kinds of conductive metals, alloys, conductive compounds, and the like. In particular, it is preferable to use a material with a low work function (lower than or equal to 3.8 eV). The examples include an element belonging to Group 1 or 2 of the periodic table (e.g., an alkali metal such as lithium or cesium, an alkaline earth metal such as calcium or strontium, or magnesium), an alloy containing any of these elements (e.g., Mg—Ag or Al—Li), a rare earth metal such as europium or ytterbium, an alloy containing any of these rare earth metals, aluminum, silver, and the like. The upper electrode 114 can be formed by a sputtering method, an evaporation method, a printing method, a coating method, or the like.

<Light-Emitting Layer>

The first light-emitting layer 106 contains a light-emitting material that emits light of at least one of green, yellow green, yellow, orange, and red, and the second light-emitting layer 110 contains a light-emitting material that emits light of at least one of violet, blue, and blue green. The light-emitting material used for the first light-emitting layer 106 is preferably a phosphorescent material, and the light-emitting material used for the second light-emitting layer 110 is preferably a fluorescent material. When a phosphorescent material is used for the first light-emitting layer 106 and a fluorescent material is used for the second light-emitting layer 110, a light-emitting device with high emission efficiency and high reliability can be obtained. The first light-emitting layer 106 and the second light-emitting layer 110 include either or both of an electron-transport material and a hole-transport material in addition to the above-described materials.

As the phosphorescent material, a light-emitting substance that converts triplet excitation energy into light emission can be used. As the fluorescent material, a light-emitting substance that converts singlet excitation energy into light emission can be used. Examples of the light-emitting substances are described below.

Examples of the light-emitting substance that converts singlet excitation energy into light emission include substances that emit fluorescence. For example, the following substances can be used: substances that emit blue light (emission wavelength: 400 nm to 480 nm) such as N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'-bis[4-(9-phenyl-9H-fluoren-9-yl)phenyl]-N,N'-diphenylpyrene-1,6-diamine (abbreviation: 1,6FLPAPrn), and N,N'-bis(3-methylphenyl)-N,N'-bis[3-(9-phenyl-9H-fluoren-9-yl)phenyl]pyrene-1,6-diamine (abbreviation: 1,6mMemFLPAPrn); and substances that emit yellow light (emission wavelength: 540 nm to 580 nm) such as rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), and 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2).

Examples of the light-emitting substance that converts triplet excitation energy into light emission include substances that emit phosphorescence. For example, a substance having an emission peak at 440 nm to 520 nm, a substance having an emission peak at 520 nm to 600 nm, or a substance having an emission peak at 600 nm to 700 nm can be used.

Examples of the substance that has an emission peak at 440 nm to 520 nm include organometallic iridium complexes having 4H-triazole skeletons, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), and tris[4-(3-biphenyl)-5-isopropyl-3-phenyl-4H-1,2,4-triazolato]iridium (III) (abbreviation: Ir(iPrptz-3b)$_3$); organometallic iridium complexes having 1H-triazole skeletons, such as tris[3-methyl-1-(2-methylphenyl)-5-phenyl-1H-1,2,4-triazolato]iridium(III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having imidazole skeletons, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Among the substances given above, the organometallic iridium complex having a 4H-triazole skeleton has a high reliability and high emission efficiency and is thus especially preferable.

Examples of the substance that has an emission peak at 520 nm to 600 nm include organometallic iridium complexes having pyrimidine skeletons, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), and (acetylacetonato)bis(4,6-diphenylpyrimidinato) iridium(III) (abbreviation: Ir(dppm)$_2$(acac)); organometallic iridium complexes having pyrazine skeletons, such as (acetylacetonato)bis(3,5-dimethyl-2-phenylpyrazinato) iridium(III) (abbreviation: Ir(mppr-Me)$_2$(acac)) and (acetylacetonato)bis(5-isopropyl-3-methyl-2-phenylpyrazinato) iridium(III) (abbreviation: Ir(mppr-iPr)$_2$(acac)); organometallic iridium complexes having pyridine skeletons, such as tris(2-phenylpyridinato-N,C$^{2'}$)iridium(III) (abbreviation: Ir(ppy)$_3$), bis(2-phenylpyridinato-N,C$^{2'}$) iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); and a rare earth metal complex such as tris(acetylacetonato) (monophenanthroline)terbium (III) (abbreviation: Tb(acac)$_3$(Phen)). Among the substances given above, the organometallic iridium complex having a pyrimidine skeleton has distinctively high reliability and emission efficiency and is thus especially preferable.

Among the substances having an emission peak at 520 nm to 600 nm, it is particularly preferable to use a substance having an emission peak at 550 nm to 580 nm for the first light-emitting layer 106. With the use of the substance having an emission peak at 550 nm to 580 nm for the first light-emitting layer 106, the current efficiency of the light-emitting element can be increased.

Examples of the substances that has an emission peak at 550 nm to 580 nm include (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[6-(2-norbornyl)-4-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), (acetylacetonato)bis (4,6-diphenylpyrimidinato)iridium(III) (abbreviation: Ir(dppm)$_2$(acac)), (acetylacetonato)bis(3,5-dimethyl-2-phenylpyrazinato)iridium(III) (abbreviation: Ir(mppr-Me)$_2$(acac)), (acetylacetonato)bis(5-isopropyl-3-methyl-2-phenylpyrazinato)iridium(III) (abbreviation: Ir(mppr-iPr)$_2$(acac)), tris(2-phenylquinolinato-N,C$^{2'}$)iridium(III) (abbreviation: Ir(pq)$_3$), bis(2-phenylquinolinato-N,C$^{2'}$) iridium(III)acetylacetonate (abbreviation: Ir(pq)$_2$(acac)), bis(benzo[h]quinolinato)iridium(III)acetylacetonate (abbreviation: Ir(bzq)$_2$(acac)), bis(2,4-diphenyl-1,3-oxazolato-N,C$^{2'}$) iridium(III)acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$ (acac)), bis(2-phenylbenzothiazolato-N,C$^{2'}$)iridium(III) acetylacetonate (abbreviation: Ir(bt)$_2$(acac)), and the like can be used.

Examples of the substance that has an emission peak at 600 nm to 700 nm include organometallic iridium complexes having pyrimidine skeletons, such as (diisobutyrylmethanato)bis[4,6-bis(3-methylphenyl)pyrimidinato]iridium (III) (abbreviation: Ir(5mdppm)$_2$(dibm)), bis[4,6-bis(3-methylphenyl)pyrimidinato](dipivaloylmethanato)iridium (III) (abbreviation: Ir(5mdppm)$_2$(dpm)), and bis[4,6-di (naphthalen-1-yl)pyrimidinato](dipivaloylmethanato) iridium(III) (abbreviation: Ir(d1npm)$_2$(dpm)); organometallic iridium complexes having pyrazine skeletons, such as (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having pyridine skeletons, such as tris(1-phenylisoquinolinato-N,C$^{2'}$)iridium(III) (abbreviation: Ir(piq)$_3$) and bis(1-phenylisoquinolinato-N,C$^{2'}$)iridium(III)acetylacetonate (abbreviation: Ir(piq)$_2$(acac)); a platinum complex such as 2,3,7,8,12,13,17,18-octaethyl-21H,23H-porphyrin platinum (II) (abbreviation: PtOEP); and rare earth metal complexes such as tris(1,3-diphenyl-1,3-propanedionato)(monophenantbroline)europium(III) (abbreviation: Eu(DBM)$_3$ (Phen)) and tris[1-(2-thenoyl)-3,3,3-trifluoroacetonato] (monophenanthroline)europium(III) (abbreviation: Eu(TTA)$_3$(Phen)). Among the substances given above, the organometallic iridium complex having a pyrimidine skeleton has distinctively high reliability and emission efficiency and is thus especially preferable. Furthermore, the organometallic iridium complex having a pyrazine skeleton can provide red light emission with favorable chromaticity.

As the electron-transport material used for the first light-emitting layer 106 and the second light-emitting layer 110, a π-electron deficient heteroaromatic compound such as a nitrogen-containing heteroaromatic compound is preferable. As the electron-transport material, a π-electron deficient heteroaromatic compound, a metal complex, or the like can be used. Specific examples include a metal complex such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl) phenolato]zinc(II) (abbreviation: ZnPBO), and bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl) phenyl]-9H-carbazole (abbreviation: CO11), 2,2',2''-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBT-BIm-II); a heterocyclic compound having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl) biphenyl-3-yl]dibenzo[f,h]quinoxaline (abbreviation:

2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); a heterocyclic compound having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); and a heterocyclic compound having a pyridine skeleton such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above-described materials, heterocyclic compounds having diazine skeletons and triazine skeletons and heterocyclic compounds having pyridine skeletons have high reliability and are thus preferable. Heterocyclic compounds having diazine (pyrimidine or pyrazine) skeletons and triazine skeletons have a high electron-transport property and contribute to a decrease in drive voltage.

As the hole-transport material used for the first light-emitting layer 106 and the second light-emitting layer 110, a n-electron deficient heteroaromatic compound or an aromatic amine compound is preferable. A π-electron deficient heteroaromatic compound, an aromatic amine compound, or the like can be preferably used. Specific examples include a compound having an aromatic amine skeleton such as 2-[N-(9-phenylcarbazol-3-yl)-N-phenylamino]spiro-9,9'-bifluorene (abbreviation: PCASF), 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), and N-(1,1'-biphenyl-4-yl)-N-[4-(9-phenyl-9H-carbazol-3-yl)phenyl]-9,9-dimethyl-9H-fluoren-2-amine (abbreviation: PCBBiF); a compound having a carbazole skeleton such as 1,3-bis(N-carbazolyl)benzene (abbreviation: mCP), 4,4'-di(N-carbazolyl)biphenyl (abbreviation: CBP), and 3,6-bis(3,5-diphenylphenyl)-9-phenylcarbazole (abbreviation: CzTP), or 9-phenyl-9H-3-(9-phenyl-9H-carbazol-3-yl)carbazole (abbreviation: PCCP); a compound having a thiophene skeleton such as 1,3,5-tri(dibenzothiophen-4-yl)benzene (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and a compound having a furan skeleton such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above-described materials, compounds having aromatic amine skeletons and compounds having carbazole skeletons are preferable because these compounds are highly reliable and have high hole-transport properties to contribute to a reduction in drive voltage.

Furthermore, as the hole-transport material used for the first light-emitting layer 106 and the second light-emitting layer 110, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), or poly[N,N'-bis(4-butylphenyl)-N,N'-bis(phenyl)benzidine] (abbreviation: Poly-TPD) can also be used.

<Charge-Generation Layer>

The charge-generation layer 108 can have either a structure in which an acceptor substance is added to a hole-transport material or a structure in which a donor substance is added to an electron-transport material. Alternatively, both of these structures may be stacked. Note that in terms of light extraction efficiency, the charge-generation layer 108 preferably transmits visible light (specifically, the charge-generation layer 108 has a high visible light transmittance (e.g., a visible-light transmittance higher than or equal to 40%). The charge-generation layer 108 functions even if it has lower conductivity than the pair of electrodes (the lower electrode and the upper electrode).

<Hole-Injection Layer and Hole-Transport Layer>

The hole-injection layer 131 is a layer that injects holes into the first light-emitting layer 106 through the hole-transport layer 132 with a high hole-transport property and includes a hole-transport material and an acceptor substance. When a hole-transport material and an acceptor substance are included, electrons are extracted from the hole-transport material by the acceptor substance to generate holes, and the holes are injected into the first light-emitting layer 106 through the hole-transport layer 132. The hole-injection layer 134 is a layer that injects holes into the second light-emitting layer 110 through the hole-transport layer 135 with a high hole-transport property and includes a hole-transport material and an acceptor substance. When a hole-transport material and an acceptor substance are included, electrons are extracted from the hole-transport material by the acceptor substance to generate holes, and the holes are injected into the second light-emitting layer 110 through the hole-transport layer 135.

Note that the hole-injection layer 131, the hole-transport layer 132, the hole-injection layer 134, and the hole-transport layer 135 are formed using a hole-transport material. As a hole-transport material used for the hole-injection layer 131, the hole-transport layer 132, the hole-injection layer 134, and the hole-transport layer 135, a material similar to the aforementioned hole-transport material used for the first light-emitting layer 106 and the second light-emitting layer 110 can be used.

Examples of the acceptor substance used for the hole-injection layers 131 and 134 include an oxide of a metal belonging to any of Group 4 to Group 8 of the periodic table. Specifically, molybdenum oxide is particularly preferable.

<Electron-Transport Layer>

As an electron-transport material used for the electron-transport layers 133 and 136, a material similar to the aforementioned electron-transport material used for the first light-emitting layer 106 and the second light-emitting layer 110 can be used.

<Electron-Injection Layer>

The electron-injection layer 137 is a layer including a substance with a high electron-injection property. For the electron-injection layer 137, an alkali metal, an alkaline earth metal, or a compound thereof, such as lithium fluoride (LiF), cesium fluoride (CsF), calcium fluoride (CaF$_2$), or lithium oxide (LiO$_x$), can be used. Alternatively, a rare earth metal compound like erbium fluoride (ErF$_3$) can be used. Electride may also be used for the electron-injection layer 137. Examples of the electride include a substance in which electrons are added at high concentration to calcium oxide-aluminum oxide, and the like.

Alternatively, the electron-injection layer 137 may be formed using a composite material in which an organic compound and an electron donor (donor) are mixed. The composite material is superior in an electron-injection property and an electron-transport property, because electrons are generated in the organic compound by the electron donor. The organic compound here is preferably a material excellent in transporting the generated electrons; specifically, for example, the substances for forming the electron-transport layer 133 (e.g., a metal complex or a heteroaromatic compound) can be used. As the electron donor, a substance showing an electron-donating property with respect to the organic compound is used. Specifically, an alkali metal, an alkaline earth metal, and a rare earth metal are preferable, and lithium, cesium, magnesium, calcium, erbium, ytterbium, and the like are given. Furthermore, an alkali metal oxide or an alkaline earth metal oxide is preferable, and for example, lithium oxide, calcium oxide, barium oxide, and the like can be given. Alternatively, Lewis base such as magnesium oxide can also be used. An organic compound such as tetrathiafulvalene (abbreviation: TTF) can also be used.

The above-described light-emitting layers, charge-generation layer, hole-transport layer, hole-injection layer, electron-transport layer, and electron-injection layer can each be formed by any of the following methods: an evaporation method (including a vacuum evaporation method), an ink-jet method, a coating method, and the like.

The structure described in this embodiment can be combined with any of the structures described in the other embodiments and examples as appropriate.

Embodiment 2

In this embodiment, a light-emitting device including a light-emitting element of one embodiment of the present invention and a method for manufacturing the light-emitting device will be described with reference to FIGS. 4 to 13, FIGS. 14A and 14B, FIGS. 15A and 15B, and FIGS. 16A and 16B.

<Structural Example 1 of Light-Emitting Device>

Figure 4:
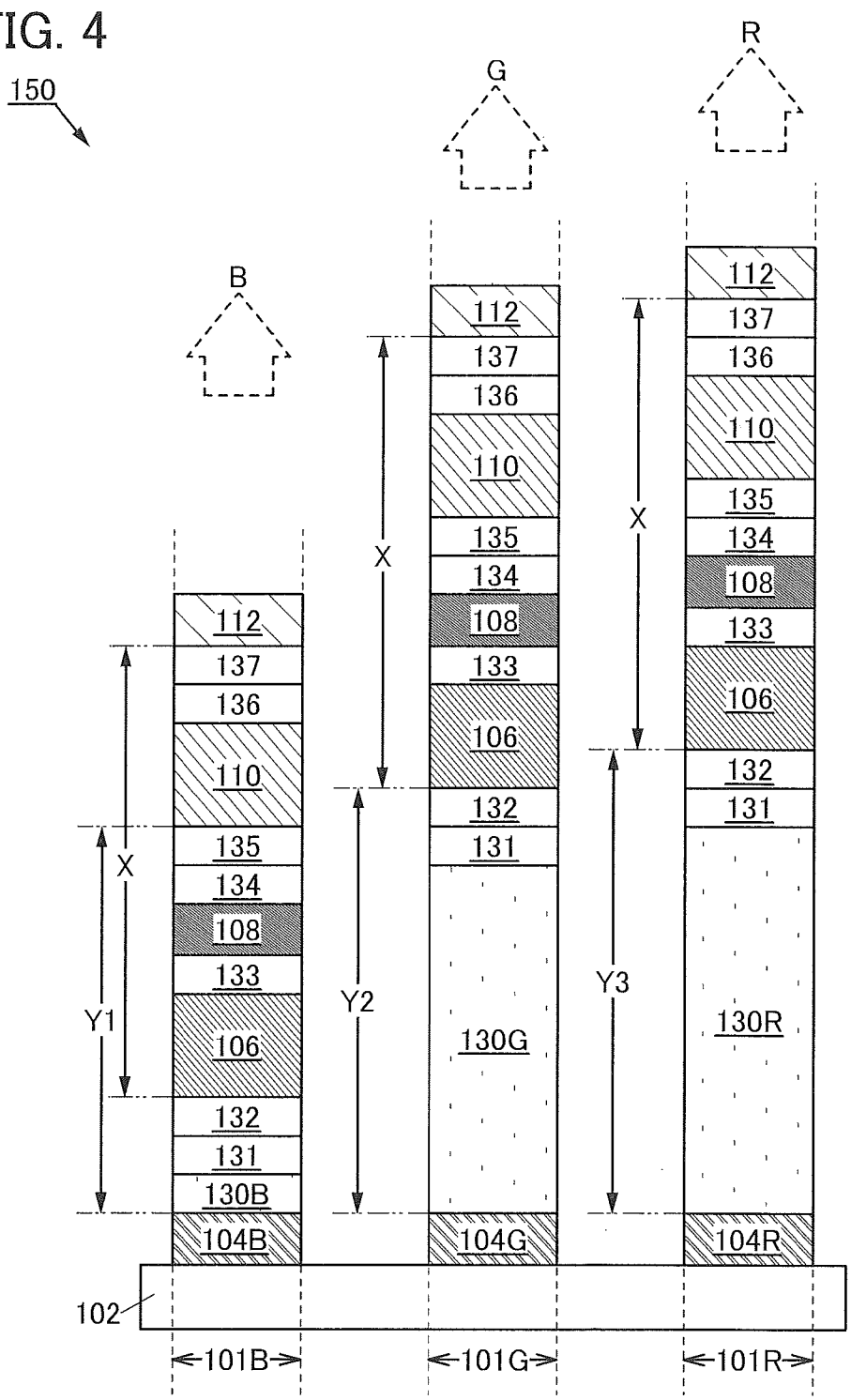
FIG. 4 is a cross-sectional view illustrating a light-emitting device.

First, a light-emitting device including the light-emitting element of one embodiment of the present invention is described with reference to FIG. 4. FIG. 4 is a cross-sectional view illustrating an example of a light-emitting device of one embodiment of the present invention.

A light-emitting device 150 illustrated in FIG. 4 includes a first light-emitting element 101B having a function of emitting blue light, a second light-emitting element 101G having a function of emitting green light, and a third light-emitting element 101R having a function of emitting red light. The first light-emitting element 101B includes a first lower electrode 104B, a first transparent conductive layer 130B over the first lower electrode 104B, the first light-emitting layer 106 over the first transparent conductive layer 130B, the charge-generation layer 108 over the first light-emitting layer 106, the second light-emitting layer 110 over the charge-generation layer 108, and the upper electrode 112 over the second light-emitting layer 110. The second light-emitting element 101G includes a second lower electrode 104G, a second transparent conductive layer 130G over the second lower electrode 104G, the first light-emitting layer 106 over the second transparent conductive layer 130G, the charge-generation layer 108 over the first light-emitting layer 106, the second light-emitting layer 110 over the charge-generation layer 108, and the upper electrode 112 over the second light-emitting layer 110. The third light-emitting element 101R includes a third lower electrode 104R, a third transparent conductive layer 130R over the third lower electrode 104R, the first light-emitting layer 106 over the third transparent conductive layer 130R, the charge-generation layer 108 over the first light-emitting layer 106, the second light-emitting layer 110 over the charge-generation layer 108, and the upper electrode 112 over the second light-emitting layer 110. The emission spectrum of the first light-emitting layer 106 peaks at a longer wavelength than that of the second light-emitting layer 110. In addition, the distance between the bottom surface of the upper electrode 112 and the bottom surface of the first light-emitting layer 106 is less than or equal to 130 nm.

Note that in FIG. 4, the distance between the bottom surface of the upper electrode 112 and the bottom surface of the first light-emitting layer 106 is represented by X (X≤130 nm).

The light-emitting device 150 illustrated in FIG. 4 includes the hole-injection layer 131 and the hole-transport layer 132 between each of the transparent conductive layers (the first transparent conductive layer 130B, the second transparent conductive layer 130G, and the third transparent conductive layer 130R) and the first light-emitting layer 106, the electron-transport layer 133 between the first light-emitting layer 106 and the charge-generation layer 108, the hole-injection layer 134 and the hole-transport layer 135 between the charge-generation layer 108 and the second light-emitting layer 110, and the electron-transport layer 136 and the electron-injection layer 137 between the second light-emitting layer 110 and the upper electrode 112.

In addition, in the light-emitting device 150 illustrated in FIG. 4, the optical path length between the first lower electrode 104B and the second light-emitting layer 110 can be adjusted by the thickness of the first transparent conductive layer 130B. The optical path length between the second lower electrode 104G and the first light-emitting layer 106 can be adjusted by the thickness of the second transparent conductive layer 130G. The optical path length between the third lower electrode 104R and the first light-emitting layer 106 can be adjusted by the thickness of the third transparent conductive layer 130R.

In FIG. 4, the optical path length between the first lower electrode 104B and the second light-emitting layer 110 is represented by Y1, which is equal to $3\lambda_B/4$ ($\lambda_B$ represents a wavelength of blue light). The optical path length between the second lower electrode 104G and the first light-emitting layer 106 is represented by Y2, which is equal to $3\lambda_G/4$ ($\lambda_G$ represents a wavelength of green light). The optical path length between the third lower electrode 104R and the first light-emitting layer 106 is represented by Y3, which is equal to $3\lambda_R/4$ ($\lambda_R$ represents a wavelength of red light).

Note that in the light-emitting device 150 illustrated in FIG. 4, the structure is described as an example in which the optical path length between each of the lower electrodes (the first lower electrode 104B, the second lower electrode 104G, and the third lower electrode 104R) and the light-emitting layer (the first light-emitting layer 106 or the second light-emitting layer 110) is differentiated by the thickness of the transparent conductive layers (the first transparent conductive layer 130B, the second transparent conductive layer 130G, and the third transparent conductive layer 130R). However, without limitation thereto, the optical path length between the lower electrode and the light-emitting layer may be differentiated by the thickness of one or both of the hole-injection layer 131 and the hole-transport layer 132. However, as shown in the light-emitting device 150 illustrated in FIG. 4, it is preferable to differentiate the optical path length between the lower electrode and the light-emitting layer by changing the thickness of the transparent conductive layer because the hole-injection layer 131 and the hole-transport layer 132 can be shared by the light-emitting elements.

Note that in FIG. 4, a light-emitting region of the first light-emitting layer 106 is located in the vicinity of the interface between the hole-transport layer 132 and the first light-emitting layer 106, and a light-emitting region of the second light-emitting layer 110 is located in the vicinity of the interface between the hole-transport layer 135 and the second light-emitting layer 110. However, to be exact, the light-emitting regions of the first light-emitting layer 106 and the second light-emitting layer 110 might slightly deviate from the above-described interface vicinities; therefore, the above-described optical path length is preferably between the lower electrode and the light-emitting region formed in the light-emitting layer (the first light-emitting layer 106 or the second light-emitting layer 110).

When the Y1, Y2, and Y3 are assumed to be the above-described optical path lengths, the optical path lengths between three pair of electrodes (the upper electrode 112 and each of the first lower electrode 104B, the second lower electrode 104G, and the third lower electrode 104R) can be set to $\lambda_B$ ($\lambda_B$ represents a wavelength of blue light) in the first light-emitting element 101B, $\lambda_G$ ($\lambda_G$ represents a wavelength of green light) in the second light-emitting element 101G, and $\lambda_R$ ($\lambda_R$ represents a wavelength of red light) in the third light-emitting element 101R.

When the Y1 is assumed to be the above-described optical path length, it is possible to suppress a decrease in light extraction efficiency due to scattering or absorption of light emitted from the second light-emitting layer 110, which occurs in the vicinity of the surface of the first lower electrode 104B. When the Y2 is assumed to be the above-described optical path length, it is possible to suppress a decrease in light extraction efficiency due to scattering or absorption of light emitted from the first light-emitting layer 106, which occurs in the vicinity of the surface of the second lower electrode 104G. When the Y3 is assumed to be the above-described optical path length, it is possible to suppress a decrease in light extraction efficiency due to scattering or absorption of light emitted from the first light-emitting layer 106, which occurs in the vicinity of the surface of the third lower electrode 104R.

In FIG. 4, blue light (B), green light (G), and red light (R) emitted from their respective light-emitting elements are schematically denoted by arrows of dashed lines. The light-emitting device 150 illustrated in FIG. 4 has a top-emission structure in which light emitted from light-emitting elements is extracted to the side opposite to the substrate 102 side where the light-emitting elements are formed. However, one embodiment of the present invention is not limited thereto and may have a bottom-emission structure in which light emitted from light-emitting elements is extracted to the substrate side where the light-emitting elements are formed, or a dual-emission structure in which light emitted from light-emitting elements is extracted in both top and bottom directions of the substrate 102 where the light-emitting elements are formed.

Note that in an example shown in FIG. 4, the hole-injection layer 131, the hole-transport layer 132, the first light-emitting layer 106, the electron-transport layer 133, the charge-generation layer 108, the hole-injection layer 134, the hole-transport layer 135, the second light-emitting layer 110, the electron-transport layer 136, and the electron-injection layer 137 are each divided to form the first light-emitting element 101B, the second light-emitting element 101G, and the third light-emitting element 101G; however, they can also be used without being divided.

The first lower electrode 104B, the second lower electrode 104G, and the third lower electrode 104R are each formed using a conductive material having a property of reflecting visible light. For example, a material containing silver may be used as the conductive material. When the first lower electrode 104B, the second lower electrode 104G, and the third lower electrode 104R are each formed using a material containing silver, the reflectance can be increased and the emission efficiency of each light-emitting element can be increased. For example, a conductive film containing silver is formed and separated into an island-shape; in this way, the first lower electrode 104B, the second lower electrode 104G, and the third lower electrode 104R can be formed. The first lower electrode 104B, the second lower electrode 104G, and the third lower electrode 104R are preferably formed through a step of processing the same conductive film because the manufacturing cost can be reduced.

As described above, in the light-emitting device 150 illustrated in FIG. 4, in the first light-emitting element 101B, blue light emitted from the second light-emitting layer 110 is adjusted to be intensified; in the second light-emitting element 101G, green light emitted from the second light-emitting layer 110 is adjusted to be intensified; and in the third light-emitting element 101R, red light emitted from the second light-emitting layer 110 is adjusted to be intensified. Full-color emission of RGB can be obtained with light emitted from the first light-emitting element 101B, light emitted from the second light-emitting element 101G, and light emitted from the third light-emitting element 101R.

As described above, in the light-emitting device 150 illustrated in FIG. 4, the optical path length between the lower electrode and the upper electrode 112 of each light-emitting element is adjusted, whereby scattering or absorption of light in the vicinity of the lower electrode can be suppressed and thus high light extraction efficiency can be achieved. Therefore, a novel light-emitting device with high emission efficiency and low power consumption can be provided.

<Structural Example 2 of Light-Emitting Device>

Figure 5:
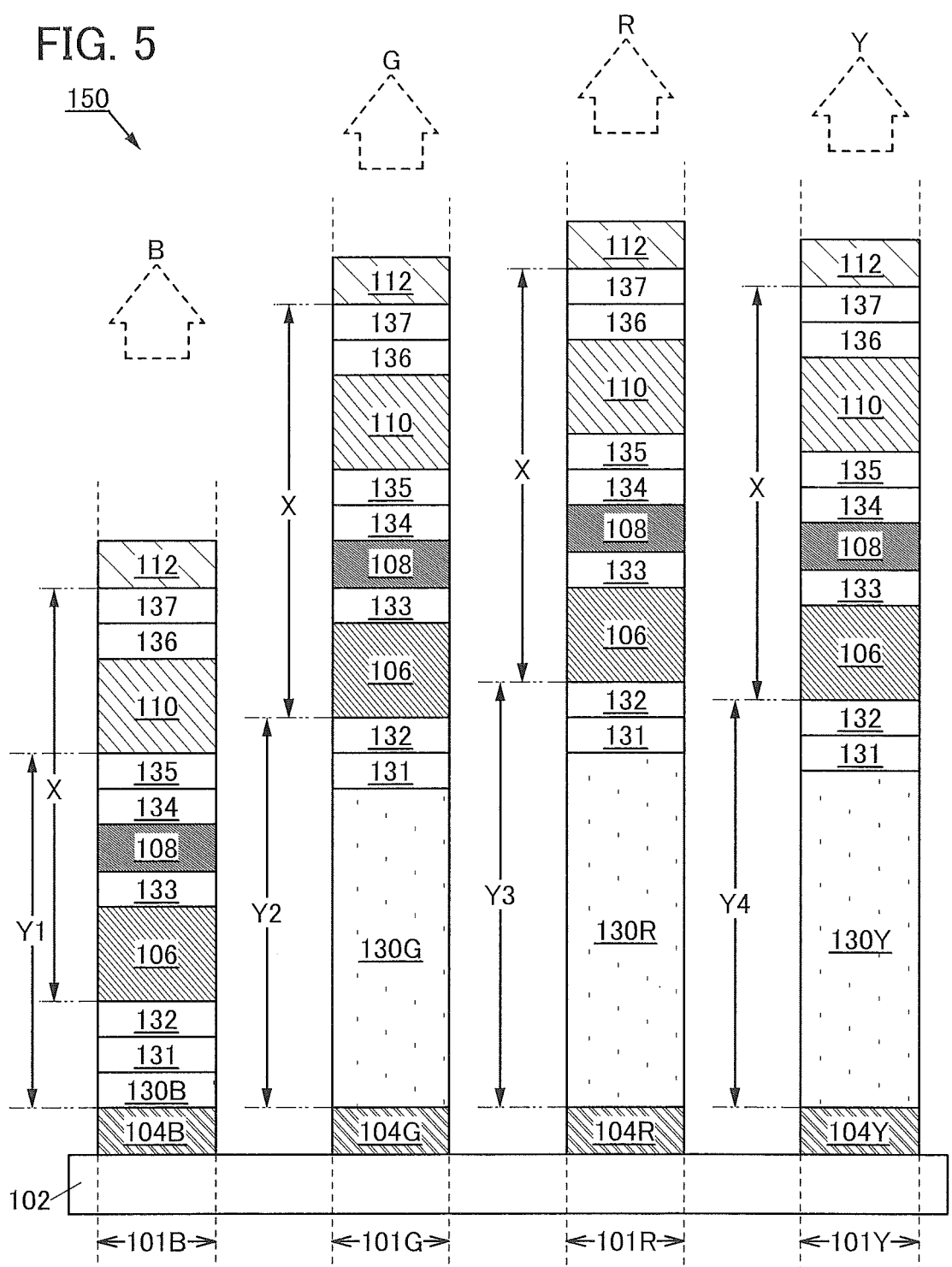
FIG. 5 is a cross-sectional view illustrating a light-emitting device.

Next, a light-emitting device including the light-emitting element of one embodiment of the present invention is described with reference to FIG. 5. FIG. 5 is a cross-sectional view illustrating an example of a light-emitting device of one embodiment of the present invention.

The light-emitting device 150 illustrated in FIG. 5 includes the first light-emitting element 101B having a function of emitting blue light, the second light-emitting element 101G having a function of emitting green light, the third light-emitting element 101R having a function of emitting red light, and a fourth light-emitting element 101Y having a function of emitting yellow light.

The first light-emitting element 101B, the second light-emitting element 101G, and the third light-emitting element 101R have the same structures as the structure illustrated in FIG. 4. Therefore, description thereof is omitted here.

The fourth light-emitting element 101Y includes a fourth lower electrode 104Y, a fourth transparent conductive layer 130Y over the fourth lower electrode 104Y, the first light-emitting layer 106 over the fourth transparent conductive layer 130Y, the charge-generation layer 108 over the first light-emitting layer 106, the second light-emitting layer 110 over the charge-generation layer 108, and the upper electrode 112 over the second light-emitting layer 110. The emission spectrum of the first light-emitting layer 106 peaks at a longer wavelength than that of the second light-emitting layer 110. In addition, the distance between the bottom surface of the upper electrode 112 and the bottom surface of the first light-emitting layer 106 is less than or equal to 130 nm.

Note that in FIG. 5, the distance between the bottom surface of the upper electrode 112 and the bottom surface of the first light-emitting layer 106 is represented by X (X≤130 nm).

The light-emitting device 150 illustrated in FIG. 5 includes the hole-injection layer 131 and the hole-transport layer 132 between each of the transparent conductive layers (the first transparent conductive layer 130B, the second transparent conductive layer 130G, the third transparent conductive layer 130R, and the fourth transparent conductive layer 130Y) and the first light-emitting layer 106, the electron-transport layer 133 between the first light-emitting layer 106 and the charge-generation layer 108, the hole-injection layer 134 and the hole-transport layer 135 between the charge-generation layer 108 and the second light-emitting layer 110, and the electron-transport layer 136 and the electron-injection layer 137 between the second light-emitting layer 110 and the upper electrode 112.

In the light-emitting device 150 illustrated in FIG. 5, the optical path length between the fourth lower electrode 104Y and the first light-emitting layer 106 can be adjusted by the thickness of the fourth transparent conductive layer 130Y. In FIG. 5, the optical path length between the fourth lower electrode 104Y and the first light-emitting layer 106 is represented by Y4, which is equal to $3\lambda_Y/4$ ($\lambda_Y$ represents a wavelength of yellow light).

When the Y4 is assumed to be the above-described optical path length, the optical path length between a pair of electrodes (the fourth lower electrode 104Y and the upper electrode 112) can be set to $\lambda_Y$ ($\lambda_Y$ represents a wavelength of yellow light).

When the Y4 is assumed to be the above-described optical path length, it is possible to suppress a decrease in light extraction efficiency due to scattering or absorption of light emitted from the first light-emitting layer 106, which occurs in the vicinity of the surface of the fourth lower electrode 104Y.

In FIG. 5, blue light (B), green light (G), red light (R), and yellow light (Y) emitted from their respective light-emitting elements are schematically denoted by arrows of dashed lines.

Note that in an example shown in FIG. 5, the hole-injection layer 131, the hole-transport layer 132, the first light-emitting layer 106, the electron-transport layer 133, the charge-generation layer 108, the hole-injection layer 134, the hole-transport layer 135, the second light-emitting layer 110, the electron-transport layer 136, and the electron-injection layer 137 are each divided to form the first light-emitting element 101B, the second light-emitting element 101G, the third light-emitting element 101G, and the fourth light-emitting element 101Y; however, they can also be used without being divided.

The first lower electrode 104B, the second lower electrode 104G, the third lower electrode 104R, and the fourth lower electrode 104Y are each formed using a conductive material having a property of reflecting visible light. For example, a material containing silver may be used as the conductive material. When the first lower electrode 104B, the second lower electrode 104G, the third lower electrode 104R, and the fourth lower electrode 104Y are each formed using a material containing silver, the reflectance can be increased and the emission efficiency of each light-emitting element can be increased. For example, a conductive film containing silver is formed and separated into an island-shape; in this way, the first lower electrode 104B, the second lower electrode 104G, the third lower electrode 104R, and the fourth lower electrode 104Y can be formed. The first lower electrode 104B, the second lower electrode 104G, the third lower electrode 104R, and the fourth lower electrode 104Y are preferably formed through a step of processing the same conductive film because the manufacturing cost can be reduced.

As described above, in the light-emitting device 150 illustrated in FIG. 5, in the first light-emitting element 101B, blue light emitted from the second light-emitting layer 110 is adjusted to be intensified; in the second light-emitting element 101G, green light emitted from the second light-emitting layer 110 is adjusted to be intensified; in the third light-emitting element 101R, red light emitted from the second light-emitting layer 110 is adjusted to be intensified, and in the fourth light-emitting element 1011, yellow light emitted from the second light-emitting layer 110 is adjusted to be intensified. Full-color emission of RGBY can be obtained with light emitted from the first light-emitting element 101B, light emitted from the second light-emitting element 101G, light emitted from the third light-emitting element 101R, and light emitted from the fourth light-emitting element 101Y.

As described above, in the light-emitting device 150 illustrated in FIG. 5, the optical path length between the lower electrode and the upper electrode 112 of each light-emitting element is adjusted, whereby scattering or absorption of light in the vicinity of the lower electrode can be suppressed and thus high light extraction efficiency can be achieved. Therefore, a novel light-emitting device with high emission efficiency and low power consumption can be provided.

The other components are similar to those of the light-emitting device 150 illustrated in FIG. 4, and the effect similar to that in the case of the light-emitting device 150 is obtained.

<Structural Example 3 of Light-Emitting Device>

Next, a structural example different from the light-emitting devices 150 illustrated in FIGS. 4 and 5 is described below with reference to FIGS. 6 to 12.

FIGS. 6 to 12 are each a cross-sectional view illustrating an example of a light-emitting device of one embodiment of the present invention. In FIGS. 6 to 12, a portion having a function similar to that in FIGS. 4 and 5 is represented by the same hatch pattern as in FIGS. 4 and 5 and not especially denoted by a reference numeral in some cases. In addition, common reference numerals are used for portions having similar functions, and a detailed description of the portions is omitted in some cases.

Figure 6:
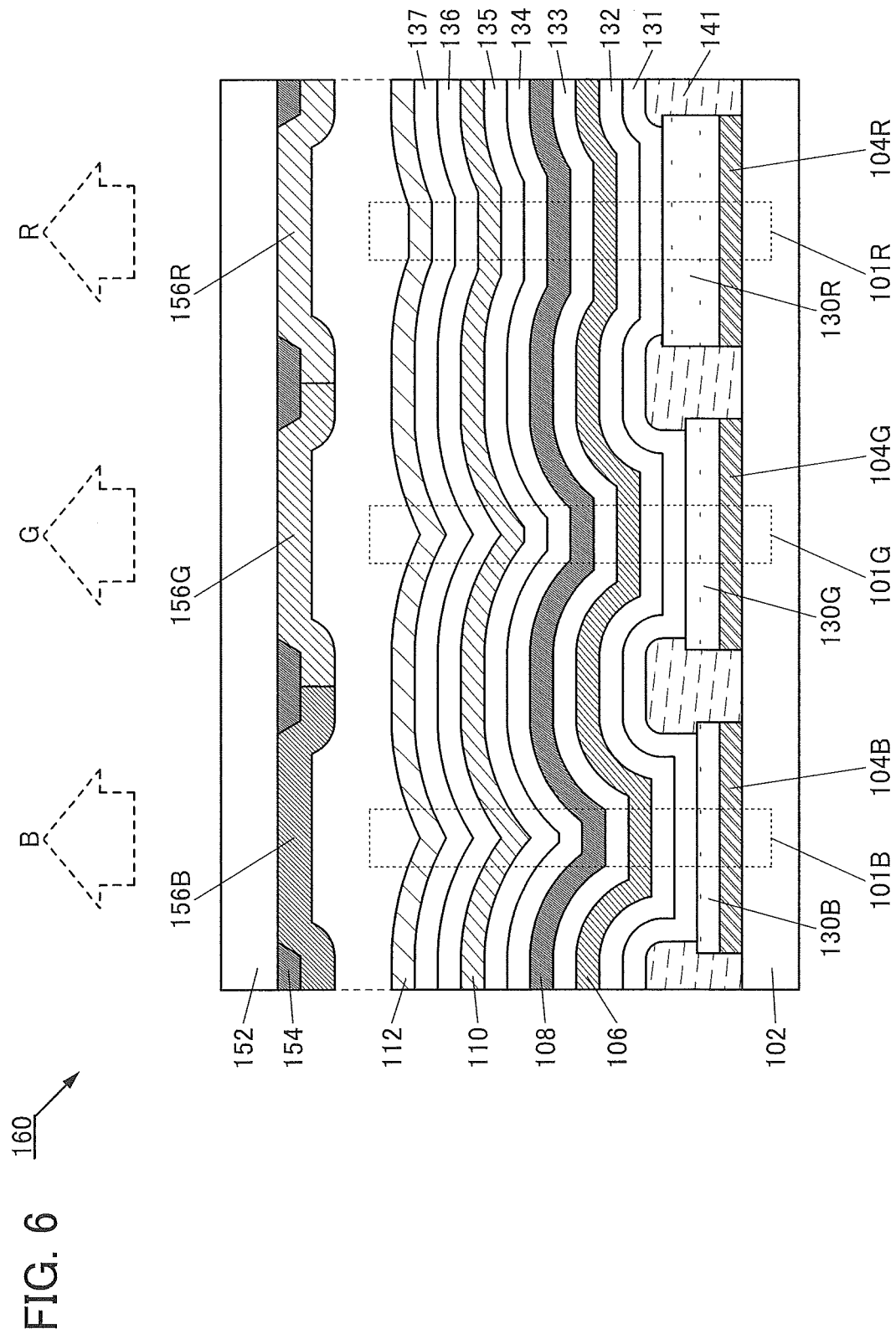
FIG. 6 is a cross-sectional view illustrating a light-emitting device.

A light-emitting device 160 illustrated in FIG. 6 includes a partition wall 141 and a substrate 152 in addition to the components of the light-emitting device 150 illustrated in FIG. 4. The partition walls 141 are provided at outer portions of the light-emitting elements and have a function of covering the end portions of either or both of the lower electrodes and the transparent conductive layers of the light-emitting elements. The substrate 152 is provided with a light-blocking layer 154, a first optical element 156B, a second optical element 156G, and a third optical element 156R. The light-blocking layer 154 is provided to overlap with the partition wall 141. The first optical element 156B, the second optical element 156G, and the third optical element 156R are provided to overlap with the first light-emitting element 101B, the second light-emitting element 101G, and the third light-emitting element 101R, respectively.

Figure 7:
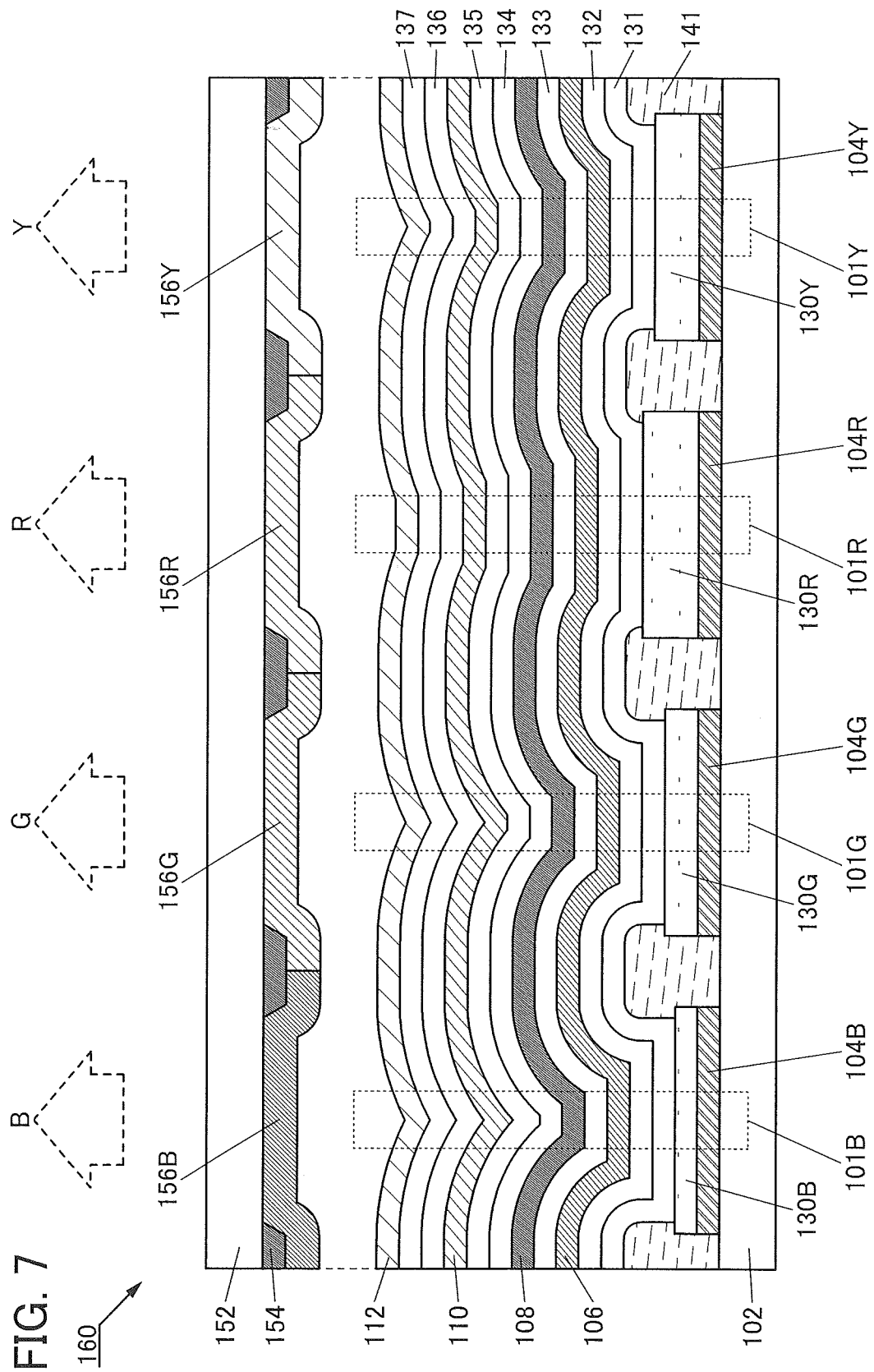
FIG. 7 is a cross-sectional view illustrating a light-emitting device.

The light-emitting device 160 illustrated in FIG. 7 includes the partition wall 141 and the substrate 152 in addition to the components of the light-emitting device 150 illustrated in FIG. 5. The partition walls 141 are provided at outer portions of the light-emitting elements and have a function of covering the end portions of either or both of the lower electrodes and the transparent conductive layers of the light-emitting elements. The substrate 152 is provided with the light-blocking layer 154, the first optical element 156B, the second optical element 156G, the third optical element 156R, and a fourth optical element 156Y. The light-blocking layer 154 is provided to overlap with the partition wall 141. The first optical element 156B, the second optical element 156G, the third optical element 156R, and the fourth optical element 156Y are provided to overlap with the first light-emitting element 101B, the second light-emitting element 101G, the third light-emitting element 101R, and the fourth light-emitting element 101Y, respectively.

Figure 8:
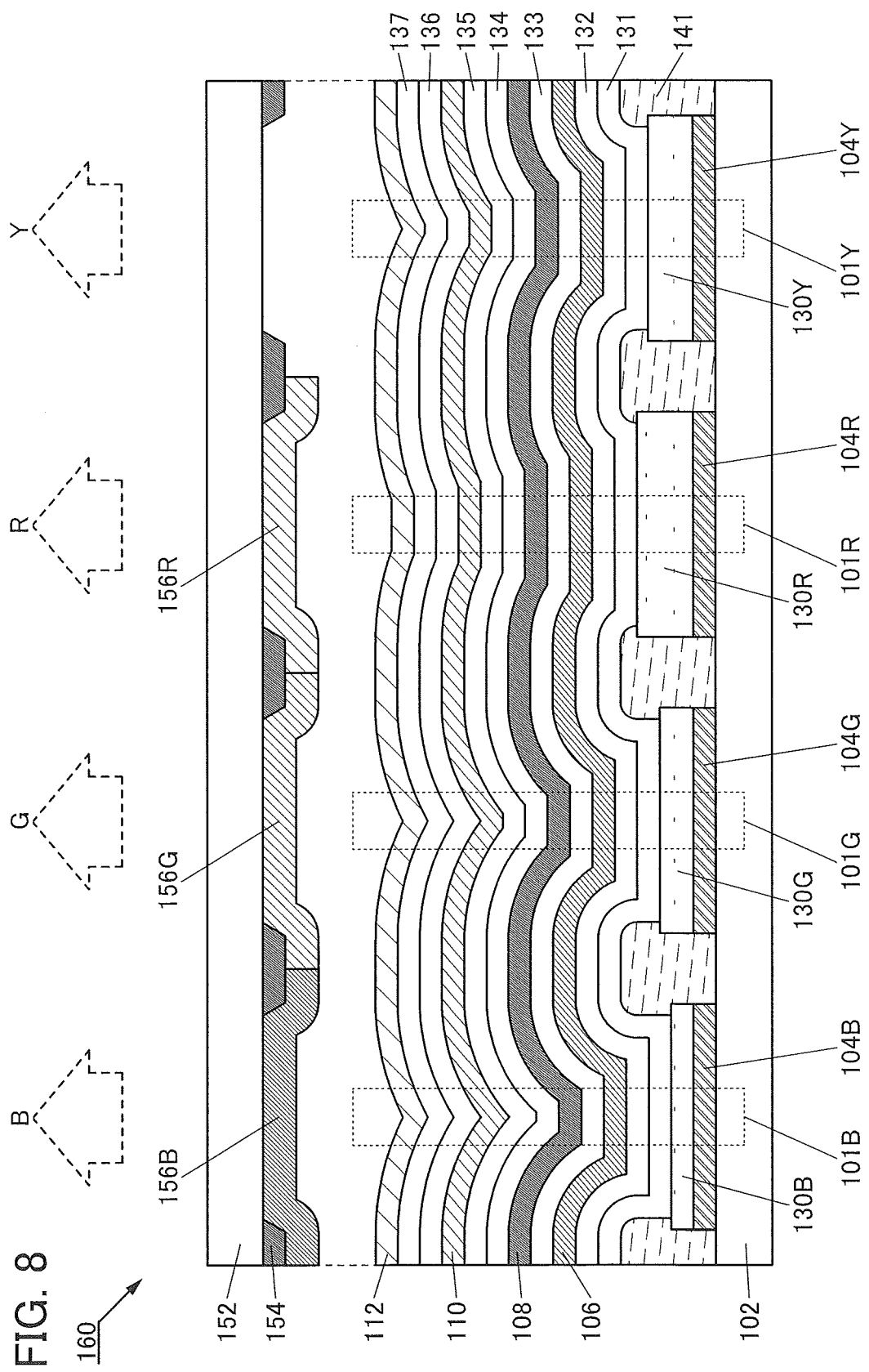
FIG. 8 is a cross-sectional view illustrating a light-emitting device.
Figure 9:
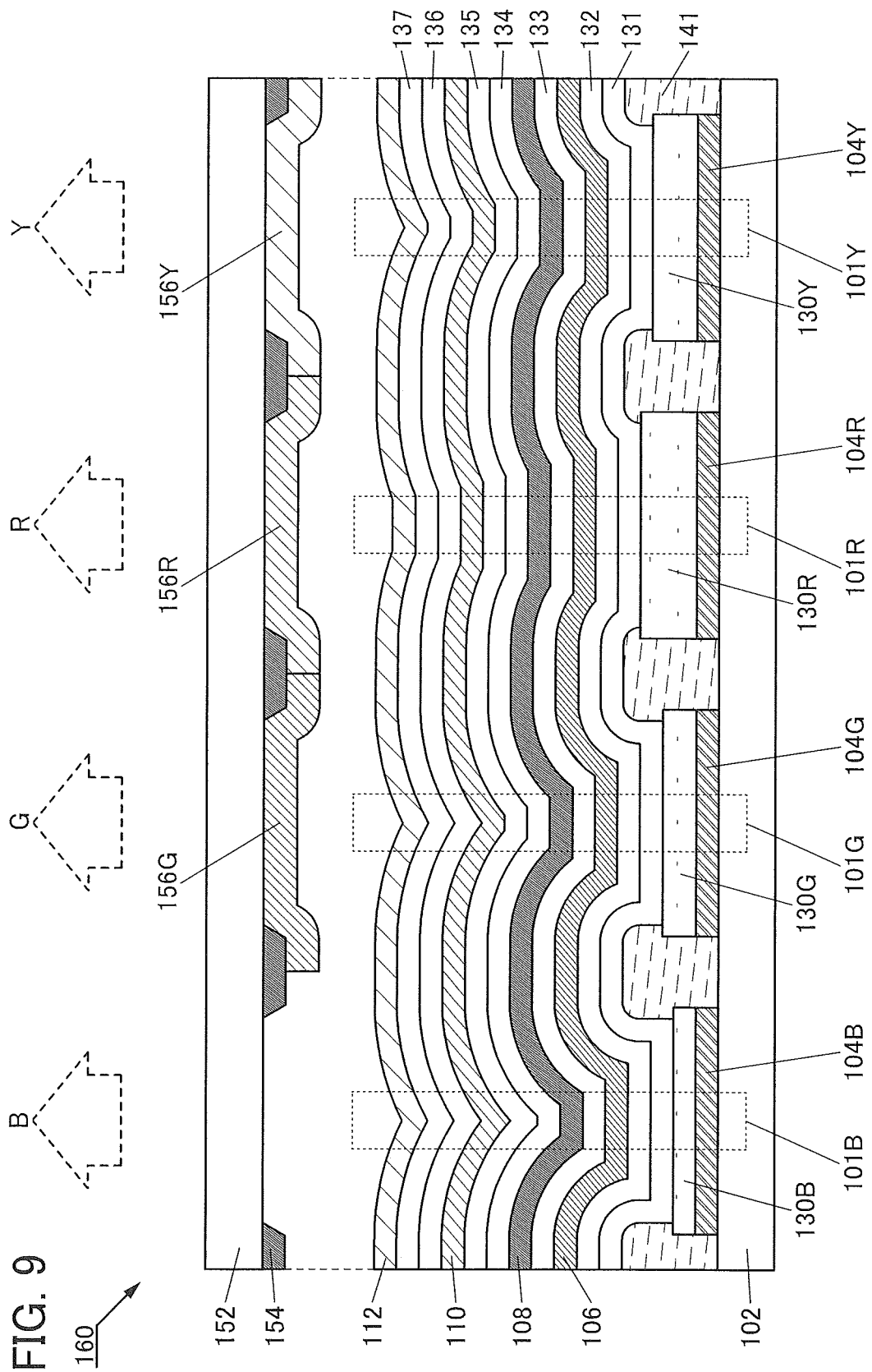
FIG. 9 is a cross-sectional view illustrating a light-emitting device.
Figure 10:
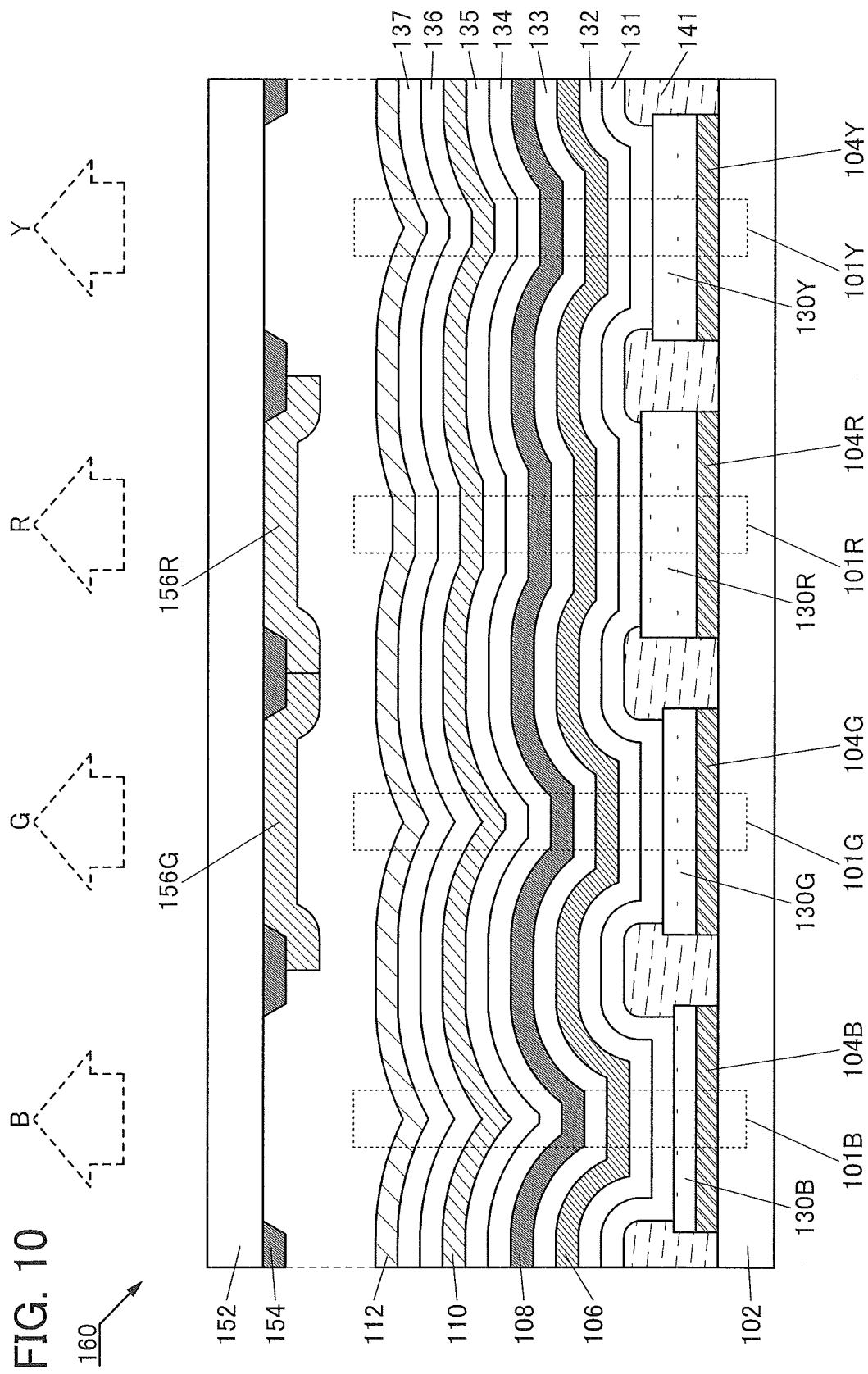
FIG. 10 is a cross-sectional view illustrating a light-emitting device.

In the light-emitting device 160 illustrated in FIG. 8, the fourth optical element 156Y of the light-emitting device 160 illustrated in FIG. 7 is not provided. In the light-emitting device 160 illustrated in FIG. 9, the first optical element 156B of the light-emitting device 160 illustrated in FIG. 7 is not provided. In the light-emitting device 160 illustrated in FIG. 10, the first optical element 156B and the fourth optical element 156Y of the light-emitting device 160 illustrated in FIG. 7 are not provided.

For example, with the use of a phosphorescent material emitting light in a yellow wavelength range for the first light-emitting layer 106 and a fluorescent material emitting light in a blue wavelength range for the second light-emitting layer 110, it is possible not to provide an optical element in at least one of the regions overlapping with the first light-emitting element 101B and the fourth light-emitting element 101Y. With a structure in which an optical element is not provided in at least one of the regions overlapping with the first light-emitting element 101B and the fourth light-emitting element 101Y, the power consumption of the light-emitting device 160 can be reduced. Particularly when the first light-emitting element 101B is not provided with the first optical element 156B, power consumption can be reduced more effectively. Note that to prevent external light reflection, as illustrated in FIG. 7, all of the light-emitting elements are preferred to be provided with the optical elements.

Figure 11:
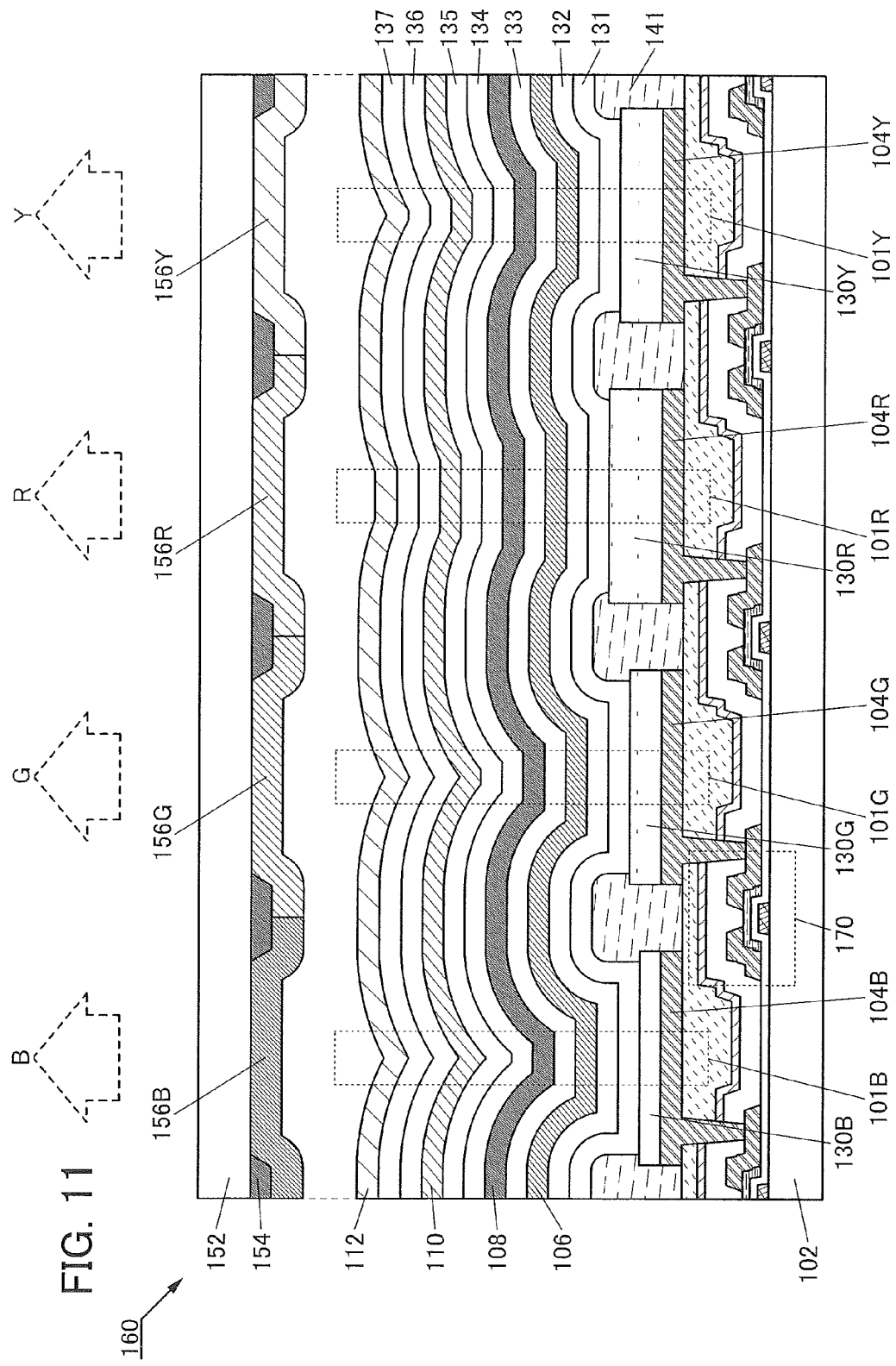
FIG. 11 is a cross-sectional view illustrating a light-emitting device.

In the light-emitting device 160 illustrated in FIG. 11, transistors 170 are connected to the first light-emitting element 101B, the second light-emitting element 101G, the third light-emitting element 101R, and the fourth light-emitting element 101Y illustrated in FIG. 7. Note that the transistors 170 are connected to the lower electrodes of the light-emitting elements.

Figure 12:
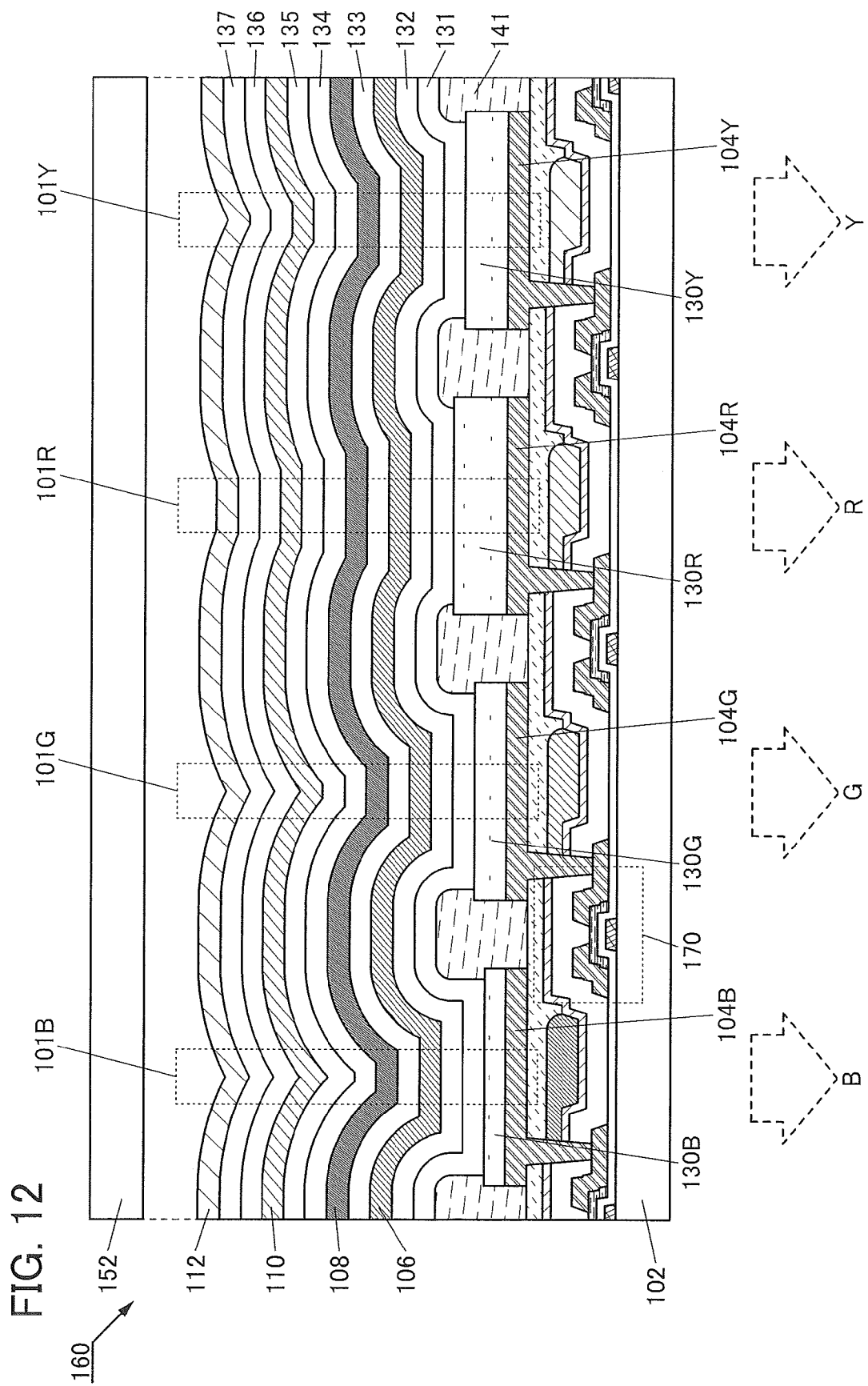
FIG. 12 is a cross-sectional view illustrating a light-emitting device.

In the light-emitting device 160 illustrated in FIG. 12, the optical elements (the first optical element 156B, the second optical element 156G, the third optical element 156R, and the fourth optical element 156Y) are each provided between the transistor 170 and the lower electrode of the light-emitting device 160 illustrated in FIG. 11. In the light-emitting device 160 illustrated in FIG. 12, light extracted from the lower electrode is emitted to the substrate 102 side through the optical element. Note that the light-emitting device 160 illustrated in FIG. 12, in which the optical element or the like is not provided on the substrate 152 side, is preferable because manufacturing cost can be reduced.

Note that the light-emitting device 160 illustrated in FIG. 12 is a bottom-emission light-emitting device in which light is emitted from the substrate 102 side. In the case of the bottom-emission light-emitting device, the materials used for the lower electrode and the upper electrode may be interchanged with each other. In other words, in the case of the bottom-emission light-emitting device, the lower electrode is formed using a reflective and light-transmitting conductive material, and the upper electrode is formed using a reflective conductive material.

Figure 13:
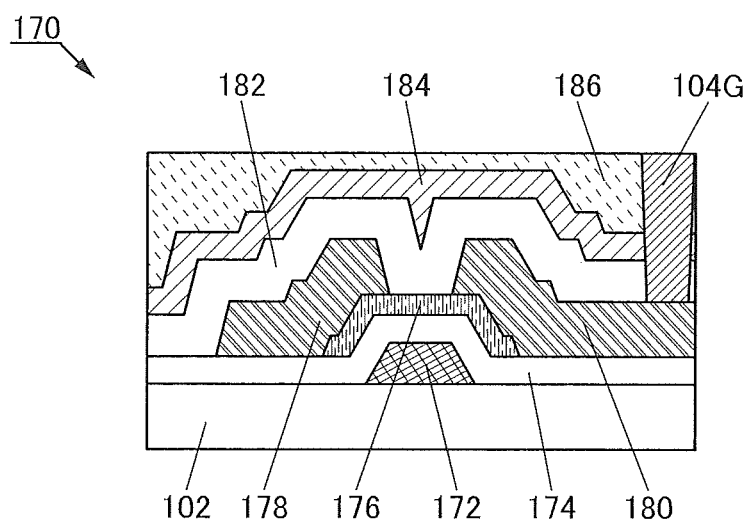
FIG. 13 is a cross-sectional view illustrating a transistor.

Note that the transistors 170 included in the light-emitting device 160 illustrated in FIGS. 11 and 12 are described in detail with reference to FIG. 13. FIG. 13 is a cross-sectional view of the transistor 170.

The transistor 170 illustrated in FIG. 13 includes a gate electrode 172 over the substrate 102, a gate insulating layer 174 over the substrate 102 and the gate electrode 172, a semiconductor layer 176 over the gate insulating layer 174, a source electrode 178 over the gate insulating layer 174 and the semiconductor layer 176, and a drain electrode 180 over the gate insulating layer 174 and the semiconductor layer 176. An insulating layer 182 is provided over the transistor 170, an insulating layer 184 is provided over the insulating layer 182, and an insulating layer 186 is provided over the insulating layer 184.

The insulating layer 182 is in contact with the semiconductor layer 176. The insulating layer 182 can be formed using an oxide insulating material, for example. The insulating layer 184 has a function of suppressing entry of impurities into the transistor 170. The insulating layer 184 can be formed using a nitride insulating material, for example. The insulating layer 186 has a function of planarizing unevenness and the like due to the transistor 170 and the like. The insulating layer 186 can be formed using an organic resin insulating material, for example.

An opening is formed in the insulating layers 182, 184, and 186. The drain electrode 180 of the transistor 170 and the lower electrode (here, the second lower electrode 104G) are electrically connected to each other through the opening. Current or voltage flowing through the lower electrode can be controlled by driving the transistor 170.

Here, each component of the aforementioned light-emitting device 150 and light-emitting device 160 is described below in detail.
<Substrate>
The substrate 152 is used as a support of the optical elements. The substrate 152 may have a structure similar to that of the aforementioned substrate 102. However, the substrate 102 and the substrate 152 do not necessarily have similar structures and may be different from each other.
<Partition Wall>
The partition wall 141 has an insulating property and is formed using an inorganic or organic material. Examples of the inorganic material include a silicon oxide film, a silicon oxynitride film, a silicon nitride oxide film, a silicon nitride film, an aluminum oxide film, an aluminum nitride film, and the like. Examples of the organic material include photosensitive resin materials such as an acrylic resin and a polyimide resin.
<Light-Blocking Layer>
The light-blocking layer 154 has a function of reducing the reflection of external light. The light-blocking layer 154 has a function of preventing mixture of light emitted from an adjacent light-emitting element. As the light-blocking layer 154, a metal, a resin containing black pigment, carbon black, a metal oxide, a composite oxide containing a solid solution of a plurality of metal oxides, or the like can be used.

<Light-Emitting Element>

The first optical element 156B, the second optical element 156G, the third optical element 156R, and the fourth optical element 156Y selectively transmit light with a particular color out of incident light. For example, a color filter, a band pass filter, a multilayer filter, or the like can be used. Color conversion elements can be used as the optical elements. A color conversion element is an optical element that converts incident light into light having a longer wavelength than the incident light. As the color conversion elements, quantum-dot elements are preferably used. The usage of the quantum-dot type can increase color reproducibility of the light-emitting device.

The first optical element 156B has a function of transmitting light in a blue wavelength range out of light emitted from the first light-emitting element 101B. The second optical element 156G has a function of transmitting light in a green wavelength range out of light emitted from the second light-emitting element 101G. The third optical element 156R has a function of transmitting light in a red wavelength range out of light emitted from the third light-emitting element 101R. In addition, the fourth optical element 156Y has a function of transmitting light in a yellow wavelength range out of light emitted from the fourth light-emitting element 101Y.

Note that an optical element different from the above-described optical elements may be provided so as to overlap with each of the light-emitting elements. As another optical element, for example, a circularly polarizing plate, an anti-reflective film, and the like can be given. A circularly polarizing plate provided on the side where light emitted from the light-emitting element of the light-emitting device is extracted can prevent a phenomenon in which light entering from the outside of the light-emitting device is reflected inside the light-emitting device and returned to the outside. An anti-reflective film can weaken external light reflected by a surface of the light-emitting device. Accordingly, light emitted from the light-emitting device can be observed clearly.

The above-described structures of the light-emitting devices can be combined as appropriate.

<Manufacturing Method of Light-Emitting Device>

Next, a manufacturing method of a light-emitting device of one embodiment of the present invention is described below with reference to FIGS. 14A and 14B, FIGS. 15A and 15B, and FIGS. 16A and 16B. Here, a manufacturing method of the light-emitting device 160 illustrated in FIG. 7 is described.

FIGS. 14A and 14B, FIGS. 15A and 15B, and FIGS. 16A and 16B are cross-sectional views for illustrating the manufacturing method of the light-emitting device of one embodiment of the present invention.

The manufacturing method of the light-emitting device 160 described below includes first to sixth steps.

<First Step>

The first step is a step for forming the lower electrodes (the first lower electrode 104B, the second lower electrode 104G, the third lower electrode 104R, and the fourth lower electrode 104Y) of the light-emitting elements, the transparent conductive layers (the first transparent conductive layer 106B, the second transparent conductive layer 106G, the third transparent conductive layer 106R, and the fourth transparent conductive layer 106Y) of the light-emitting elements, and the partition wall 141 covering end portions of the lower electrode and the transparent conductive layer of each light-emitting element (see FIG. 14A).

In the first step, since there is no possibility of damaging a light-emitting layer containing an organic compound, a variety of micromachining technologies can be employed. In this embodiment, a reflective conductive film is formed by a sputtering method, subjected to patterning by a photolithography technique, and then processed into an island shape by a dry etching method to form the first lower electrode 104B, the second lower electrode 104G, the third lower electrode 104R, and the fourth lower electrode 104Y.

Next, a light-transmitting conductive film is formed over the first lower electrode 104B, subjected to patterning by a photolithography technique, and then processed into an island shape by a wet etching method to form the first transparent conductive layer 106B. After that, a light-transmitting conductive film is formed over the second lower electrode 104G, subjected to patterning by a photolithography technique, and then processed into island shapes by a wet etching method to form the second transparent conductive layer 106G. Next, a light-transmitting conductive film is formed over the third lower electrode 104R, subjected to patterning by a photolithography technique, and then processed into island shapes by a wet etching method to form the third transparent conductive layer 106R. Then, a light-transmitting conductive film is formed over the fourth lower electrode 104Y, subjected to patterning by a photolithography technique, and then processed into island shapes by a wet etching method to form the fourth transparent conductive layer 106Y.

Next, the partition wall 141 is formed to cover end portions of the island-shaped lower electrode and the island-shaped transparent conductive layer. The partition wall 141 includes an opening overlapping with the lower electrode. The transparent conductive layer exposed by the opening functions as part of the lower electrode of the light-emitting element.

In the first step, an alloy film of silver, palladium, and copper is used as the conductive film for the lower electrode. As the transparent conductive layer, an ITSO film is used. As the partition wall 141, a polyimide resin is used.

Note that transistors may be formed over the substrate 102 before the first step. The transistors may be electrically connected to the lower electrodes (the first lower electrode 104B, the second lower electrode 104G, the third lower electrode 104R, and the fourth lower electrode 104Y).

<Second Step>

The second step is a step for forming the hole-injection layer 131, the hole-transport layer 132, the first light-emitting layer 106, and the electron-transport layer 133 (see FIG. 14B).

The hole-injection layer 131 can be formed by co-evaporating a hole-transport material and a material containing an acceptor substance. Note that co-evaporation is an evaporation method in which a plurality of different substances are concurrently vaporized from their respective evaporation sources. The hole-transport layer 132 can be formed by evaporating a hole-transport material.

The first light-emitting layer 106 can be formed by evaporating a light-emitting substance that emits light of at least one of green, yellow green, yellow, orange, and red. As the above-described light-emitting substance, a phosphorescent organic compound can be used. The phosphorescent organic compound may be evaporated alone or the phosphorescent organic compound mixed with another material may be evaporated. For example, the phosphorescent organic compound may be used as a guest material, and the guest material may be dispersed into a host material having a higher excitation energy than the guest material and evaporated.

The electron-transport layer 133 can be formed by evaporating a substance with a high electron-transport property.

<Third Step>

Figure 15A:
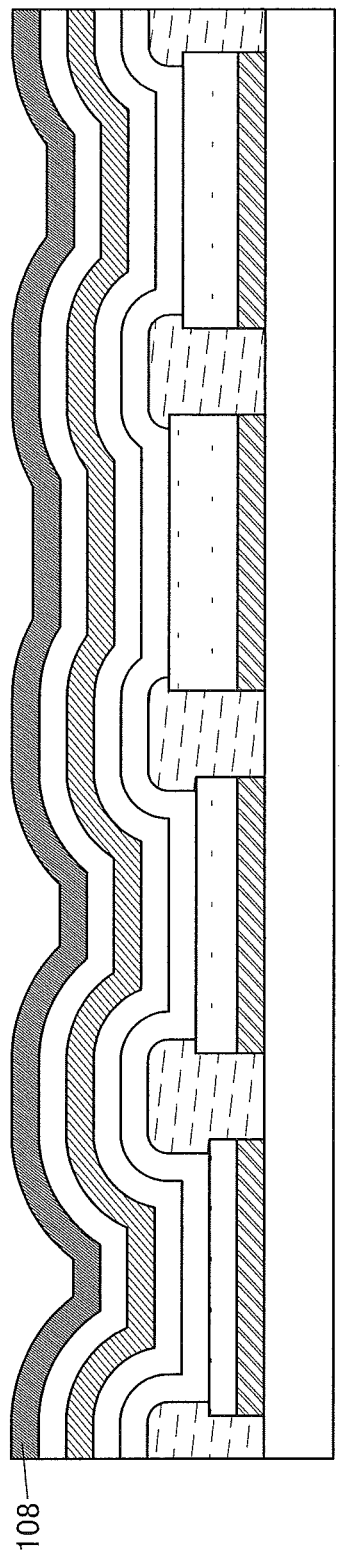
FIGS. 15A and 15B are cross-sectional views illustrating a method for manufacturing the light-emitting device.

The third step is a step for forming the charge-generation layer 108 (see FIG. 15A).

The charge-generation layer 108 can be formed by evaporating a material obtained by adding an acceptor substance to a hole-transport material or a material obtained by adding a donor substance to an electron-transport material. In this embodiment, the charge-generation layer 108 has a two-layer structure, in which the first layer is formed using a material obtained by adding an electron donor to an electron-transport material and the second layer is formed using a material obtained by adding an electron acceptor to a hole-transport material.

<Fourth Step>

Figure 15B:
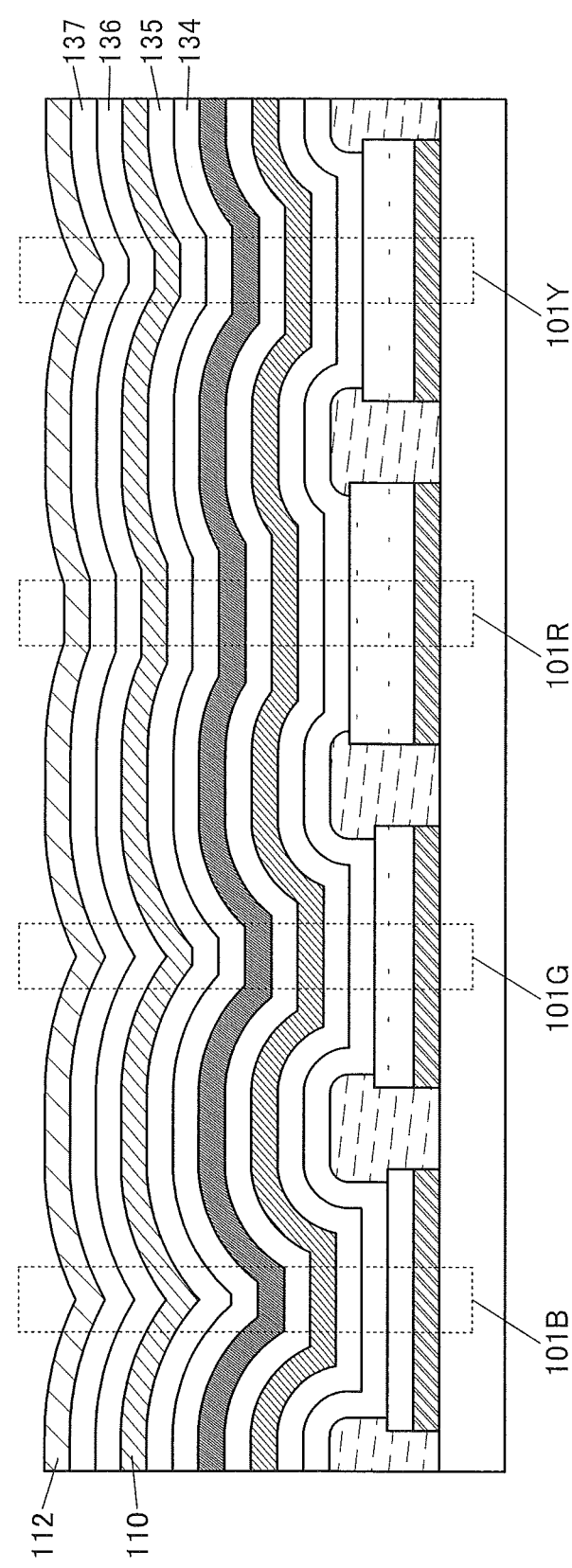

The fourth step is a step for forming the hole-injection layer 134, the hole-transport layer 135, the second light-emitting layer 110, the electron-transport layer 136, the electron-injection layer 137, and the upper electrode 112 (see FIG. 15B).

The hole-injection layer 134 can be formed by using a material and a method which are similar to those of the hole-injection layer 131. The hole-transport layer 135 can be formed by using a material and a method which are similar to those of the hole-transport layer 132.

The second light-emitting layer 110 can be formed by evaporating a light-emitting substance that emits light of at least one of violet, blue, and blue green. As the light-emitting substance, a fluorescent organic compound can be used. The fluorescent organic compound may be evaporated alone or the fluorescent organic compound mixed with another material may be evaporated. For example, the fluorescent organic compound may be used as a guest material, and the guest material may be dispersed into a host material having a higher excitation energy than the guest material and evaporated.

The electron-transport layer 136 can be formed by evaporating a substance with a high electron-transport property. The electron-injection layer 137 can be formed by evaporating a substance with a high electron-injection property.

The upper electrode 112 can be formed by stacking a reflective conductive film and a light-transmitting conductive film.

Through the above-described steps, the first light-emitting element 101B, the second light-emitting element 101G, the third light-emitting element 101R, and the fourth light-emitting element 101Y are formed over the substrate 102.

<Fifth Step>

Figure 16A:
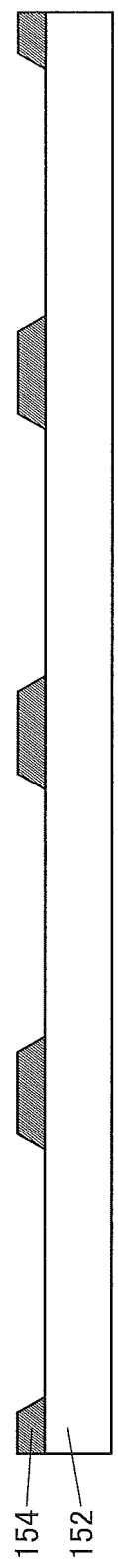
FIGS. 16A and 16B are cross-sectional views illustrating a method for manufacturing the light-emitting device.
Figure 16B:
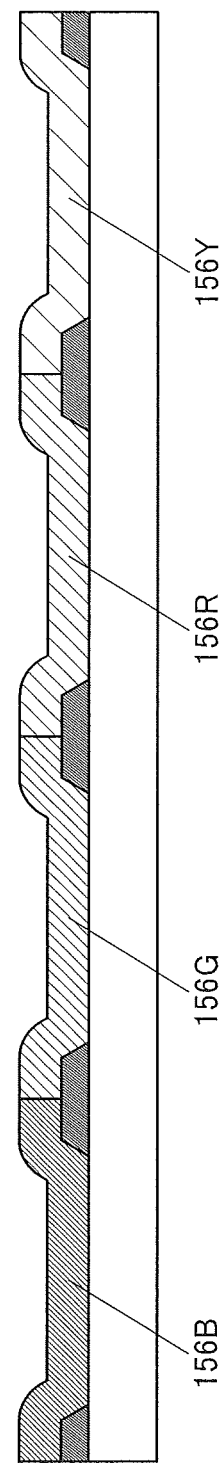

In the fifth step, the light-blocking layer 154, the first optical element 156B, the second optical element 156G, the third optical element 156R, and the fourth optical element 156Y are formed over the substrate 152 (see FIGS. 16A and 16B).

First, the light-blocking layer 154 is formed over the substrate 152 (see FIG. 16A).

In this embodiment, as the light-blocking layer 154, an organic resin film containing black pigment is formed in a desired region.

Next, the optical elements (the first optical element 156B, the second optical element 156G, the third optical element 156R, and the fourth optical element 156Y) are formed over the substrate 152 and the light-blocking layer 154 (see FIG. 16B).

In this embodiment, as the first optical element 156B, an organic resin film containing blue pigment is formed in a desired region. As the second optical element 156G, an organic resin film containing green pigment is formed in a desired region. As the third optical element 156R, an organic resin film containing red pigment is formed in a desired region. As the fourth optical element 156Y, an organic resin film containing yellow pigment is formed in a desired region.

Through the above steps, the light-blocking layer 154 and the optical elements (the first optical element 156B, the second optical element 156G, the third optical element 156R, and the fourth optical element 156Y) are formed over the substrate 152. Note that in this embodiment, the case where the light-blocking layer 154 is formed and then the optical elements are formed is given as an example; however, without limitation thereto, the light-blocking layer 154 may be formed after the optical elements are formed, for example.

<Sixth Step>

In the sixth step, the first light-emitting element 101B, the second light-emitting element 101G, the third light-emitting element 101R, and the fourth light-emitting element 101Y formed over the substrate 102 are attached to the light-blocking layer 154, the first optical element 156B, the second optical element 156G, the third optical element 156R, and the fourth optical element 156Y formed over the substrate 152, and sealed with a sealant (not illustrated).

Through the above steps, the light-emitting device 160 illustrated in FIG. 7 can be formed.

The structure described in this embodiment can be combined with any of the structures described in the other embodiments and examples as appropriate.

Embodiment 3

In this embodiment, a display device including a light-emitting device of one embodiment of the present invention will be described with reference to FIGS. 17A and 17B.

Figure 17A:
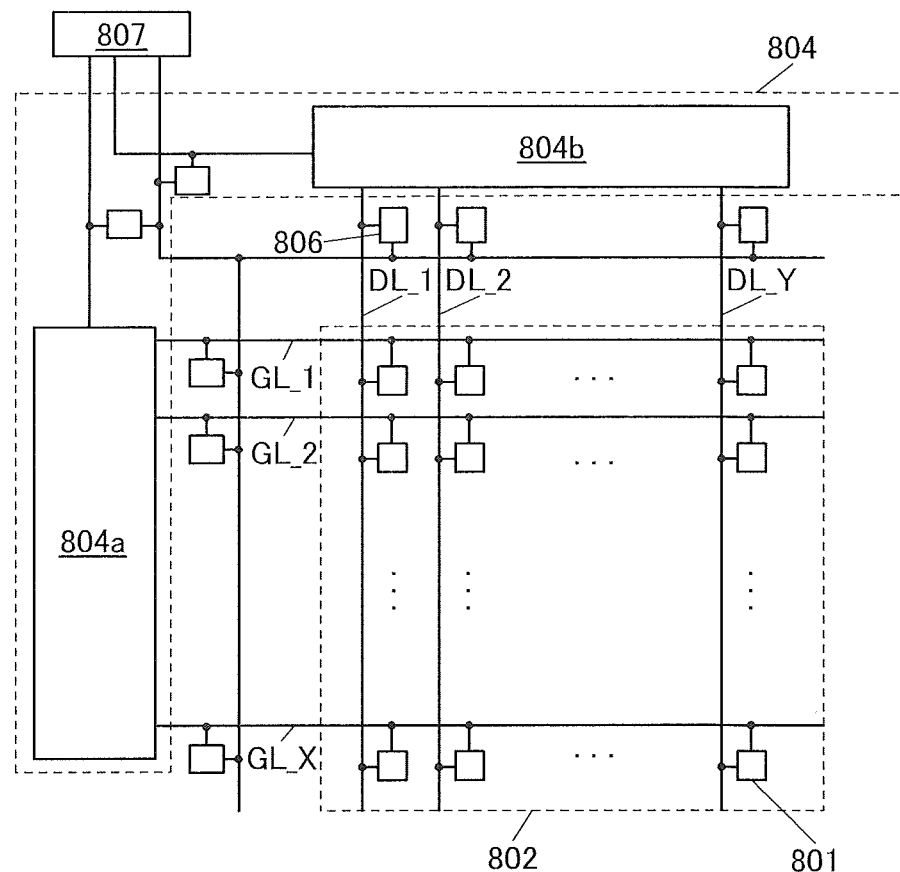
FIGS. 17A and 17B are a block diagram and a circuit diagram illustrating a display device.
Figure 17B:
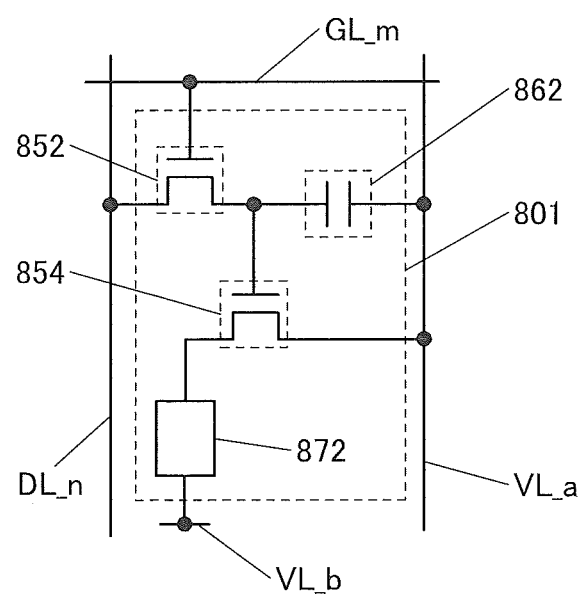

FIG. 17A is a block diagram illustrating the display device of one embodiment of the present invention, and FIG. 17B is a circuit diagram illustrating a pixel circuit of the display device of one embodiment of the present invention.

The display device illustrated in FIG. 17A includes a region including pixels of display elements (the region is hereinafter referred to as a pixel portion 802), a circuit portion provided outside the pixel portion 802 and including circuits for driving the pixels (the portion is hereinafter referred to as a driver circuit portion 804), circuits having a function of protecting elements (the circuits are hereinafter referred to as protection circuits 806), and a terminal portion 807. Note that the protection circuits 806 are not necessarily provided.

Part or the whole of the driver circuit portion 804 is preferably formed over a substrate over which the pixel portion 802 is formed, in which case the number of components and the number of terminals can be reduced. When part or the whole of the driver circuit portion 804 is not formed over the substrate over which the pixel portion 802 is formed, the part or the whole of the driver circuit portion 804 can be mounted by chip-on-glass (COG) or tape automated bonding (TAB).

The pixel portion 802 includes a plurality of circuits for driving display elements arranged in X rows (X is a natural number of 2 or more) and Y columns (Y is a natural number of 2 or more) (such circuits are hereinafter referred to as pixel circuits 801). The driver circuit portion 804 includes driver circuits such as a circuit for supplying a signal (scan signal) to select a pixel (the circuit is hereinafter referred to as a gate driver 804a) and a circuit for supplying a signal (data signal) to drive a display element in a pixel (the circuit is hereinafter referred to as a source driver 804b).

The gate driver 804a includes a shift register or the like. Through the terminal portion 807, the gate driver 804a receives a signal for driving the shift register and outputs a signal. For example, the gate driver 804a receives a start pulse signal, a clock signal, or the like and outputs a pulse signal. The gate driver 804a has a function of controlling the potentials of wirings supplied with scan signals (such wirings are hereinafter referred to as scan lines GL_1 to GL_X). Note that a plurality of gate drivers 804a may be provided to control the scan lines GL_1 to GL_X separately. Alternatively, the gate driver 804a has a function of supplying an initialization signal. Without being limited thereto, the gate driver 804a can supply another signal.

The source driver 804b includes a shift register or the like. The source driver 804b receives a signal (video signal) from which a data signal is derived, as well as a signal for driving the shift register, through the terminal portion 807. The source driver 804b has a function of generating a data signal to be written to the pixel circuit 801 which is based on the video signal. In addition, the source driver 804b has a function of controlling output of a data signal in response to a pulse signal produced by input of a start pulse signal, a clock signal, or the like. Furthermore, the source driver 804b has a function of controlling the potentials of wirings supplied with data signals (such wirings are hereinafter refereed to as data lines DL_1 to DL_Y). Alternatively, the source driver 804b has a function of supplying an initialization signal. Without being limited thereto, the source driver 804b can supply another signal.

The source driver 804b includes a plurality of analog switches or the like, for example. The source driver 804b can output, as the data signals, signals obtained by time-dividing the video signal by sequentially turning on the plurality of analog switches. The source driver 804b may include a shift register or the like.

A pulse signal and a data signal are input to each of the plurality of pixel circuits 801 through one of the plurality of scan lines GL supplied with scan signals and one of the plurality of data lines DL supplied with data signals, respectively. Writing and holding of the data signal to and in each of the plurality of pixel circuits 801 are controlled by the gate driver 804a. For example, to the pixel circuit 801 in the m-th row and the n-th column (m is a natural number of less than or equal to X, and n is a natural number of less than or equal to Y), a pulse signal is input from the gate driver 804a through the scan line GL_m, and a data signal is input from the source driver 804b through the data line DL_n in accordance with the potential of the scan line GL_m.

The protection circuit 806 illustrated in FIG. 17A is connected to, for example, the scan line GL between the gate driver 804a and the pixel circuit 801. Alternatively, the protection circuit 806 is connected to the data line DL between the source driver 804b and the pixel circuit 801. Alternatively, the protection circuit 806 can be connected to a wiring between the gate driver 804a and the terminal portion 807. Alternatively, the protection circuit 806 can be connected to a wiring between the source driver 804b and the terminal portion 807. Note that the terminal portion 807 means a portion having terminals for inputting power, control signals, and video signals to the display device from external circuits.

The protection circuit 806 is a circuit that electrically connects a wiring connected to the protection circuit to another wiring when a potential out of a certain range is applied to the wiring connected to the protection circuit.

As illustrated in FIG. 17A, the protection circuits 806 are provided for the pixel portion 802 and the driver circuit portion 804, so that the resistance of the display device to overcurrent generated by electrostatic discharge (ESD) or the like can be improved. Note that the configuration of the protection circuits 806 is not limited to that, and for example, a configuration in which the protection circuits 806 are connected to the gate driver 804a or a configuration in which the protection circuits 806 are connected to the source driver 804b may be employed. Alternatively, the protection circuits 806 may be configured to be connected to the terminal portion 807.

In FIG. 17A, an example in which the driver circuit portion 804 includes the gate driver 804a and the source driver 804b is shown; however, the structure is not limited thereto. For example, only the gate driver 804a may be formed and a separately prepared substrate where a source driver circuit is formed (e.g., a driver circuit substrate formed with a single crystal semiconductor film or a poly-crystalline semiconductor film) may be mounted.

Each of the plurality of pixel circuits 801 in FIG. 17A can have a structure illustrated in FIG. 17B, for example.

The pixel circuit 801 illustrated in FIG. 17B includes transistors 852 and 854, a capacitor 862, and a light-emitting element 872.

One of a source electrode and a drain electrode of the transistor 852 is electrically connected to a wiring to which a data signal is supplied (hereinafter referred to as a data line DL_n). A gate electrode of the transistor 852 is electrically connected to a wiring to which a gate signal is supplied (hereinafter referred to as a scan line GL_m).

The transistor 852 has a function of controlling whether to write a data signal by being turned on or off.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Furthermore, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, any of the light-emitting elements described in Embodiment 1 can be used.

Note that a high power supply potential VDD is supplied to one of the potential supply line VL_a and the potential supply line VL_b, and a low power supply potential VSS is supplied to the other.

In the display device including the pixel circuits 801 in FIG. 17B, the pixel circuits 801 are sequentially selected row by row by the gate driver 804a in FIG. 17A, for example, whereby the transistors 852 are turned on and a data signal is written.

When the transistors 852 are turned off, the pixel circuits 801 in which the data has been written are brought into a holding state. Furthermore, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

Alternatively, the pixel circuit can have a function of compensating variation in threshold voltages or the like of a transistor. FIGS. 18A and 18B and FIGS. 19A and 19B illustrate examples of the pixel circuit.

Figure 18A:
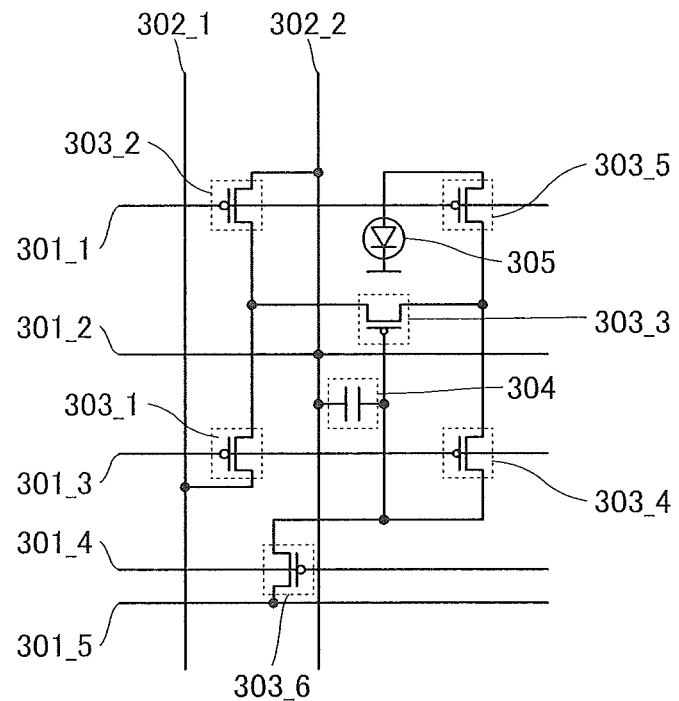
FIGS. 18A and 18B are each a circuit diagram illustrating a pixel circuit of a display device.

The pixel circuit illustrated in FIG. 18A includes six transistors (transistors 303_1 to 303_6), a capacitor 304, and a light-emitting element 305. The pixel circuit illustrated in FIG. 18A is electrically connected to wirings 301_1 to 301_5 and wirings 302_1 and 302_2. Note that as the transistors 303_1 to 303_6, for example, p-channel transistors can be used.

Figure 18B:
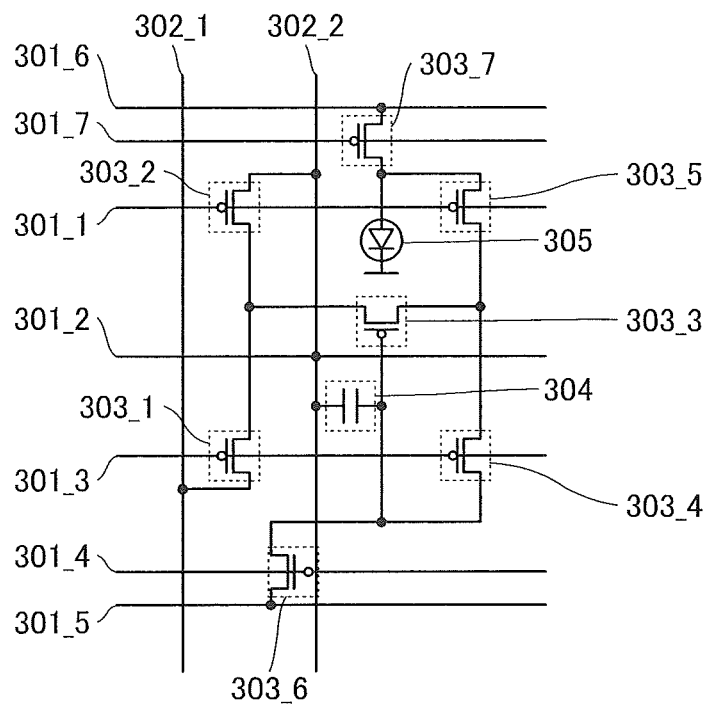

The pixel circuit illustrated in FIG. 18B has a configuration in which a transistor 303_7 is added to the pixel circuit illustrated in FIG. 18A. The pixel circuit illustrated in FIG. 18B is electrically connected to wirings 301_6 and 301_7. The wirings 301_5 and 301_6 may be electrically connected to each other. Note that as the transistor 303_7, for example, a p-channel transistor can be used.

Figure 19A:
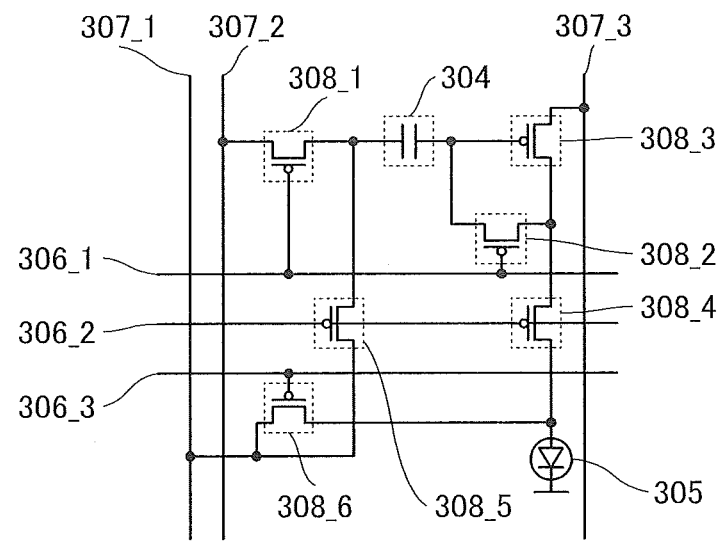
FIGS. 19A and 19B are each a circuit diagram illustrating a pixel circuit of a display device.

The pixel circuit illustrated in FIG. 19A includes six transistors (transistors 308_1 to 308_6), the capacitor 304, and the light-emitting element 305. The pixel circuit illustrated in FIG. 19A is electrically connected to wirings 306_1 to 306_3 and wirings 307_1 to 307_3. The wirings 306_1 and 306_3 may be electrically connected to each other. Note that as the transistors 308_1 to 308_6, for example, p-channel transistors can be used.

Figure 19B:
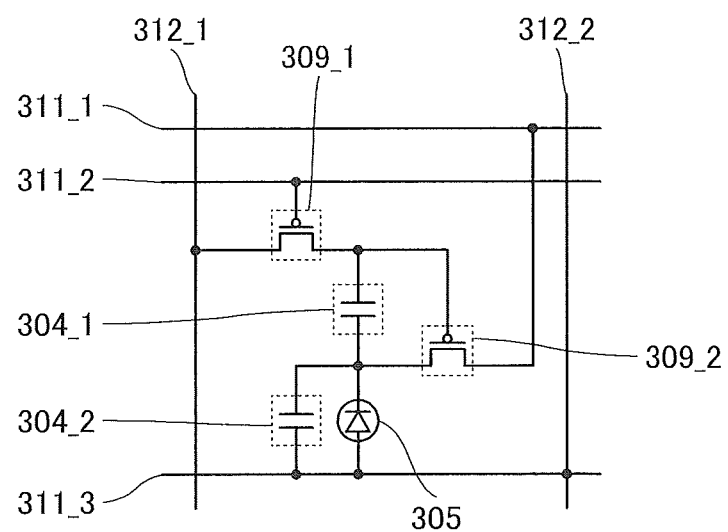

The pixel circuit illustrated in FIG. 19B includes two transistors (transistors 309_1 and 309_2), two capacitors (capacitors 304_1 and 304_2), and the light-emitting element 305. The pixel circuit illustrated in FIG. 19B is electrically connected to wirings 311_1 to 311_3 and wirings 312_1 and 312_2. With the configuration of the pixel circuit illustrated in FIG. 19B, the light-emitting element 305 can be driven by constant voltage constant current (CVCC). Note that as the transistors 309_1 and 309_2, for example, p-channel transistors can be used.

A light-emitting element of one embodiment of the present invention can be used for an active matrix method in which an active element is included in a pixel of a display device or a passive matrix method in which an active element is not included in a pixel of a display device.

In the active matrix method, as an active element (a non-linear element), not only a transistor but also a variety of active elements (non-linear elements) can be used. For example, a metal insulator metal (MIM), a thin film diode (TFD), or the like can also be used. Since these elements can be formed with a smaller number of manufacturing steps, manufacturing cost can be reduced or yield can be improved. Alternatively, since the size of these elements is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

The structure described in this embodiment can be combined with any of the structures described in the other embodiments and examples as appropriate.

Embodiment 4

In this embodiment, a display panel including a light-emitting device of one embodiment of the present invention and an electronic device in which the display panel is provided with an input device will be described with reference to FIGS. 20A and 20B, FIGS. 21A to 21C, FIGS. 22A and 22B, FIGS. 23A and 23B, and FIG. 24.

<Description 1 of Touch Panel>

In this embodiment, a touch panel 2000 including a display panel and an input device will be described as an example of an electronic device. In addition, an example in which a touch sensor is used as an input device will be described. Note that a light-emitting device of one embodiment of the present invention can be used for a pixel of the display panel.

Figure 20A:
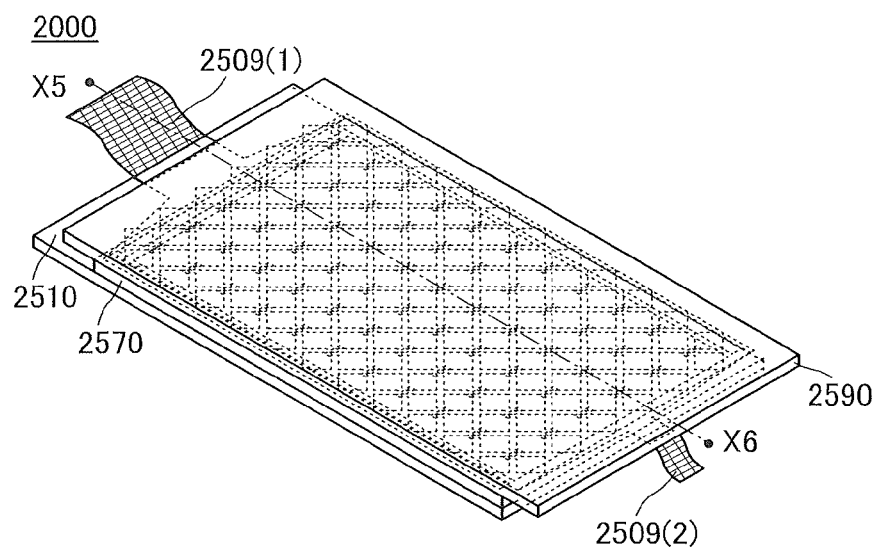
FIGS. 20A and 20B are perspective views of an example of a touch panel.
Figure 20B:
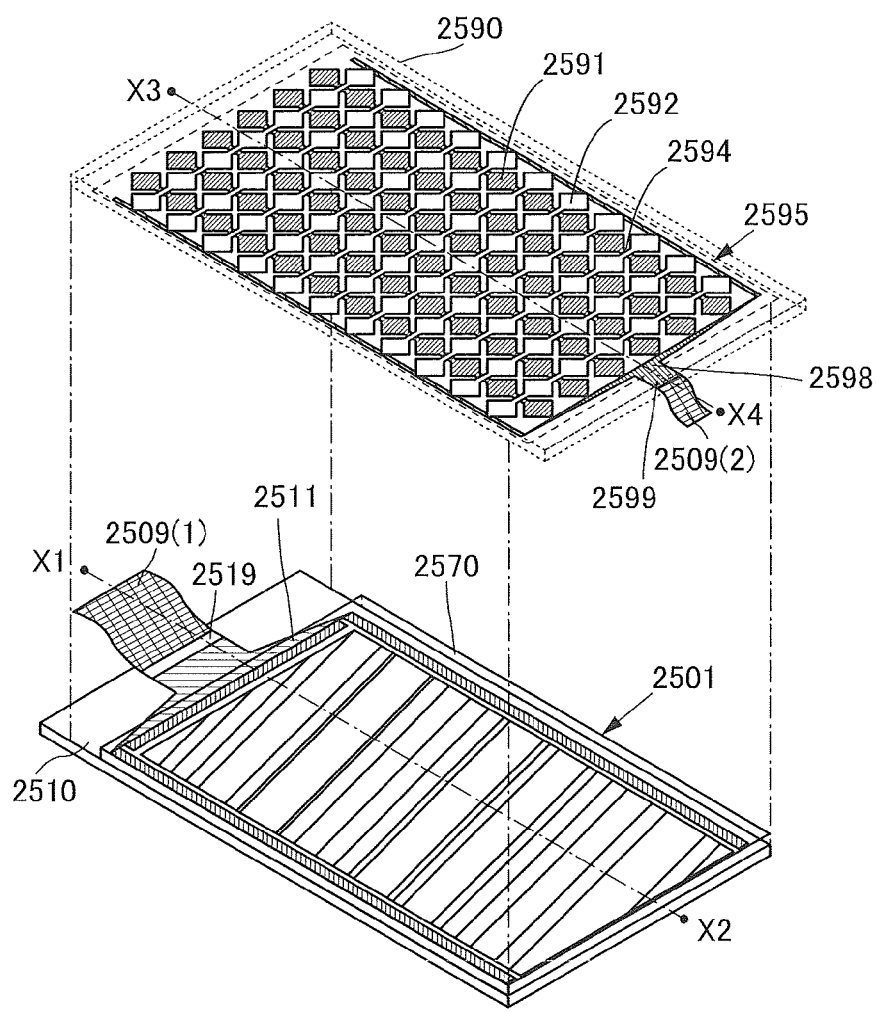

FIGS. 20A and 20B are perspective views of the touch panel 2000. Note that FIGS. 20A and 20B illustrate only main components of the touch panel 2000 for simplicity.

The touch panel 2000 includes a display panel 2501 and a touch sensor 2595 (see FIG. 20B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display panel 2501 includes a plurality of pixels over the substrate 2510 and a plurality of wirings 2511 through which signals are supplied to the pixels. The plurality of wirings 2511 are led to an outer portion of the substrate 2510, and part of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to an outer portion of the substrate 2590, and part of the plurality of wirings 2598 form a terminal. The terminal is electrically connected to an FPC 2509(2). Note that in FIG. 20B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor include a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 20B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 20A and 20B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Note that for example, a transparent conductive film including indium oxide, tin oxide, zinc oxide, or the like (e.g., a film of ITO) can be given as a material of conductive films used for the electrode 2591, the electrode 2592, and the wiring 2598, i.e., wirings and electrodes in the touch panel. Moreover, for example, a low-resistance material is preferably used as the material of the wiring and the electrode in the touch panel. For example, silver, copper, aluminum, a carbon nanotube, graphene, a metal halide (such as a silver halide), or the like may be used. Alternatively, a metal nanowire including a plurality of conductors with an extremely small width (e.g., a diameter of several nanometers) may be used. Further alternatively, a net-like metal mesh with a conductor may be used. Examples of such materials include an Ag nanowire, a Cu nanowire, an Al nanowire, an Ag mesh, a Cu mesh, and an Al mesh. For example, in the case of using an Ag nanowire for the wiring and the electrode in the touch panel, a visible light transmittance of 89% or more and a sheet resistance of 40 Ω/sq. or more and 100 Ω/sq. or less can be achieved. A metal nanowire, a metal mesh, a carbon nanotube, graphene, and the like, which are examples of a material that can be used for the above-described wiring and electrode in the touch panel, have a high visible light transmittance; therefore, they may be used for an electrode of a display element (e.g., a pixel electrode or a common electrode).

<Display Panel>

Figure 21A:
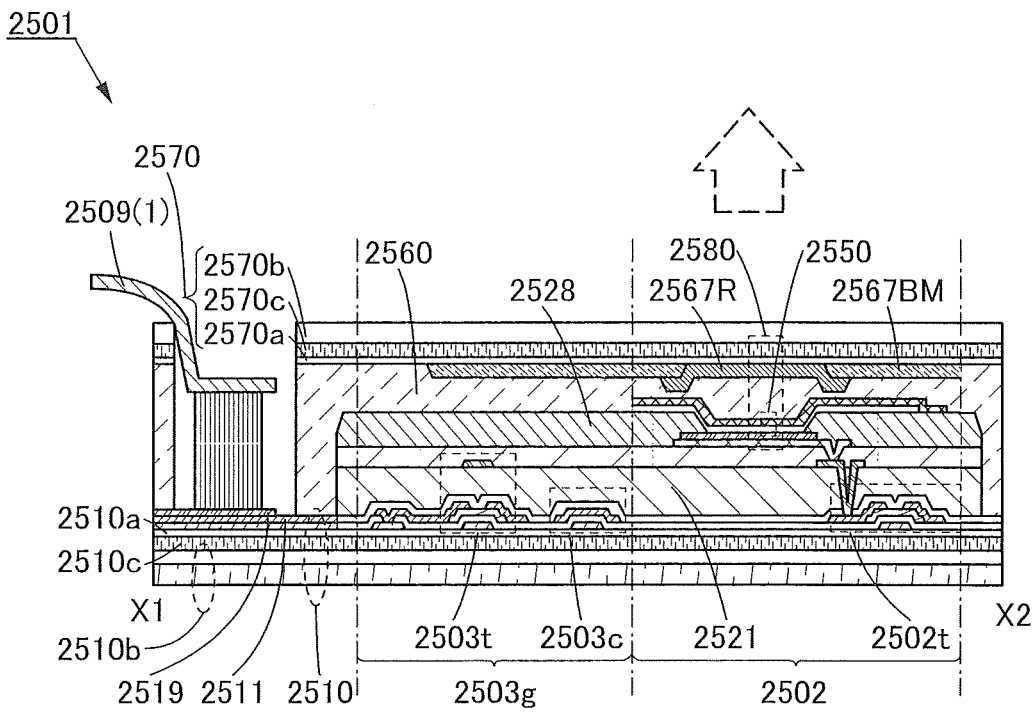
FIGS. 21A to 21C are cross-sectional views of examples of a display panel and a touch sensor.

Next, the display panel 2501 is described in detail with reference to FIG. 21A. FIG. 21A is a cross-sectional view along dashed-dotted line X1-X2 in FIG. 20B.

The display panel 2501 includes a plurality of pixels arranged in a matrix. Each of the pixels includes a display element and a pixel circuit for driving the display element.

For the substrate 2510 and the substrate 2570, for example, a flexible material with a vapor permeability lower than or equal to $10^{-5}$ g/(m²·day), preferably lower than or equal to $1 \times 10^{-6}$ g/(m²·day) can be preferably used. Alternatively, materials whose thermal expansion coefficients are substantially equal to each other are preferably used for the substrate 2510 and the substrate 2570. For example, the coefficients of linear expansion of the materials are preferably lower than or equal to $1 \times 10^{-3}$/K, further preferably lower than or equal to $5 \times 10^{-5}$/K and still further preferably lower than or equal to $1 \times 10^{-5}$/K.

Note that the substrate 2510 is a stacked body including an insulating layer 2510a for preventing impurity diffusion into the light-emitting element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the light-emitting element, a flexible substrate 2570b, and an adhesive layer 2570c for attaching the insulating layer 2570a and the flexible substrate 2570b to each other.

For the adhesive layer 2510c and the adhesive layer 2570c, for example, materials that include polyester, polyolefin, polyamide (e.g., nylon or aramid), polyimide, polycarbonate, polyurethane, an acrylic resin, an epoxy resin, or a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 21A, the sealing layer 2560 can also serve as an optical element.

A sealant may be formed in the outer portion of the sealing layer 2560. With the use of the sealant, a light-emitting element 2550 can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. For example, an epoxy-based resin or a glass frit is preferably used as the sealant. As a material used for the sealant, a material which is impermeable to moisture or oxygen is preferably used.

The display panel 2501 includes a pixel 2502. The pixel 2502 includes a light-emitting module 2580.

The pixel 2502 includes the light-emitting element 2550 and a transistor 2502t that can supply electric power to the light-emitting element 2550. Note that the transistor 2502t functions as part of the pixel circuit. The light-emitting module 2580 includes the light-emitting element 2550 and a coloring layer 2567R.

The light-emitting element 2550 includes a lower electrode, an upper electrode, and an EL layer between the lower electrode and the upper electrode. As the light-emitting element 2550, any of the light-emitting elements described in Embodiment 1 can be used, for example.

In the case where the sealing layer 2560 is provided on the light extraction side, the sealing layer 2560 is in contact with the light-emitting element 2550 and the coloring layer 2567R.

The coloring layer 2567R is provided to overlap with the light-emitting element 2550. Accordingly, part of light emitted from the light-emitting element 2550 passes through the coloring layer 2567R and is emitted to the outside of the light-emitting module 2580 as indicated by an arrow in FIG. 21A.

The display panel 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength range. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an ink jet method, an etching method using a photolithography technique, or the like.

An insulating layer 2521 is provided in the display panel 2501. The insulating layer 2521 covers the transistor 2502t. Note that the insulating layer 2521 has a function of planarizing unevenness caused by the pixel circuit. The insulating layer 2521 may have a function of suppressing impurity diffusion. This can prevent the reliability of the transistor 2502t or the like from being lowered by impurity diffusion.

The light-emitting element 2550 is formed over the insulating layer 2521. A partition wall 2528 is provided so as to overlap with an end portion of the lower electrode of the light-emitting element 2550. Note that a spacer for controlling the distance between the substrate 2510 and the substrate 2570 may be formed over the partition wall 2528.

A scan line driver circuit 2503g includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wiring 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Figure 21B:
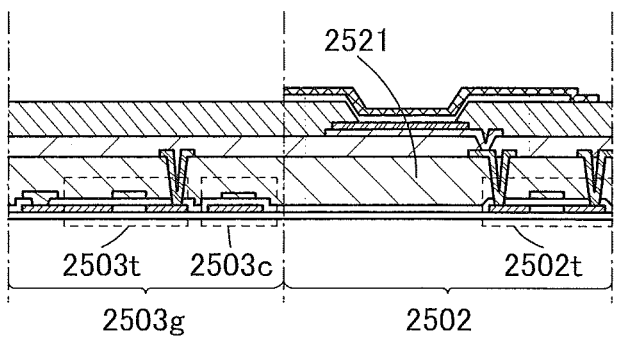

In the display panel 2501, transistors with any of a variety of structures can be used. FIG. 21A illustrates an example of using bottom-gate transistors; however, the present invention is not limited to this example, and top-gate transistors may be used in the display panel 2501 as illustrated in FIG. 21B.

In addition, there is no particular limitation on the polarity of the transistor 2502t and the transistor 2503t. For these transistors, n-channel and p-channel transistors may be used, or either n-channel transistors or p-channel transistors may be used, for example. Furthermore, there is no particular limitation on the crystallinity of a semiconductor film used for the transistors 2502t and 2503t. For example, an amorphous semiconductor film or a crystalline semiconductor film may be used. Examples of semiconductor materials include Group 13 semiconductors (e.g., a semiconductor including gallium), Group 14 semiconductors (e.g., a semiconductor including silicon), compound semiconductors (including oxide semiconductors), organic semiconductors, and the like. It is preferable to use an oxide semiconductor that has an energy gap of 2 eV or more, preferably 2.5 eV or more and further preferably 3 eV or more, for one of the transistors 2502t and 2503t or both, in which case the off-state current of the transistors can be reduced. Examples of the oxide semiconductors include an In—Ga oxide, an In-M-Zn oxide (M represents Al, Ga, Y, Zr, La, Ce, Sn, or Nd), and the like.

<Touch Sensor>

Figure 21C:
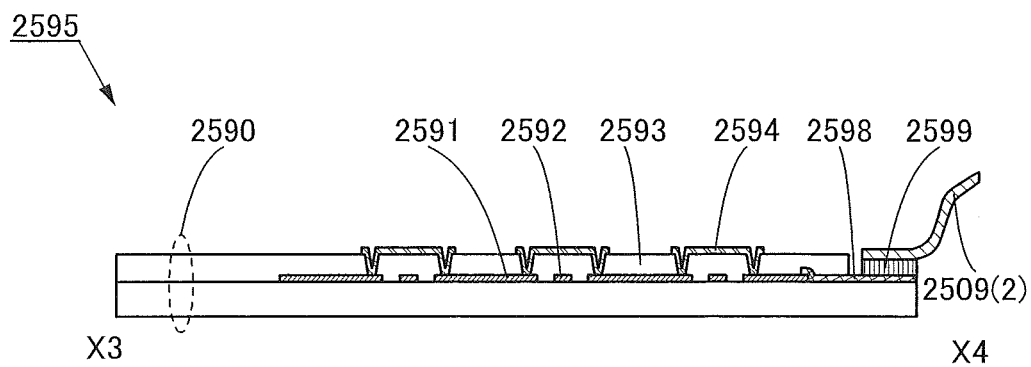

Next, the touch sensor 2595 is described in detail with reference to FIG. 21C. FIG. 21C is a cross-sectional view along dashed-dotted line X3-X4 in FIG. 20B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be preferably used as the wiring 2594 because the aperture ratio of the touch panel can be increased. Moreover, a material with higher conductivity than the conductivities of the electrodes 2591 and 2592 can be preferably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Description 2 of Touch Panel>

Figure 22A:
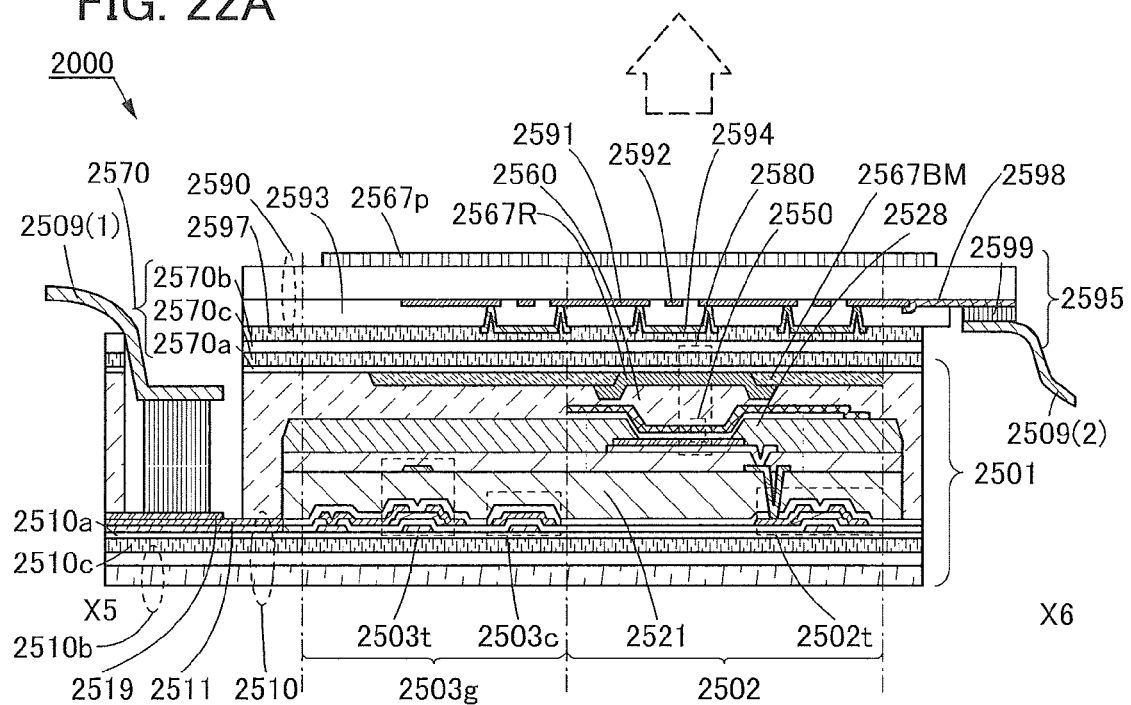
FIGS. 22A and 22B are each a cross-sectional view of an example of a touch panel.

Next, the touch panel 2000 is described in detail with reference to FIG. 22A. FIG. 22A is a cross-sectional view along dashed-dotted line X5-X6 in FIG. 20A.

In the touch panel 2000 illustrated in FIG. 22A, the display panel 2501 described with reference to FIG. 21A and the touch sensor 2595 described with reference to FIG. 21C are attached to each other.

The touch panel 2000 illustrated in FIG. 22A includes an adhesive layer 2597 and an anti-reflective layer 2567p in addition to the components described with reference to FIGS. 21A and 21C.

The adhesive layer 2597 is provided in contact with the wiring 2594. Note that the adhesive layer 2597 attaches the substrate 2590 to the substrate 2570 so that the touch sensor 2595 overlaps with the display panel 2501. The adhesive layer 2597 preferably has a light-transmitting property. A heat curable resin or an ultraviolet curable resin can be used for the adhesive layer 2597. For example, an acrylic resin, an urethane-based resin, an epoxy-based resin, or a siloxane-based resin can be used.

The anti-reflective layer 2567p is provided to overlap with pixels. As the anti-reflective layer 2567p, a circularly polarizing plate can be used, for example.

Next, a touch panel having a structure different from that illustrated in FIG. 22A is described with reference to FIG. 22B.

Figure 22B:
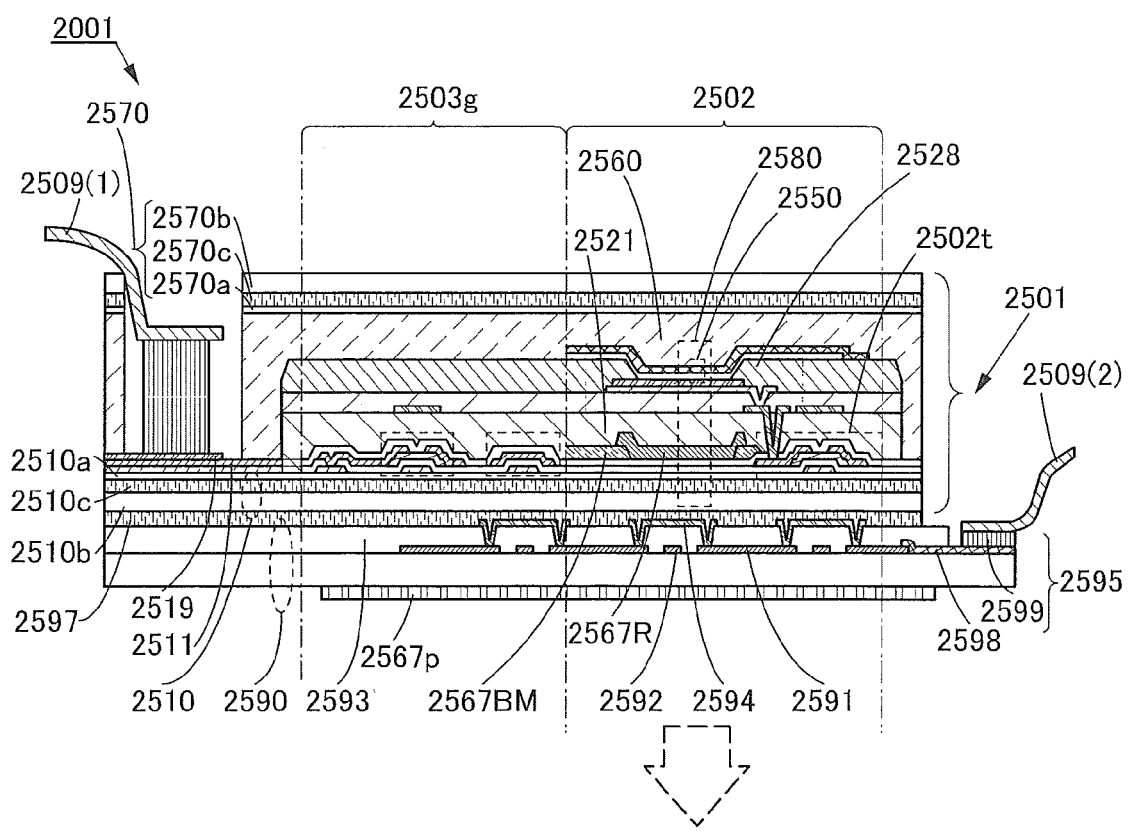

FIG. 22B is a cross-sectional view of a touch panel 2001. The touch panel 2001 illustrated in FIG. 22B differs from the touch panel 2000 illustrated in FIG. 22A in the position of the touch sensor 2595 relative to the display panel 2501. Different parts are described in detail below, and the above description of the touch panel 2000 is referred to for the other similar parts.

The coloring layer 2567R is provided to overlap with the light-emitting element 2550. The light-emitting element 2550 illustrated in FIG. 22B emits light to the side where the transistor 2502t is provided. Accordingly, part of light emitted from the light-emitting element 2550 passes through the coloring layer 2567R and is emitted to the outside of the light-emitting module 2580 as indicated by an arrow in FIG. 22B.

The touch sensor 2595 is provided on the substrate 2510 side of the display panel 2501.

The adhesive layer 2597 is provided between the substrate 2510 and the substrate 2590 and attaches the touch sensor 2595 to the display panel 2501.

As illustrated in FIG. 22A or 22B, light may be emitted from the light-emitting element to one of upper and lower sides, or both, of the substrate.

<Method for Driving Touch Panel>

Next, an example of a method for driving a touch panel is described with reference to FIGS. 23A and 23B.

Figure 23A:
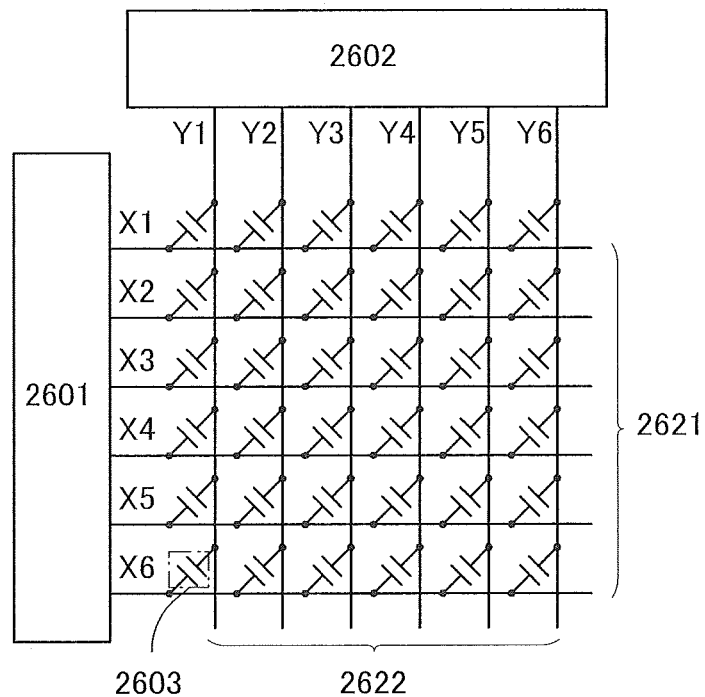
FIGS. 23A and 23B are a block diagram and a timing chart of a touch sensor.

FIG. 23A is a block diagram illustrating the structure of a mutual capacitive touch sensor. FIG. 23A illustrates a pulse voltage output circuit 2601 and a current sensing circuit 2602. Note that in FIG. 23A, six wirings X1 to X6 represent the electrodes 2621 to which a pulse voltage is applied, and six wirings Y1 to Y6 represent the electrodes 2622 that detect changes in current. FIG. 23A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for detection of current values.

Figure 23B:
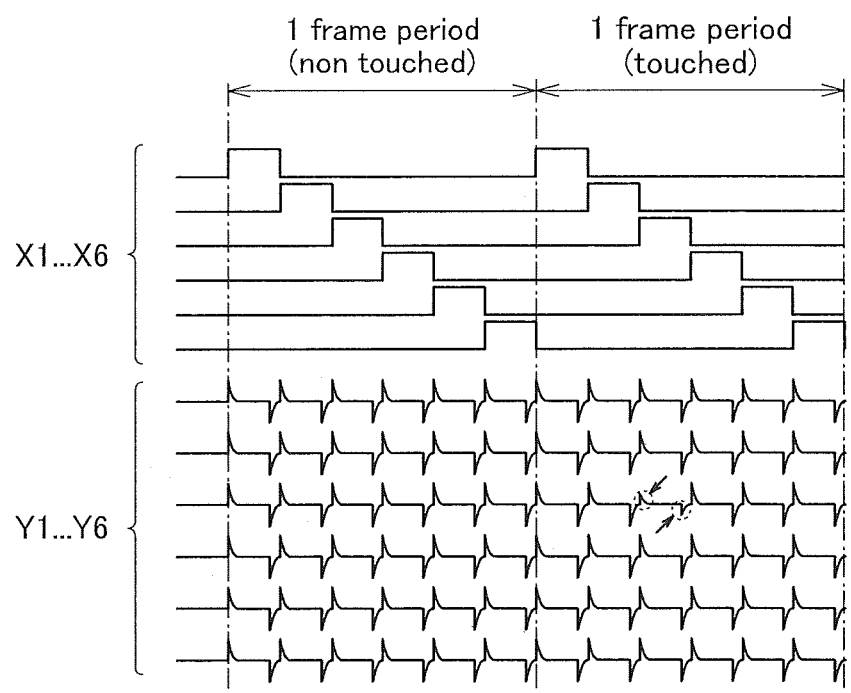

FIG. 23B is a timing chart showing input and output waveforms in the mutual capacitive touch sensor illustrated in FIG. 23A. In FIG. 23B, sensing of a sensing target is performed in all the rows and columns in one frame period. FIG. 23B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage level changes.

By detecting a change in mutual capacitance in this manner, proximity or contact of a sensing target can be sensed.

<Sensor Circuit>

Figure 24:
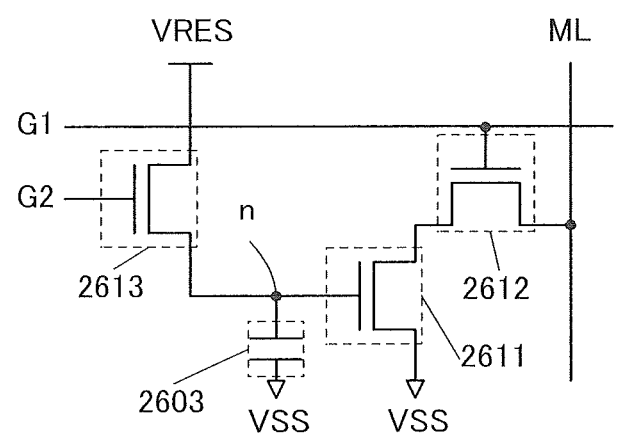
FIG. 24 is a circuit diagram of a touch sensor.

Although FIG. 23A illustrates a passive type touch sensor in which only the capacitor 2603 is provided at the intersection of wirings as a touch sensor, an active type touch sensor including a transistor and a capacitor may be used. FIG. 24 illustrates an example of a sensor circuit included in an active type touch sensor.

The sensor circuit in FIG. 24 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 24 is described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

The structure described in this embodiment can be combined with any of the structures described in the other embodiments and examples as appropriate.

Embodiment 5

In this embodiment, a display module and electronic devices including a light-emitting device of one embodiment of the present invention will be described with reference to FIG. 25 and FIGS. 26A to 26G.

Figure 25:
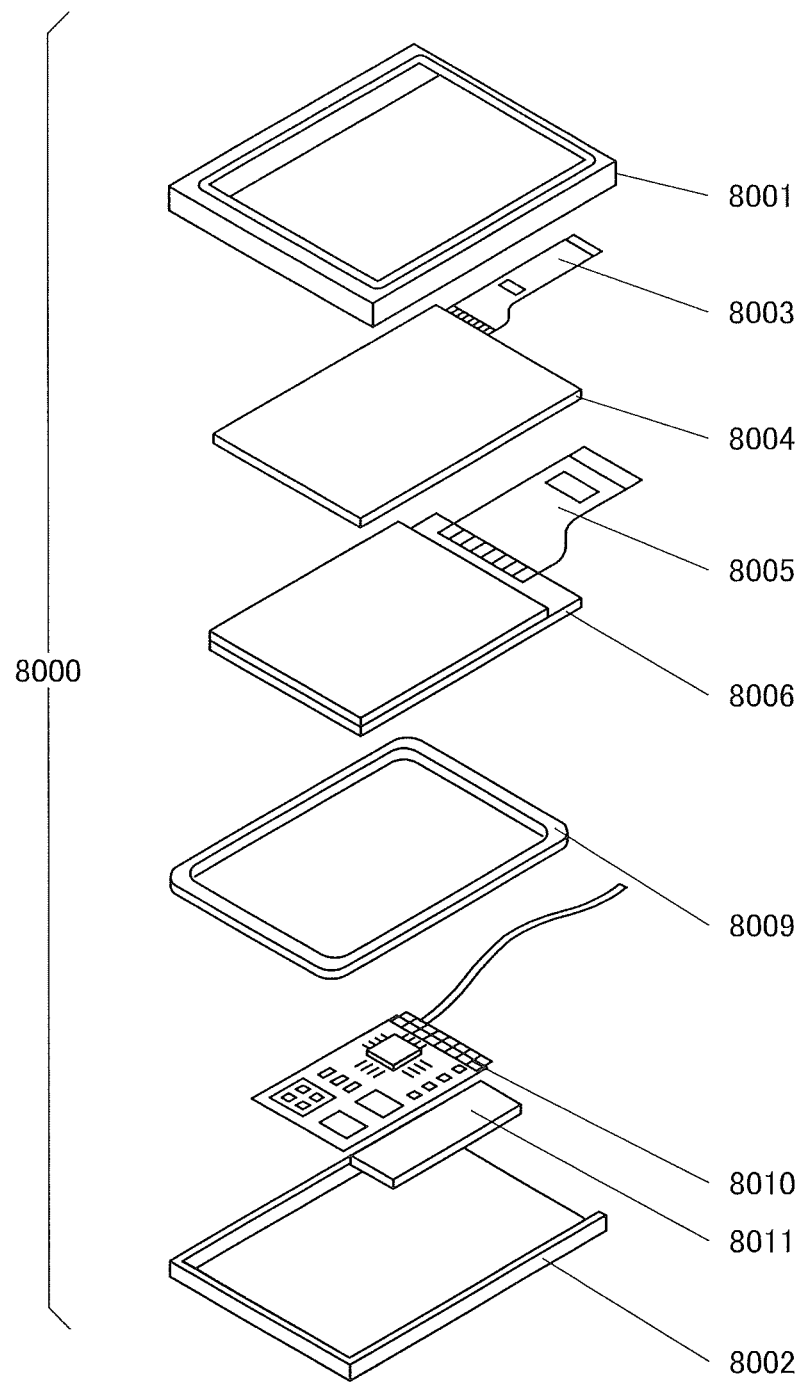
FIG. 25 is a perspective view of a display module.

In a display module 8000 illustrated in FIG. 25, a touch sensor 8004 connected to an FPC 8003, a display panel 8006 connected to an FPC 8005, a frame 8009, a printed board 8010, and a battery 8011 are provided between an upper cover 8001 and a lower cover 8002.

The light-emitting device of one embodiment of the present invention can be used for the display panel 8006, for example.

The shapes and sizes of the upper cover 8001 and the lower cover 8002 can be changed as appropriate in accordance with the sizes of the touch sensor 8004 and the display panel 8006.

The touch sensor 8004 can be a resistive touch sensor or a capacitive touch sensor and may be formed to overlap with the display panel 8006. A counter substrate (sealing substrate) of the display panel 8006 can have a touch sensor function. A photosensor may be provided in each pixel of the display panel 8006 so that an optical touch sensor is obtained.

The frame 8009 protects the display panel 8006 and also serves as an electromagnetic shield for blocking electromagnetic waves generated by the operation of the printed board 8010. The frame 8009 may serve as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

FIGS. 26A to 26G illustrate electronic devices. These electronic devices can include a housing 9000, a display portion 9001, a speaker 9003, operation keys 9005, a connection terminal 9006, a sensor 9007, a microphone 9008, and the like.

The electronic devices illustrated in FIGS. 26A to 26G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 26A to 26G are not limited to those described above, and the electronic devices can have a variety of functions. Although not illustrated in FIGS. 26A to 26G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 26A to 26G are described in detail below.

Figure 26A:
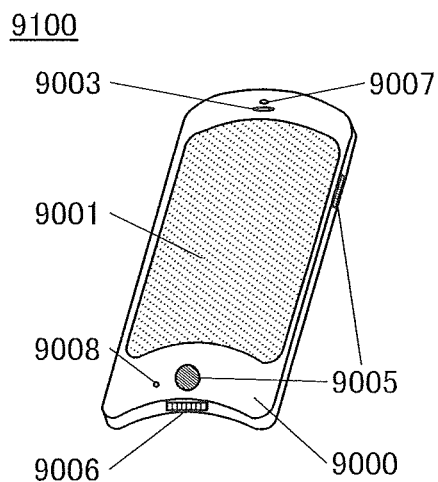
FIGS. 26A to 26G illustrate electronic devices.

FIG. 26A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 26B:
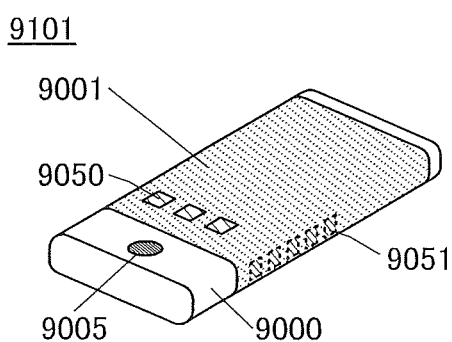

FIG. 26B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not shown in FIG. 26B, can be positioned in the portable information terminal 9101 as in the portable information terminal 9100 shown in FIG. 26A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 26C:
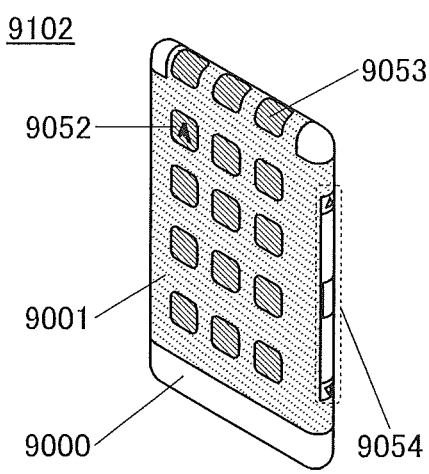

FIG. 26C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

Figure 26D:
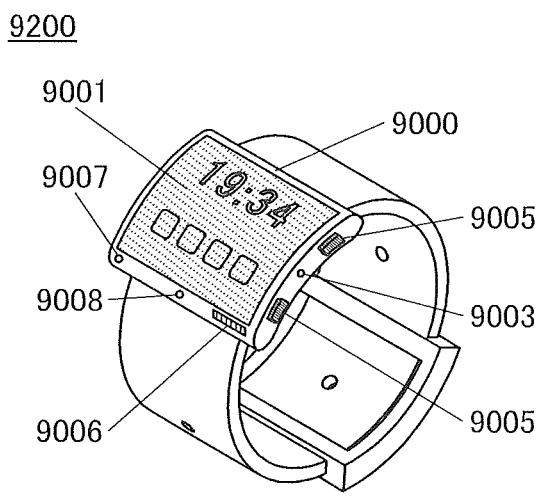

FIG. 26D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ short-distance wireless communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 26E:
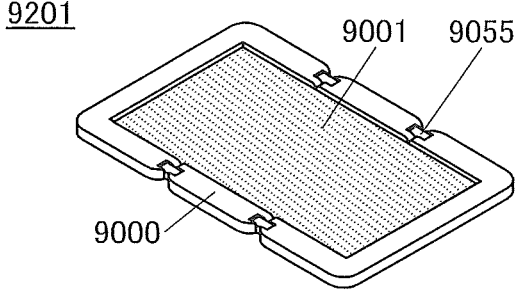
Figure 26F:
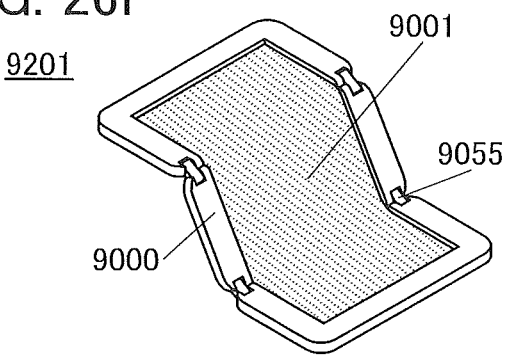
Figure 26G:
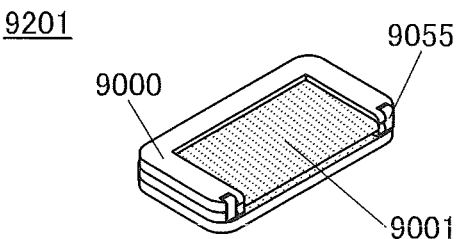

FIGS. 26E, 26F, and 26G are perspective views of a foldable portable information terminal 9201. FIG. 26E is a perspective view illustrating the portable information terminal 9201 that is opened. FIG. 26F is a perspective view illustrating the portable information terminal 9201 that is being opened or being folded. FIG. 26G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic devices described in this embodiment each include the display portion for displaying some sort of data. Note that the light-emitting device of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is inflexible and display is performed on a plane portion may be employed.

The structure described in this embodiment can be combined with any of the structures described in the other embodiments and examples as appropriate.

Embodiment 6

In this embodiment, the light-emitting device of one embodiment of the present invention will be described with reference to FIGS. 27A to 27C.

Figure 27A:
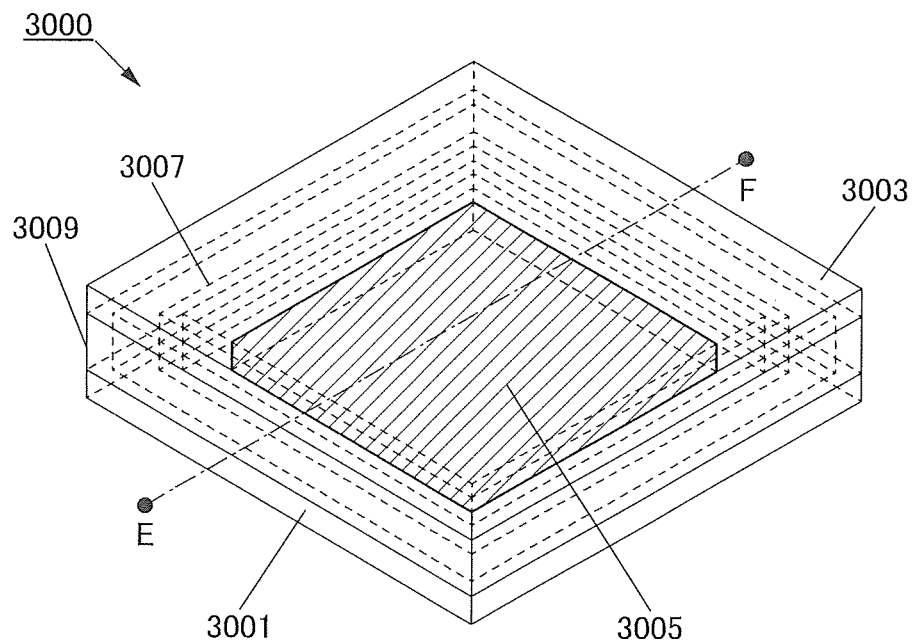
FIGS. 27A to 27C are a perspective view and cross-sectional views illustrating a light-emitting device.
Figure 27B:
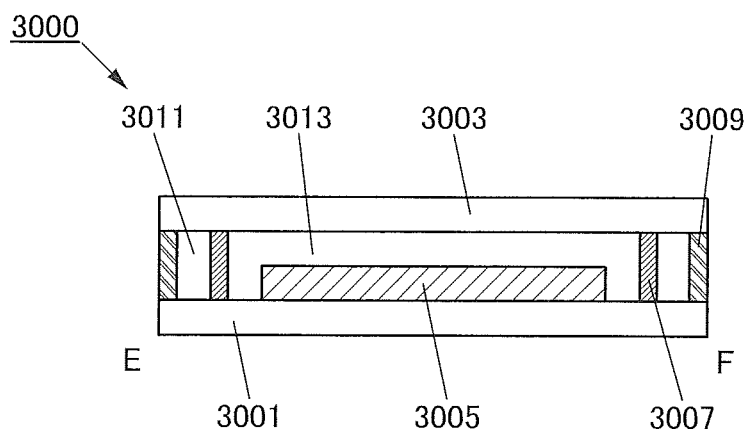

FIG. 27A is a perspective view of a light-emitting device 3000 shown in this embodiment, and FIG. 27B is a cross-sectional view along dashed-dotted line E-F in FIG. 27A. Note that in FIG. 27A, some components are illustrated by broken lines in order to avoid complexity of the drawing.

The light-emitting device 3000 illustrated in FIGS. 27A and 27B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 27A and 27B, a structure in which light is emitted from the light-emitting element 3005 to the lower side (the substrate 3001 side) is illustrated.

As illustrated in FIGS. 27A and 27B, the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 can be preferably suppressed. Note that it is not necessary to provide both the first sealing region 3007 and the second sealing region 3009. For example, only the first sealing region 3007 may be provided.

Note that in FIG. 27B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 102 and the substrate 152 described in Embodiment 1, respectively. The light-emitting element 3005 can have a structure similar to that of any of the first to third light-emitting elements described in Embodiment 1.

For the first sealing region 3007, a material containing glass (e.g., a glass frit, a glass ribbon, and the like) can be used. For the second sealing region 3009, a material containing a resin can be used. With the use of the material containing glass for the first sealing region 3007, productivity and a sealing property can be improved. Moreover, with the use of the material containing a resin for the second sealing region 3009, impact resistance and heat resistance can be improved. However, the materials used for the first sealing region 3007 and the second sealing region 3009 are not limited to such, and the first sealing region 3007 may be formed using the material containing a resin and the second sealing region 3009 may be formed using the material containing glass.

The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

As the above glass frits, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit.

For example, an Nd:YAG laser or a semiconductor laser is preferably used as the laser. The shape of laser light may be circular or quadrangular.

As the above material containing a resin, for example, materials that include polyester, polyolefin, polyamide (e.g., nylon or aramid), polyimide, polycarbonate, polyurethane, an acrylic resin, an epoxy resin, or a resin having a siloxane bond can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009.

The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second region 3009 is sealed using the material containing glass, whereby the light-emitting device 3000 is less likely to be damaged even when distortion due to external force or the like is generated.

Furthermore, as illustrated in FIG. 27B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with, for example, an inert gas such as a rare gas or a nitrogen gas. Note that for the first region 3011 and the second region 3013, a reduced pressure state is preferred to an atmospheric pressure state.

Figure 27C:
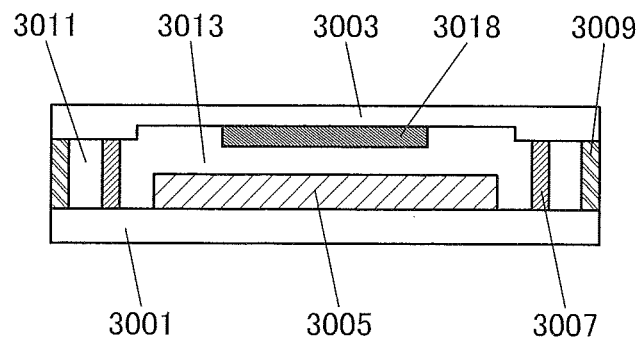

FIG. 27C illustrates a modification example of the structure in FIG. 27B. FIG. 27C is a cross-sectional view illustrating the modification example of the light-emitting device 3000.

FIG. 27C illustrates a structure in which a desiccant 3018 is provided in a recessed portion provided in part of the substrate 3003. The other components are the same as those of the structure illustrated in FIG. 27B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxide (e.g., calcium oxide, barium oxide, and the like), sulfate, metal halides, perchlorate, zeolite, silica gel, and the like.

Next, modification examples of the light-emitting device 3000 which is illustrated in FIG. 27B are described with reference to FIGS. 28A to 28D. Note that FIGS. 28A to 28D are cross-sectional views illustrating the modification examples of the light-emitting device 3000 illustrated in FIG. 27B.

Figure 28A:
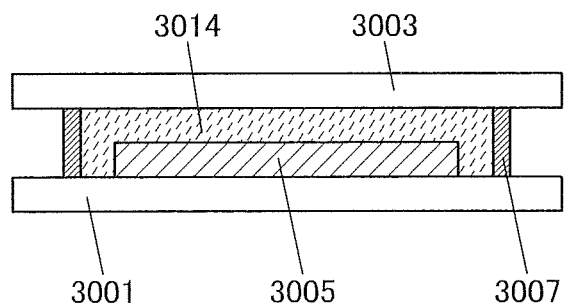
FIGS. 28A to 28D are cross-sectional views illustrating a light-emitting device.

In the light-emitting device illustrated in FIG. 28A, the second sealing region 3009 is not provided but only the first sealing region 3007 is provided. Moreover, in the light-emitting device illustrated in FIG. 28A, a region 3014 is provided instead of the second region 3013 illustrated in FIG. 27B.

For the region 3014, for example, materials that include polyester, polyolefin, polyamide (e.g., nylon or aramid), polyimide, polycarbonate, polyurethane, an acrylic resin, an epoxy resin, or a resin having a siloxane bond can be used.

When the above-described material is used for the region 3014, what is called a solid-sealing light-emitting device can be obtained.

Figure 28B:
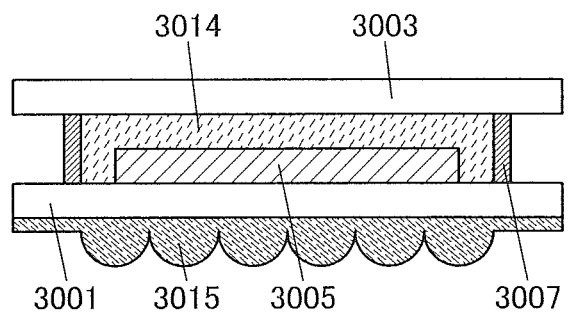

In the light-emitting device illustrated in FIG. 28B, a substrate 3015 is provided on the substrate 3001 side of the light-emitting device illustrated in FIG. 28A.

The substrate 3015 has unevenness as illustrated in FIG. 28B. With a structure in which the substrate 3015 having unevenness is provided on the side through which light emitted from the light-emitting element 3005 is extracted, the efficiency of extraction of light from the light-emitting element 3005 can be improved. Note that instead of the structure having unevenness and illustrated in FIG. 28B, a substrate having a function as a diffusion plate may be provided.

Figure 28C:
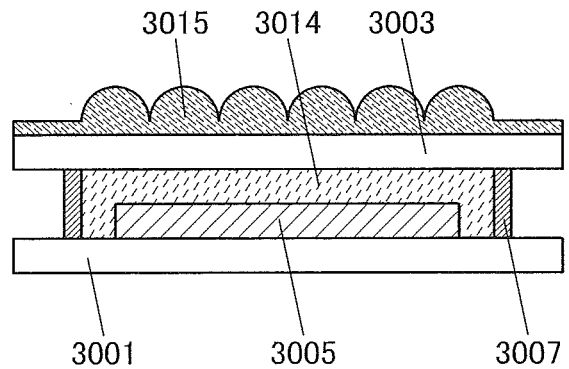

In the light-emitting device illustrated in FIG. 28C, light is extracted through the substrate 3003 side; unlike in the light-emitting device illustrated in FIG. 28A, in which light is extracted through the substrate 3001 side.

The light-emitting device illustrated in FIG. 28C includes the substrate 3015 on the substrate 3003 side. The other components are the same as those of the light-emitting device illustrated in FIG. 28B.

Figure 28D:
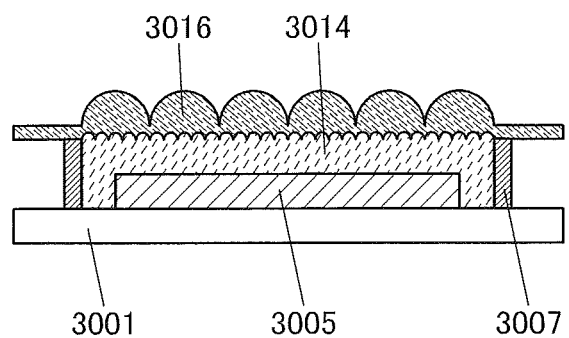

In the light-emitting device illustrated in FIG. 28D, the substrate 3003 and the substrate 3015 included in the light-emitting device illustrated in FIG. 28C are not provided but a substrate 3016 is provided.

The substrate 3016 includes first unevenness positioned closer to the light-emitting element 3005 and second unevenness positioned farther from the light-emitting element 3005. With the structure illustrated in FIG. 28D, the efficiency of extraction of light from the light-emitting element 3005 can be further improved.

Thus, the use of the structure described in this embodiment can obtain a light-emitting device in which deterioration of a light-emitting element due to impurities such as moisture and oxygen is suppressed. Alternatively, with the structure described in this embodiment, a light-emitting device having high light extraction efficiency can be obtained.

The structure described in this embodiment can be combined with any of the structures described in the other embodiments and examples as appropriate.

Embodiment 7

In this embodiment, examples in which the light-emitting device of one embodiment of the present invention is applied to various lighting devices and electronic devices will be described with reference to FIGS. 29A to 29C.

An electronic device or a lighting device that has a light-emitting region with a curved surface can be obtained with the use of the light-emitting device of one embodiment of the present invention which is manufactured over a substrate having flexibility.

Furthermore, a light-emitting device to which one embodiment of the present invention is applied can also be applied to lighting for motor vehicles, examples of which are lighting for a dashboard, a windshield, a ceiling, and the like.

Figure 29A:
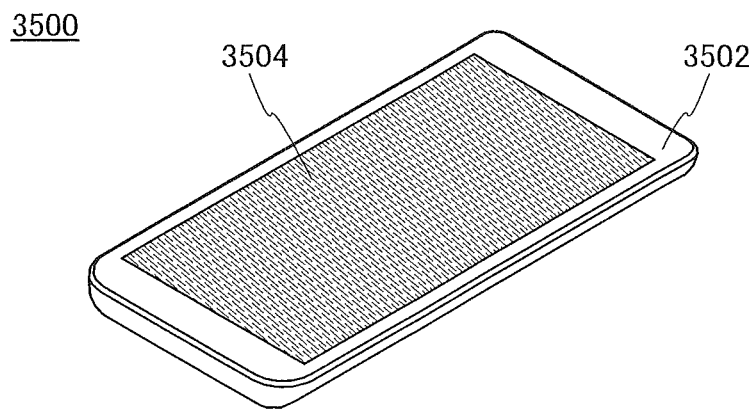
FIGS. 29A to 29C illustrate a lighting device and an electronic device.
Figure 29B:
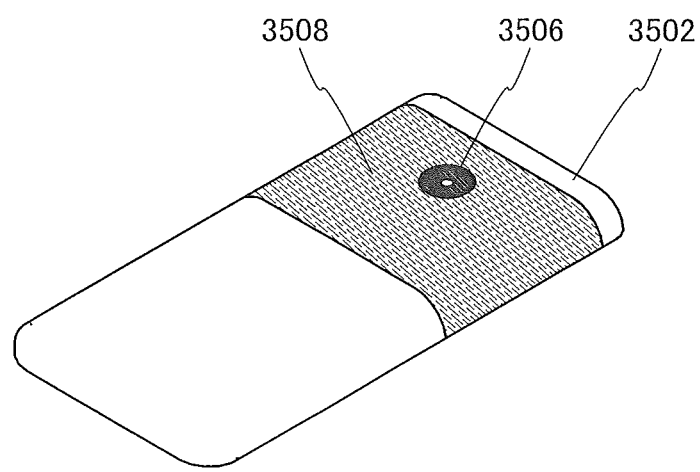

FIG. 29A is a perspective view illustrating one surface of a multifunction terminal 3500, and FIG. 29B is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 functions as a planar light source, a photograph as if taken under natural light can be taken.

Note that the multifunction terminal 3500 illustrated in FIGS. 29A and 29B can have a variety of functions as in the electronic devices illustrated in FIGS. 26A to 26G.

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. When a detection device including a sensor for detecting inclination, such as a gyroscope or an acceleration sensor, is provided inside the multifunction terminal 3500, display on the screen of the display portion 3504 can be automatically switched by determining the orientation of the multifunction terminal 3500 (whether the multifunction terminal is placed horizontally or vertically for a landscape mode or a portrait mode).

The display portion 3504 may function as an image sensor. For example, an image of a palm print, a fingerprint, or the like is taken when the display portion 3504 is touched with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3504.

Figure 29C:
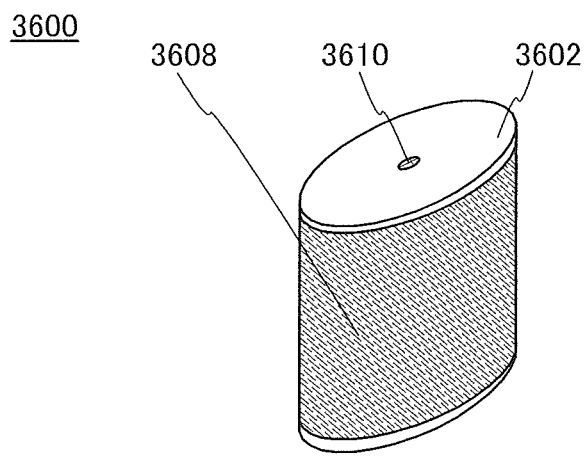

FIG. 29C is a perspective view of a security light 3600. The security light 3600 includes lighting 3608 on the outside of the housing 3602, and a speaker 3610 and the like are incorporated in the housing 3602. The light-emitting device of one embodiment of the present invention can be used for the lighting 3608.

The security light 3600 emits light when the lighting 3608 is gripped or held, for example. An electronic circuit that can control the manner of light emission from the security light 3600 may be provided in the housing 3602. The electronic circuit may be a circuit that enables light emission once or intermittently plural times or may be a circuit that can adjust the amount of emitted light by controlling the current value for light emission. A circuit with which a loud audible alarm is output from the speaker 3610 at the same time as light emission from the lighting 3608 may be incorporated.

The security light 3600 can emit light in various directions; therefore, it is possible to intimidate a thug or the like with light, or light and sound. Moreover, the security light 3600 may include a camera such as a digital still camera to have a photography function.

As described above, lighting devices and electronic devices can be obtained by application of the light-emitting device of one embodiment of the present invention. Note that the light-emitting device can be used for lighting devices and electronic devices in a variety of fields without being limited to the lighting devices and the electronic devices described in this embodiment.

The structure described in this embodiment can be combined with any of the structures described in the other embodiments and examples as appropriate.

Example 1

Figure 30:
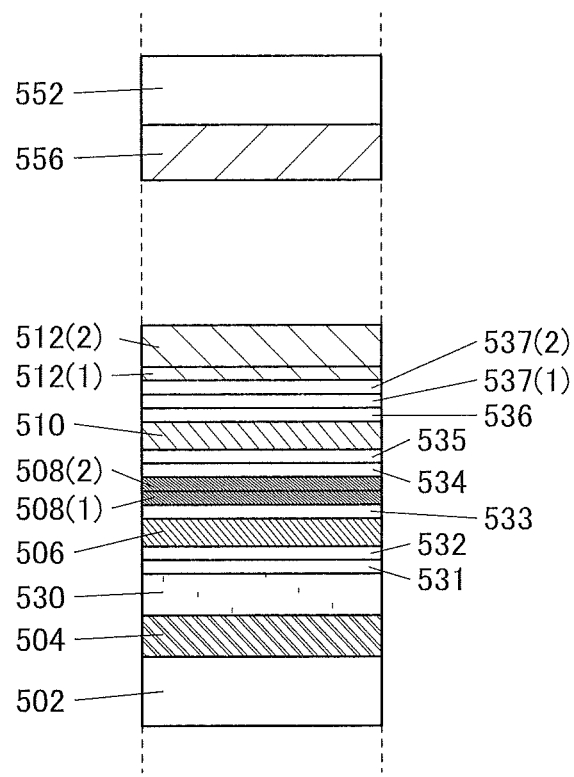
FIG. 30 is a cross-sectional view illustrating a light-emitting element in each example.

In Example 1, an example of fabricating a light-emitting element of one embodiment of the present invention will be described. A schematic cross-sectional view of the light-emitting elements (a light-emitting element 1, a light-emitting element 2, a light-emitting element 3, and a light-emitting element 4) fabricated in Example 1 is shown in FIG. 30, the detailed structures of the light-emitting elements are shown in Table 1 and Table 2, and structures and abbreviations of the compounds used here are given below.

[Chemical Formula 1]

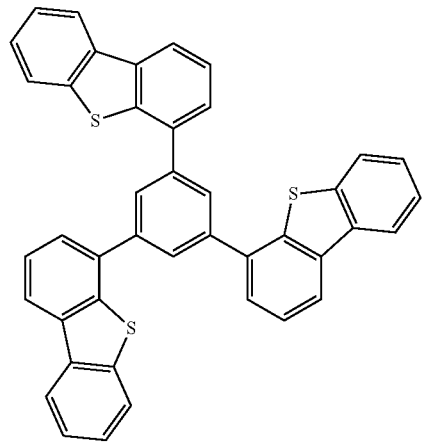

DBT3P-II

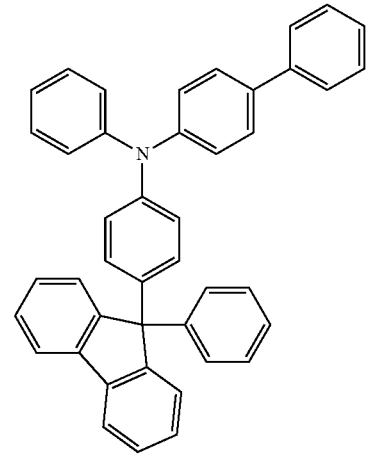

BPAFLP

-continued
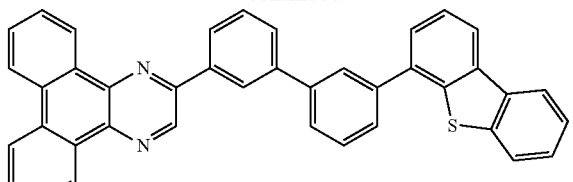
2mDBTBPDBq-II
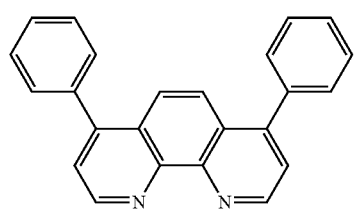
Bphen
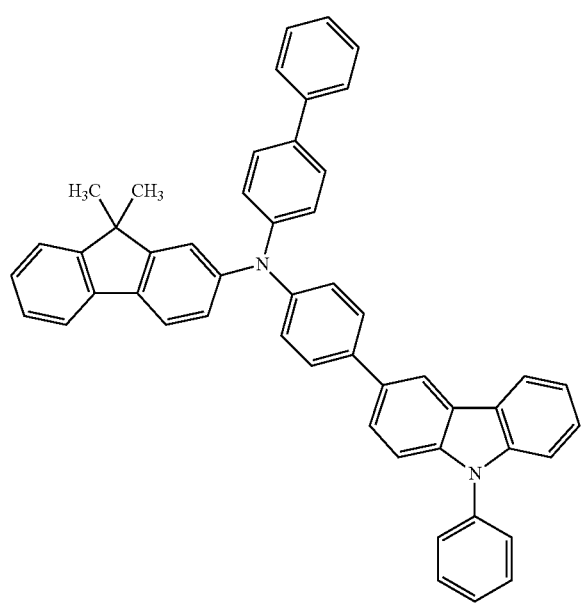
PCBBiF
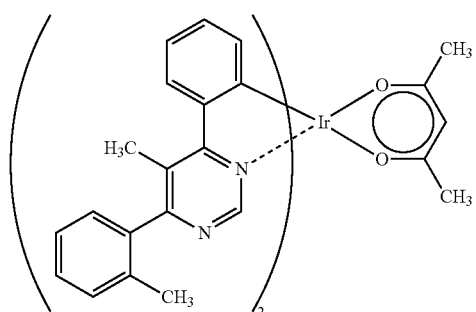
Ir(mpmppm)₂(acac)
-continued
[Chemical Formula 2]
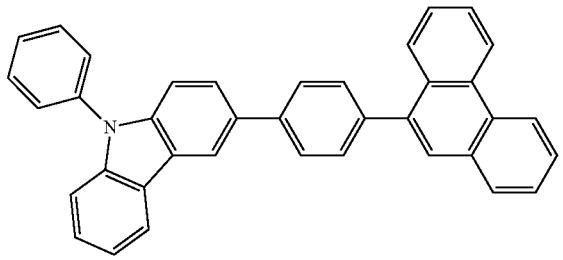
PcPPn
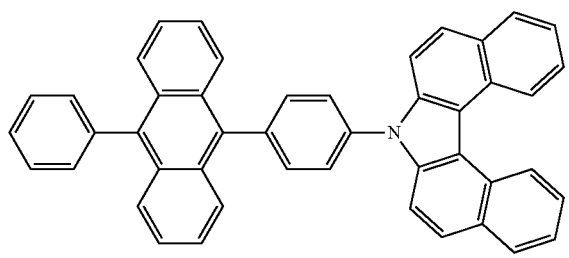
cgDBCzPA
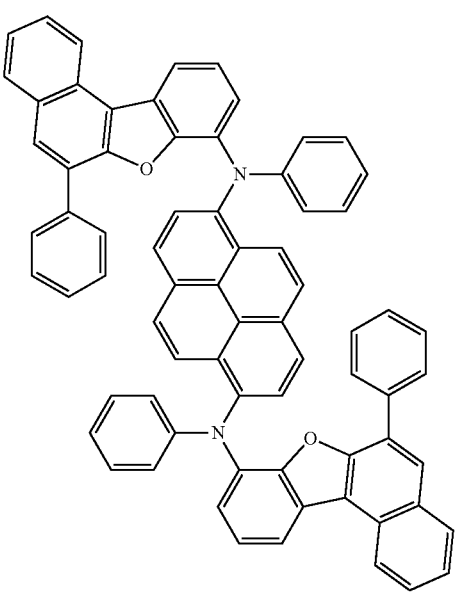
1,6BnfAPrn-03
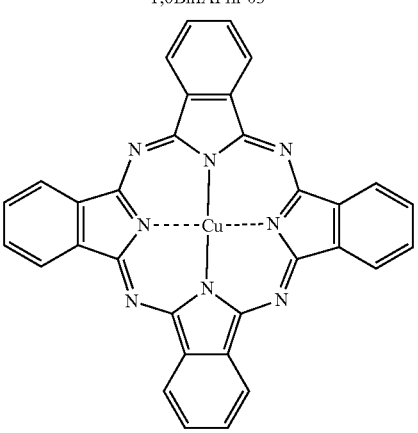
CuPc

TABLE 1

|  | Layer | Reference numeral | Thickness (nm) | Material | Weight ratio |
|---|---|---|---|---|---|
| Light-emitting element 1 | Optical element | 556 | — | CF (Red) | — |
|  | Upper electrode | 512(2) | 70 | ITO | — |
|  |  | 512(1) | 15 | Ag:Mg | 0.5:0.05*[1] |
|  | Electron-injection layer | 537(2) | 1 | LiF | — |
|  |  | 537(1) | 10 | Bphen | — |
|  | Electron-transpsort layer | 536 | 5 | cgDBCzPA | — |
|  | Second light-emitting layer | 510 | 25 | cgDBCzPA:1,6BnfAprn-03 | 1:0.03 |
|  | Hole-transport layer | 535 | 5 | PCPPn | — |
|  | Hole-injection layer | 534 | 5 | PCPPn:MoO$_3$ | 2:1 |
|  | Charge-generation layer | 508(2) | 2 | CuPc | — |
|  |  | 508(1) | 0.1 | Li$_2$O | — |
|  | Electron-transpsort layer | 533 | 10 | Bphen | — |
|  | First light-emitting layer | 506 | 30 | 2mDBTBPDBq-II:PCBBiF:Ir(mpmppm)$_2$(acac) | 0.8:0.2:0.06 |
|  | Hole-transport layer | 532 | 10 | BPAFLP | — |
|  | Hole-injection layer | 531 | 15 | DBT3P-II:MoO$_3$ | 2:1 |
|  | Transparent conductive layer | 530 | 150 | ITSO | — |
|  | Lower electrode | 504 | 100 | APC | — |
| Light-emitting element 2 | Optical element | 556 | — | CF(Green) | — |
|  | Upper electrode | 512(2) | 70 | ITO | — |
|  |  | 512(1) | 15 | Ag:Mg | 0.5:0.05*[1] |
|  | Electron-injection layer | 537(2) | 1 | LiF | — |
|  |  | 537(1) | 10 | Bphen | — |
|  | Electron-transpsort layer | 536 | 5 | cgDBCzPA | — |
|  | Second light-emitting layer | 510 | 25 | cgDBCzPA:1,6BnfAprn-03 | 1:0.03 |
|  | Hole-transport layer | 535 | 5 | PCPPn | — |
|  | Hole-injection layer | 534 | 5 | PCPPn:MoO$_3$ | 2:1 |
|  | Charge-generation layer | 508(2) | 2 | CuPc | — |
|  |  | 508(1) | 0.1 | Li$_2$O | — |
|  | Electron-transpsort layer | 533 | 10 | Bphen | — |
|  | First light-emitting layer | 506 | 30 | 2mDBTBPDBq-II:PCBBiF:Ir(mpmppm)$_2$(acac) | 0.8:0.2:0.06 |
|  | Hole-transport layer | 532 | 10 | BPAFLP | — |
|  | Hole-injection layer | 531 | 20 | DBT3P-II:MoO$_3$ | 2:1 |
|  | Transparent conductive layer | 530 | 110 | ITSO | — |
|  | Lower electrode | 504 | 100 | APC | — |

*[1] volume ratio

TABLE 2

|  | Layer | Reference numeral | Thickness (nm) | Material | Weight ratio |
|---|---|---|---|---|---|
| Light-emitting element 3 | Optical element | 556 | — | CF (Blue) | — |
|  | Upper electrode | 512(2) | 70 | ITO | — |
|  |  | 512(1) | 15 | Ag:Mg | 0.5:0.05*[1] |
|  | Electron-injection layer | 537(2) | 1 | LiF | — |
|  |  | 537(1) | 10 | Bphen | — |
|  | Electron-transport layer | 536 | 5 | cgDBCzPA | — |
|  | Second light-emitting layer | 510 | 25 | cgDBCzPA:1,6BnfAprn-03 | 1:0.03 |
|  | Hole-transport layer | 535 | 10 | PCPPn | — |
|  | Hole-injection layer | 534 | 5 | PCPPn:MoO$_3$ | 2:1 |
|  | Charge-generation layer | 508(2) | 2 | CuPc | — |
|  |  | 508(1) | 0.1 | Li$_2$O | — |
|  | Electron-transport layer | 533 | 10 | Bphen | — |

TABLE 2-continued

| | Layer | Reference numeral | Thickness (nm) | Material | Weight ratio |
|---|---|---|---|---|---|
| | First light-emitting layer | 506 | 30 | 2mDBTBPDBq-II:PCBBiF:Ir(mpmppm)$_2$(acac) | 0.8:0.2:0.06 |
| | Hole-transport layer | 532 | 10 | BPAFLP | — |
| | Hole-injection layer | 531 | 50 | DBT3P-II:MoO$_3$ | 2:1 |
| | Transparent conductive layer | 530 | 30 | ITSO | — |
| | Lower electrode | 504 | 100 | APC | — |
| Light-emitting element 4 | Optical element | 556 | — | CF (Yellow) | — |
| | Upper electrode | 512(2) | 70 | ITO | — |
| | | 512(1) | 15 | Ag:Mg | 0.5:0.05*[1] |
| | Electron-injection layer | 537(2) | 1 | LiF | — |
| | | 537(1) | 10 | Bphen | — |
| | Electron-transport layer | 536 | 5 | cgDBCzPA | — |
| | Second light-emitting layer | 510 | 25 | cgDBCzPA:1,6BnfAprn-03 | 1:0.03 |
| | Hole-transport layer | 535 | 5 | PCPPn | — |
| | Hole-injection layer | 534 | 5 | PCPPn:MoO$_3$ | 2:1 |
| | Charge-generation layer | 508(2) | 2 | CuPc | — |
| | | 508(1) | 0.1 | Li$_2$O | — |
| | Electron-transport layer | 533 | 10 | Bphen | — |
| | First light-emitting layer | 506 | 30 | 2mDBTBPDBq-II:PCBBiF:Ir(mpmppm)$_2$(acac) | 0.8:0.2:0.06 |
| | Hole-transport layer | 532 | 10 | BPAFLP | — |
| | Hole-injection layer | 531 | 35 | DBT3P-II:MoO$_3$ | 2:1 |
| | Transparent conductive layer | 530 | 110 | ITSO | — |
| | Lower electrode | 504 | 100 | APC | — |

*[1] volume ratio

<1-1. Fabrication Method of Light-Emitting Elements 1 to 4>

First, over a substrate 502, an alloy film of silver (Ag), palladium (Pd), and copper (Cu) (the alloy film is hereinafter referred to as APC) was formed as a lower electrode 504 by a sputtering method. Note that the thickness of the lower electrode 504 was 100 nm and the area of the lower electrode 504 was 4 mm$^2$ (2 mm×2 mm).

Then, over the lower electrode 504, indium tin oxide containing silicon oxide (the film is hereinafter referred to as ITSO) was deposited as a transparent conductive layer 530 by a sputtering method. Note that the thickness of the transparent conductive layer 530 was 150 nm in the light-emitting element 1, the thickness of the transparent conductive layer 530 was 110 nm in the light-emitting element 2, the thickness of the transparent conductive layer 530 was 30 nm in the light-emitting element 3, and the thickness of the transparent conductive layer 530 was 110 nm in the light-emitting element 4.

Then, as pretreatment of evaporation of an organic compound layer, the transparent conductive layer 530 side of the substrate 502 provided with the lower electrode 504 and the transparent conductive layer 530 was washed with water, baking was performed at 200° C. for one hour, and then UV ozone treatment was performed on a surface of the transparent conductive layer 530 for 370 seconds.

After that, the substrate 502 was transferred into a vacuum evaporation apparatus where the pressure had been reduced to approximately 10$^{-4}$ Pa, and was subjected to vacuum baking at 170° C. for 60 minutes in a heating chamber of the vacuum evaporation apparatus, and then the substrate 502 was cooled down for about 30 minutes.

Then, the substrate 502 was fixed to a holder provided in the vacuum evaporation apparatus so that a surface of the substrate 502 over which the transparent conductive layer 530 was formed faced downward. In Example 1, by a vacuum evaporation method, a hole-injection layer 531, a hole-transport layer 532, a first light-emitting layer 506, an electron-transport layer 533, charge-generation layers 508 (1) and 508(2), a hole-injection layer 534, a hole-transport layer 535, a second light-emitting layer 510, an electron-transport layer 536, electron-injection layers 537(1) and 537(2), and upper electrodes 512(1) and 512(2) were sequentially formed. The fabrication method is described in detail below.

First, the pressure in the vacuum evaporation apparatus was reduced to 10$^{-4}$ Pa. Then, on the transparent conductive layer 530, the hole-injection layer 531 was formed by co-evaporation of 1,3,5-tri(dibenzothiophen-4-yl)benzene (abbreviation: DBT3P-II) and molybdenum oxide at a weight ratio of 2:1 (DBT3P-II:molybdenum oxide). Note that the thickness of the hole-injection layer 531 was 15 nm in the light-emitting element 1, the thickness of the hole-injection layer 531 was 20 nm in the light-emitting element 2, the thickness of the hole-injection layer 531 was 50 nm in the light-emitting element 3, and the thickness of the hole-injection layer 531 was 35 nm in the light-emitting element 4.

Then, the hole-transport layer 532 was formed on the hole-injection layer 531. As the hole-transport layer 532, 4-phenyl-4'-(9-phenylfluoren-9-yl)triphenylamine (abbreviation: BPAFLP) was evaporated. Note that the thickness of the hole-transport layer 532 was 10 nm.

Then, the first light-emitting layer 506 was formed on the hole-transport layer 532. The first light-emitting layer 506 was formed by co-evaporation of 2-[3'-(dibenzothiophen-4-yl)biphenyl-3-yl]dibenzo[f,h]quinoxaline (abbreviation: 2mDBTBPDBq-II), N-(1,1'-biphenyl-4-yl)-9,9-dimethyl-N-[4-(9-phenyl-9H-carbazol-3-yl)phenyl]-9H-fluoren-2-amine (abbreviation: PCBBiF), and (acetylacetonato)bis[5-methyl-6-(2-methylphenyl)-4-phenylpyrimidinato]iridium(III) (another name: bis{2-[5-methyl-6-(2-methylphenyl)-4-pyrimidinyl-κN3]phenyl-κC}(2,4-pentanedionato-κ$^2$O,O')iridium (III)) (abbreviation: Ir(mpmppm)$_2$(acac)) at a weight ratio of 0.8:0.2:0.06 (2mDBTBPDBq-II:PCBBiF:Ir(mpmppm)$_2$ (acac)). Note that the thickness of the first light-emitting layer 506 was 30 nm. Note that 2mDBTBPDBq-II was the host material, PCBBiF was the assist material, and Ir(mpmppm)$_2$(acac) was the phosphorescent material (the guest material) in the first light-emitting layer 506.

Then, on the first light-emitting layer 506, the electron-transport layer 533 was formed by evaporation of bathophenanthroline (abbreviation: Bphen). Note that the thickness of the electron-transport layer 533 was 10 nm.

Then, on the electron-transport layer 533, the charge-generation layer 508(1) was formed by evaporation of lithium oxide (Li$_2$O). Note that the thickness of the charge-generation layer 508(1) was 0.1 nm. Next, on the charge-generation layer 508(1), the charge-generation layer 508(2) was formed by evaporation of copper(II) phthalocyanine (abbreviation: CuPc). Note that the thickness of the charge-generation layer 508(2) was 2 nm.

Then, on the charge-generation layer 508(2), the hole-injection layer 534 was formed by co-evaporation of 3-[4-(9-phenanthryl)-phenyl]-9-phenyl-9H-carbazole (abbreviation: PCPPn) and molybdenum oxide at a weight ratio of 2:1 (PCPPn:molybdenum oxide). Note that the thickness of the hole-injection layer 534 was 5 nm.

Then, on the hole-injection layer 534, the hole-transport layer 535 was fat tied by evaporation of PCPPn. Note that the thickness of the hole-transport layer 535 was 5 nm in each of the light-emitting elements 1, 3, and 4, and the thickness of the hole-transport layer 535 was 10 nm in the light-emitting element 2.

Next, on the hole-transport layer 535, the second light-emitting layer 510 was formed by co-evaporation of 7-[4-(10-phenyl-9-anthryl)phenyl]-7H-dibenzo[c,g]carbazole (abbreviation: cgDBCzPA) and N,N'-(pyrene-1,6-diyl)bis[(6,N-diphenylbenzo[b]naphtho[1,2-d]furan)-8-amine] (abbreviation: 1,6BnfAPrn-03) at a weight ratio of 1:0.03 (cgDBCzPA:1,6BnfAPrn-03). Note that the thickness of the second light-emitting layer 510 was 25 mm. Note that cgDBCzPA was the host material and 1,6BnfAPrn-03 was the fluorescent material (the guest material) in the second light-emitting layer 510.

Then, on the second light-emitting layer 510, the electron-transport layer 536 was formed by evaporation of cgDBCzPA. Note that the thickness of the electron-transport layer 536 was 5 nm.

Next, on the electron-transport layer 536, the electron-injection layer 537(1) was formed by evaporation of Bphen. Note that the thickness of the electron-injection layer 537(1) was 10 nm. Then, on the electron-injection layer 537(1), the electron-injection layer 537(2) was formed by evaporation of lithium fluoride (LiF). Note that the thickness of the electron-injection layer 537(2) was 1 nm.

Then, on the electron-injection layer 537(2), the upper electrode 512(1) was formed by co-evaporation of silver (Ag) and magnesium (Mg) at a volume ratio of 1:0.1. Note that the thickness of the upper electrode 512(1) was 15 nm.

Then, on the upper electrode 512(1), indium tin oxide (ITO) was deposited as the upper electrode 512(2) by a sputtering method. Note that the thickness of the upper electrode 512(2) was 70 nm.

Next, a sealing substrate 552 was prepared. As shown in FIG. 30, Table 1, and Table 2, as a coloring layer 556 on the sealing substrate 552, a red (R) color filter, a green (G) color filter, a blue (B) color filter, and a yellow (Y) color filter were formed in the light-emitting elements 1, 2, 3, and 4, respectively.

Each of the light-emitting elements over the substrate 502 fabricated as described above was sealed by being bonded to the sealing substrate 552 in a glove box in a nitrogen atmosphere so as not to be exposed to the air (specifically, a sealant was applied to surround the element, and irradiation with ultraviolet light having a wavelength of 365 nm at 6 J/cm$^2$ and then heat treatment at 80° C. for one hour were performed for the sealant).

Through the above steps, the light-emitting elements 1 to 4 were fabricated.

Note that in all the above evaporation steps for the light-emitting elements 1 to 4, a resistive heating method was used as an evaporation method.

<1-2. Characteristics of Light-Emitting Elements 1 to 4>

Figure 31A:
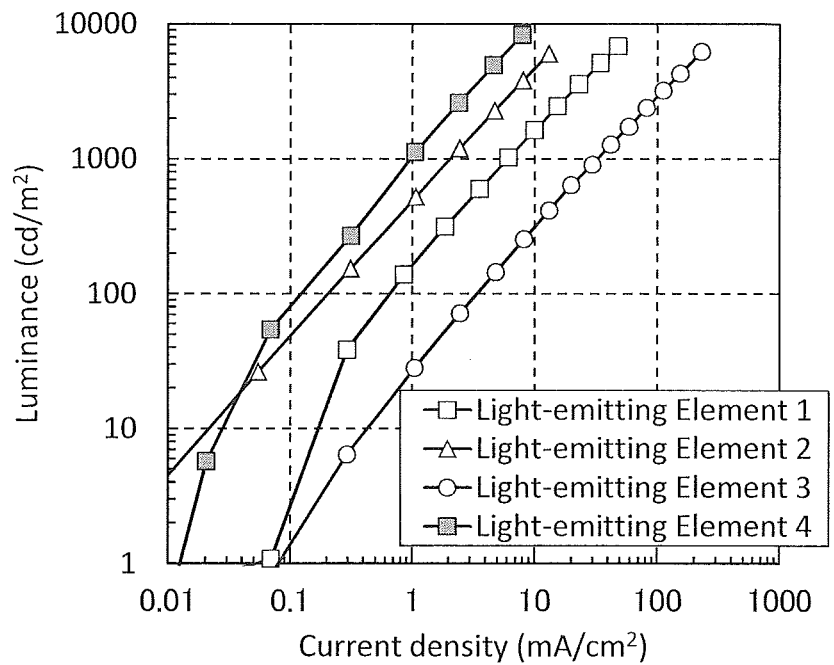
FIGS. 31A and 31B show luminance-current density characteristics and luminance-voltage characteristics, respectively, of light-emitting elements in Example.
Figure 31B:
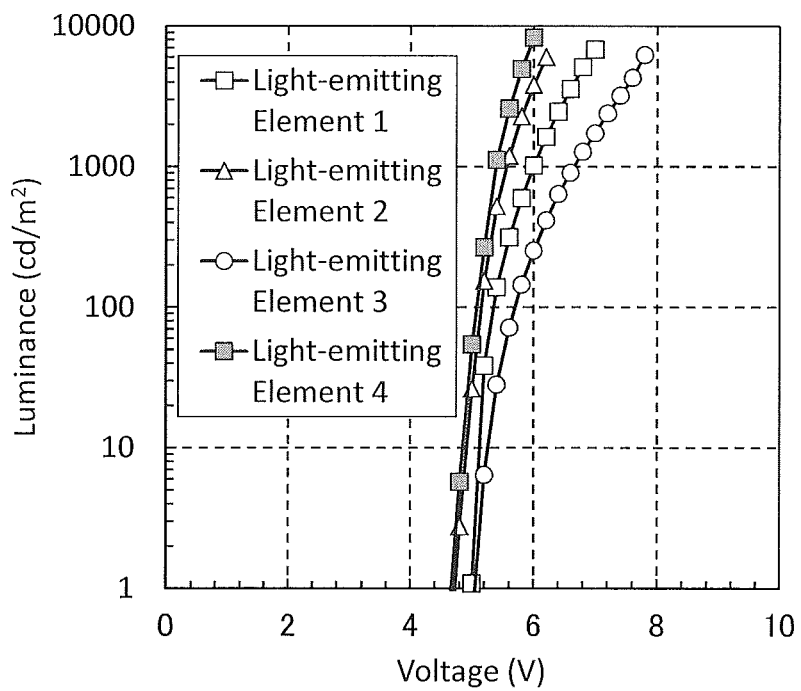
Figure 32A:
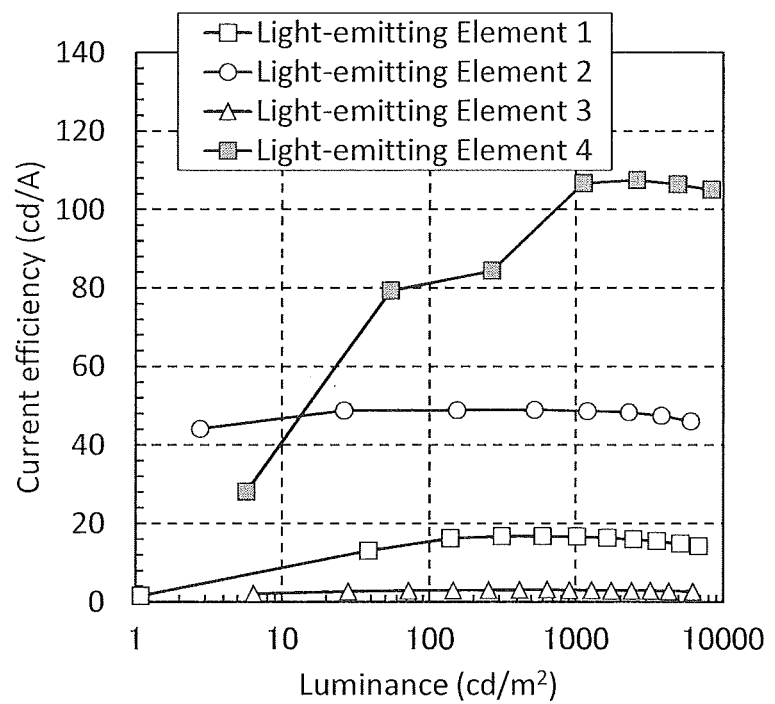
FIGS. 32A and 32B show current efficiency-luminance characteristics and emission spectra, respectively, of light-emitting elements in Example.

FIGS. 31A, 31B, and 32A show luminance-current density characteristics, luminance-voltage characteristics, and current efficiency-luminance characteristics, respectively, of the light-emitting elements 1 to 4. Note that the measurements of the light-emitting elements were carried out at room temperature (in an atmosphere kept at 25° C.).

Table 3 shows element characteristics of the light-emitting elements 1 to 4 at around 1000 cd/m$^2$.

TABLE 3

| | Voltage (V) | Current (mA) | Current density (mA/cm$^2$) | Chromaticity (x, y) | Luminance (cd/m$^2$) | Current efficiency (cd/A) |
|---|---|---|---|---|---|---|
| Light-emitting element 1 | 6.0 | 0.24 | 6.1 | (0.66, 0.34) | 1020 | 16.7 |
| Light-emitting element 2 | 5.6 | 0.10 | 2.5 | (0.33, 0.66) | 1197 | 48.7 |
| Light-emitting element 3 | 6.6 | 1.19 | 29.7 | (0.14, 0.05) | 909 | 3.1 |
| Light-emitting element 4 | 5.4 | 0.04 | 1.1 | (0.44, 0.56) | 1122 | 106.7 |

Figure 32B:
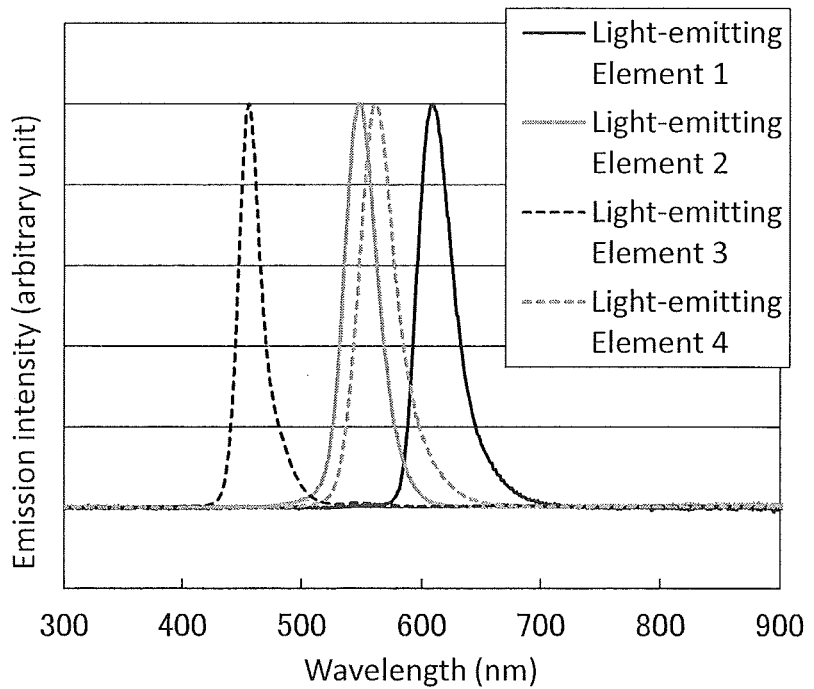

FIG. 32B shows emission spectra when a current at a current density of 2.5 mA/cm$^2$ was supplied to the light-emitting elements 1 to 4. As shown in FIG. 32B, an emission spectrum of the light-emitting element 1 has a peak in the red wavelength range, an emission spectrum of the light-emitting element 2 has a peak in the green wavelength range, an emission spectrum of the light-emitting element 3 has a peak in the blue wavelength range, and an emission spectrum of the light-emitting element 4 has a peak in the yellow wavelength range. Thus, when the light-emitting elements 1 to 4 are used in combination, full-color light-emitting device can be achieved.

In each of the light-emitting elements 1, 2, and 4, the distance between the bottom surface of the upper electrode 512 and the bottom surface of the first light-emitting layer 506 was 93.1 nm; and in the light-emitting element 3, the distance between the bottom surface of the upper electrode 512 and the bottom surface of the first light-emitting layer 506 and was 98.1 nm. In the light-emitting element 3, the distance between the bottom surface of the upper electrode 512 and the bottom surface of the second light-emitting layer 510 and was 41 nm.

In each of the light-emitting elements 1, 2, and 4, the distance between the top surface of the first light-emitting layer 506 and the bottom surface of the second light-emitting layer 510, that is, the total thickness of the electron-transport layer 533, the charge-generation layers 508(1) and 508(2), the hole-injection layer 534, and the hole-transport layer 535 was 22.1 nm. In the light-emitting element 3, the distance between the top surface of the first light-emitting layer 506 and the bottom surface of the second light-emitting layer 510, that is, the total thickness of the electron-transport layer 533, the charge-generation layers 508(1) and 508(2), the hole-injection layer 534, and the hole-transport layer 535 was 27.1 nm. Thus, in the light-emitting elements 1 to 4 of one embodiment of the present invention, the distance between the top surface of the first light-emitting layer 506 and the bottom surface of the second light-emitting layer 510 was less than or equal to 40 nm.

As described above, when the distance between the bottom surface of the upper electrode 512 and the bottom surface of the first light-emitting layer 506 is less than or equal to 130 nm in each of the light-emitting elements 1 to 4, element characteristics having high efficiency and light emission in a desired wavelength range were obtained from the light-emitting elements 1 to 4 as shown in Table 3, FIGS. 31A and 31B, and FIGS. 32A and 32B.

The structure described in Example 1 can be combined with any of the structures described in the other examples and the embodiments as appropriate.

Example 2

In Example 2, an example of fabricating a light-emitting element of one embodiment of the present invention will be described. A schematic cross-sectional view of the light-emitting elements (a light-emitting element 5, a light-emitting element 6, a light-emitting element 7, a light-emitting element 8, and a light-emitting element 9) fabricated in Example 2 is shown in FIG. 30, the detailed structures of the light-emitting elements are shown in Table 4, Table 5, and Table 6. Note that the compounds used here were the same as those in Example 1.

TABLE 4

| | Layer | Reference numeral | Thickness (nm) | Material | Weight ratio |
|---|---|---|---|---|---|
| Light-emitting element 5 | Optical element | 556 | — | CF (Red) | — |
| | Upper electrode | 512(2) | 70 | ITO | — |
| | | 512(1) | 15 | Ag:Mg | 1:0.1*[1)] |
| | Electron-injection layer | 537(2) | 1 | LiF | — |
| | | 537(1) | 9 | Bphen | — |
| | Electron-transport layer | 536 | 5 | cgDBCzPA | — |
| | Second light-emitting layer | 510 | 25 | cgDBCzPA:1,6BnfAprn-03 | 1:0.03 |
| | Hole-transport layer | 535 | 7.5 | PCPPn | — |
| | Hole-injection layer | 534 | 5 | PCPPn:MoO$_3$ | 2:1 |
| | Charge-generation layer | 508(2) | 2 | CuPc | — |
| | | 508(1) | 0.1 | Li$_2$O | — |
| | Electron-transport layer | 533 | 9 | Bphen | — |
| | First light-emitting layer | 506 | 30 | 2mDBTBPDbq-II:PCBBiF:Ir(mpmppm)$_2$(acac) | 0.9:0.1:0.06 |
| | Hole-transport layer | 532 | 10 | BPAFLP | — |
| | Hole-injection layer | 531 | 15 | DBT3P-II:MoO$_3$ | 2:1 |
| | Transparent conductive layer | 530 | 150 | ITSO | — |
| | Lower electrode | 504 | 100 | APC | — |
| Light-emitting element 6 | Optical element | 556 | — | CF (Green) | — |
| | Upper electrode | 512(2) | 70 | ITO | — |
| | | 512(1) | 15 | Ag:Mg | 1:0.1*[1)] |
| | Electron-injection layer | 537(2) | 1 | LiF | — |
| | | 537(1) | 9 | Bphen | — |
| | Electron-transport layer | 536 | 5 | cgDBCzPA | — |
| | Second light-emitting layer | 510 | 25 | cgDBCzPA:1,6BnfAprn-03 | 1:0.03 |
| | Hole-transport layer | 535 | 7.5 | PCPPn | — |
| | Hole-injection layer | 534 | 5 | PCPPn:MoO$_3$ | 2:1 |
| | Charge-generation layer | 508(2) | 2 | CuPc | — |
| | | 508(1) | 0.1 | Li$_2$O | — |
| | Electron-transport layer | 533 | 9 | Bphen | — |
| | First light-emitting layer | 506 | 30 | 2mDBTBPDBq-II:PCBBiF:Ir(mpmppm)$_2$(acac) | 0.9:0.1:0.06 |
| | Hole-transport layer | 532 | 10 | BPAFLP | — |

TABLE 4-continued

| Layer | Reference numeral | Thickness (nm) | Material | Weight ratio |
|---|---|---|---|---|
| Hole-injection layer | 531 | 20 | DBT3P-II:MoO$_3$ | 2:1 |
| Transparent conductive layer | 530 | 110 | ITSO | — |
| Lower electrode | 504 | 100 | APC | — |

*[1])volume ratio

TABLE 5

| | Layer | Reference numeral | Thickness (nm) | Material | Weight ratio |
|---|---|---|---|---|---|
| Light-emitting element 7 | Optical element | 556 | — | CF (Blue) | — |
| | Upper electrode | 512(2) | 70 | ITO | — |
| | | 512(1) | 15 | Ag:Mg | 1:0.1*[1]) |
| | Electron-injection layer | 537(2) | 1 | LiF | — |
| | | 537(1) | 9 | Bphen | — |
| | Electron-transport layer | 536 | 5 | cgDBCzPA | — |
| | Second light-emitting layer | 510 | 25 | cgDBCzPA:1,6BnfAprn-03 | 1:0.03 |
| | Hole-transport layer | 535 | 7.5 | PCPPn | — |
| | Hole-injection layer | 534 | 5 | PCPPn:MoO$_3$ | 2:1 |
| | Charge-generation layer | 508(2) | 2 | CuPc | — |
| | | 508(1) | 0.1 | Li$_2$O | — |
| | Electron-transport layer | 533 | 9 | Bphen | — |
| | First light-emitting layer | 506 | 30 | 2mDBTBPDBq-II:PCBBiF:Ir(mpmppm)$_2$(acac) | 0.9:0.1:0.06 |
| | Hole-transport layer | 532 | 10 | BPAFLP | — |
| | Hole-injection layer | 531 | 30 | DBT3P-II:MoO$_3$ | 2:1 |
| | Transparent conductive layer | 530 | 45 | ITSO | — |
| | Lower electrode | 504 | 100 | APC | — |
| Light-emitting element 8 | Optical element | 556 | — | CF (Yellow) | — |
| | Upper electrode | 512(2) | 70 | ITO | — |
| | | 512(1) | 15 | AgMg | 1:0.1*[1]) |
| | Electron-injection layer | 537(2) | 1 | LiF | — |
| | | 537(1) | 9 | Bphen | — |
| | Electron-transport layer | 536 | 5 | cgDBCzPA | — |
| | Second light-emitting layer | 510 | 25 | cgDBCzPA:1,6BnfAprn-03 | 1:0.03 |
| | Hole-transport layer | 535 | 7.5 | PCPPn | — |
| | Hole-injection layer | 534 | 5 | PCPPn:MoO$_3$ | 2:1 |
| | Charge-generation layer | 508(2) | 2 | CuPc | — |
| | | 508(1) | 0.1 | Li$_2$O | — |
| | Electron-transport layer | 533 | 9 | Bphen | — |
| | First light-emitting layer | 506 | 30 | 2mDBTBPDBq-II:PCBBiF:Ir(mpmppm)$_2$(acac) | 0.9:0.1:0.06 |
| | Hole-transport layer | 532 | 10 | BPAFLP | — |
| | Hole-injection layer | 531 | 35 | DBT3P-II:MoO$_3$ | 2:1 |
| | Transparent conductive layer | 530 | 110 | ITSO | — |
| | Lower electrode | 504 | 100 | APC | — |

*[1])volume ratio

TABLE 6

| | Layer | Reference numeral | Thickness (nm) | Material | Weight ratio |
|---|---|---|---|---|---|
| Light-emitting element 9 | Optical element | 556 | — | — | — |
| | Upper electrode | 512(2) | 70 | ITO | — |
| | | 512(1) | 15 | Ag:Mg | 1:0.1*[1)] |
| | Electron-injection layer | 537(2) | 1 | LiF | — |
| | | 537(1) | 9 | Bphen | — |
| | Electron-transport layer | 536 | 5 | cgDBCzPA | — |
| | Second light-emitting layer | 510 | 25 | cgDBCzPA:1,6BnfAprn-03 | 1:0.03 |
| | Hole-transport layer | 535 | 7.5 | PCPPn | — |
| | Hole-injection layer | 534 | 5 | PCPPn:MoO$_3$ | 2:1 |
| | Charge-generation layer | 508(2) | 2 | CuPc | — |
| | | 508(1) | 0.1 | Li$_2$O | — |
| | Electron-transport layer | 533 | 9 | Bphen | — |
| | First light-emitting layer | 506 | 30 | 2mDBTBPDBq-II:PCBBiF:Ir(mpmppm)$_2$(acac) | 0.9:0.1:0.06 |
| | Hole-transport layer | 532 | 10 | BPAFLP | — |
| | Hole-injection layer | 531 | 35 | DBT3P-II:MoO$_3$ | 2:1 |
| | Transparent conductive layer | 530 | 110 | ITSO | — |
| | Lower electrode | 504 | 100 | APC | — |

*[1)]volume ratio

<2-1. Fabrication Method of Light-Emitting Elements 5 to 9>

First, over the substrate 502, APC was formed as the lower electrode 504 by a sputtering method. Note that the thickness of the lower electrode 504 was 100 nm and the area of the lower electrode 504 was 4 mm$^2$ (2 mm×2 mm).

Then, over the lower electrode 504, ITSO was deposited as the transparent conductive layer 530 by a sputtering method. Note that the thickness of the transparent conductive layer 530 was 150 nm in the light-emitting element 5, the thickness of the transparent conductive layer 530 was 110 nm in each of the light-emitting elements 6, 8, and 9, and the thickness of the transparent conductive layer 530 was 45 nm in the light-emitting element 7.

Then, as pretreatment of evaporation of an organic compound layer, the transparent conductive layer 530 side of the substrate 502 provided with the lower electrode 504 and the transparent conductive layer 530 was washed with water, baking was performed at 200° C. for one hour, and then UV ozone treatment was performed on a surface of the transparent conductive layer 530 for 370 seconds.

After that, the substrate 502 was transferred into a vacuum evaporation apparatus where the pressure had been reduced to approximately 10$^{-4}$ Pa, and was subjected to vacuum baking at 170° C. for 60 minutes in a heating chamber of the vacuum evaporation apparatus, and then the substrate 502 was cooled down for about 30 minutes.

Then, the substrate 502 was fixed to a holder provided in the vacuum evaporation apparatus so that a surface of the substrate 502 over which the transparent conductive layer 530 was formed faced downward. In Example 2, by a vacuum evaporation method, the hole-injection layer 531, the hole-transport layer 532, the first light-emitting layer 506, the electron-transport layer 533, the charge-generation layers 508(1) and 508(2), the hole-injection layer 534, the hole-transport layer 535, the second light-emitting layer 510, the electron-transport layer 536, the electron-injection layers 537(1) and 537(2), and the upper electrodes 512(1) and 512(2) were sequentially formed. The fabrication method is described in detail below.

First, the pressure in the vacuum evaporation apparatus was reduced to 10$^{-4}$ Pa. Then, on the transparent conductive layer 530, the hole-injection layer 531 was formed by co-evaporation of DBT3P-II and molybdenum oxide at a weight ratio of 2:1 (DBT3P-II:molybdenum oxide). Note that the thickness of the hole-injection layer 531 was 15 nm in the light-emitting element 5, the thickness of the hole-injection layer 531 was 20 nm in the light-emitting element 6, the thickness of the hole-injection layer 531 was 30 nm in the light-emitting element 7, and the thickness of the hole-injection layer 531 was 35 nm in each of the light-emitting elements 8 and 9.

Then, the hole-transport layer 532 was formed on the hole-injection layer 531. As the hole-transport layer 532, BPAFLP was evaporated. Note that the thickness of the hole-transport layer 532 was 10 nm.

Then, the first light-emitting layer 506 was formed on the hole-transport layer 532. The first light-emitting layer 506 was formed by co-evaporation of 2mDBTBPDBq-II, PCBBiF, and Ir(mpmppm)$_2$(acac) at a weight ratio of 0.9:0.1:0.06 (2mDBTBPDBq-II:PCBBiF:Ir(mpmppm)$_2$(acac)). Note that the thickness of the first light-emitting layer 506 was 30 nm. Note that 2mDBTBPDBq-II was the host material, PCBBiF was the assist material, and Ir(mpmppm)$_2$(acac) was the phosphorescent material (the guest material) in the first light-emitting layer 506.

Then, on the first light-emitting layer 506, the electron-transport layer 533 was formed by evaporation of Bphen. Note that the thickness of the electron-transport layer 533 was 9 nm.

Then, on the electron-transport layer 533, the charge-generation layer 508(1) was formed by evaporation of Li$_2$O. Note that the thickness of the charge-generation layer 508(1) was 0.1 nm. Next, on the charge-generation layer 508(1), the charge-generation layer 508(2) was formed by evaporation of CuPc. Note that the thickness of the charge-generation layer 508(2) was 2 nm.

Then, on the charge-generation layer 508(2), the hole-injection layer 534 was formed by co-evaporation of PCPPn and molybdenum oxide at a weight ratio of 2:1 (PCPPn: molybdenum oxide). Note that the thickness of the hole-injection layer 534 was 5 nm.

Then, on the hole-injection layer 534, the hole-transport layer 535 was formed by evaporation of PCPPn. Note that the thickness of the hole-transport layer 535 was 7.5 nm.

Next, on the hole-transport layer 535, the second light-emitting layer 510 was formed by co-evaporation of cgDB-CzPA and 1,6BnfAPrn-03 at a weight ratio of 1:0.03 (cgDB-CzPA:1,6BnfAPrn-03). Note that the thickness of the second light-emitting layer 510 was 25 nm. Note that cgDBCzPA was the host material and 1;6BnfAPrn-03 was the fluorescent material (the guest material) in the second light-emitting layer 510.

Then, on the second light-emitting layer 510, the electron-transport layer 536 was formed by evaporation of cgDBCzPA. Note that the thickness of the electron-transport layer 536 was 5 nm.

Next, on the electron-transport layer 536, the electron-injection layer 537(1) was formed by evaporation of Bphen. Note that the thickness of the electron-injection layer 537(1) was 9 nm. Then, on the electron-injection layer 537(1), the electron-injection layer 537(2) was formed by evaporation of LiF. Note that the thickness of the electron-injection layer 537(2) was 1 nm.

Then, on the electron-injection layer 537(2), the upper electrode 512(1) was formed by co-evaporation of Ag and Mg at a volume ratio of 1:0.1. Note that the thickness of the upper electrode 512(1) was 15 nm. Then, on the upper electrode 512(1), ITO was deposited as the upper electrode 512(2) by a sputtering method. Note that the thickness of the upper electrode 512(2) was 70 nm.

Next, the sealing substrate 552 was prepared. As the coloring layer 556 on the sealing substrate 552, a red (R) color filter, a green (G) color filter, a blue (B) color filter, and a yellow (Y) color filter were formed in the light-emitting elements 5, 6, 7, and 8, respectively. Note that the sealing substrate 552 of the light-emitting element 9 is not provided with the coloring layer 556.

The light-emitting element over the substrate 502 fabricated as described above was sealed by being bonded to the sealing substrate 552 in a glove box in a nitrogen atmosphere so as not to be exposed to the air. Note that the sealing method was the same as that in Example 1.

Through the above steps, the light-emitting elements 5 to 9 were fabricated.

Note that in all the above evaporation steps for the light-emitting elements 5 to 9, a resistive heating method was used as an evaporation method.

<2-2. Characteristics of Light-Emitting Elements 5 to 9>

Figure 33A:
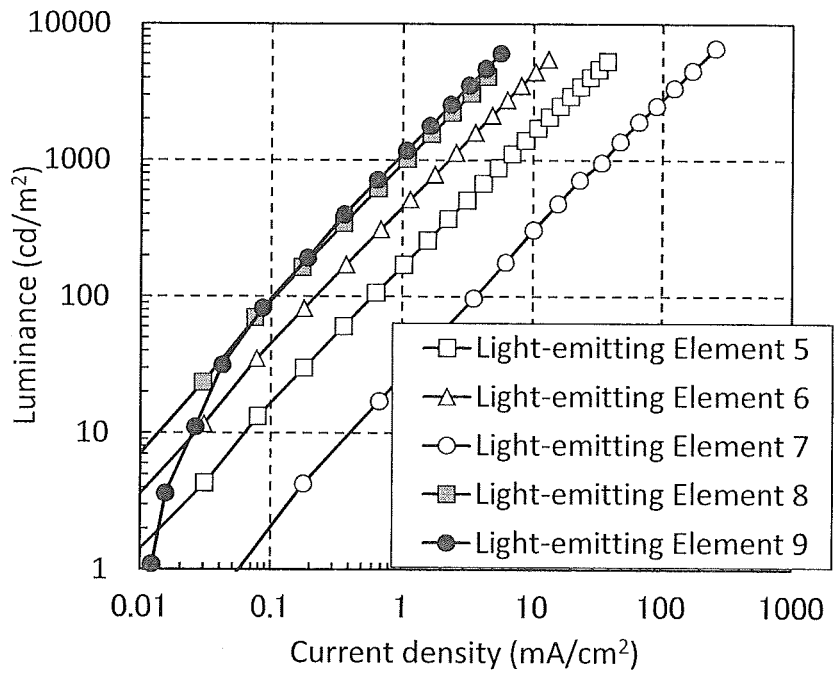
FIGS. 33A and 33B show luminance-current density characteristics and luminance-voltage characteristics, respectively, of light-emitting elements in Example.
Figure 33B:
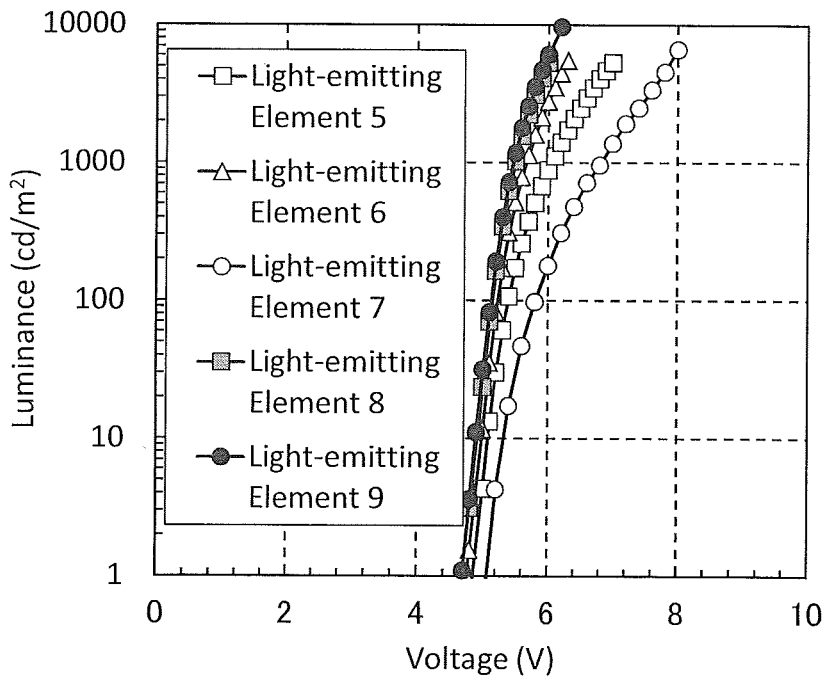
Figure 34A:
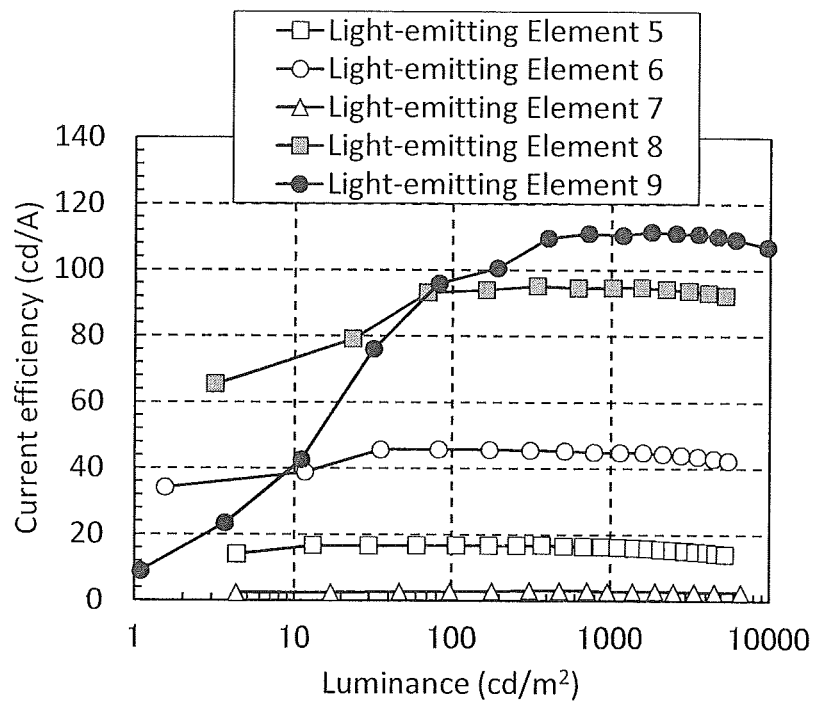
FIGS. 34A and 34B show current efficiency-luminance characteristics and emission spectra, respectively, of light-emitting elements in Example.

FIGS. 33A, 33B, and 34A show luminance-current density characteristics, luminance-voltage characteristics, and current efficiency-luminance characteristics, respectively, of the light-emitting elements 5 to 9. Note that the measurements of the light-emitting elements were carried out at room temperature (in an atmosphere kept at 25° C.).

Table 7 shows element characteristics of the light-emitting elements 5 to 9 at around 1000 cd/m².

TABLE 7

|  | Voltage (V) | Current (mA) | Current density (mA/cm²) | Chromaticity (x, y) | Luminance (cd/m²) | Current efficiency (cd/A) |
|---|---|---|---|---|---|---|
| Light-emitting element 5 | 6.1 | 0.28 | 6.9 | (0.66, 0.34) | 1113 | 16.2 |
| Light-emitting element 6 | 5.7 | 0.10 | 2.5 | (0.33, 0.66) | 1140 | 44.8 |
| Light-emitting element 7 | 6.8 | 1.36 | 34.0 | (0.14, 0.05) | 960 | 2.8 |
| Light-emitting element 8 | 5.5 | 0.04 | 1.1 | (0.45, 0.55) | 1022 | 94.7 |
| Light-emitting element 9 | 5.5 | 0.04 | 1.1 | (0.45, 0.54) | 1180 | 110.6 |

Figure 34B:
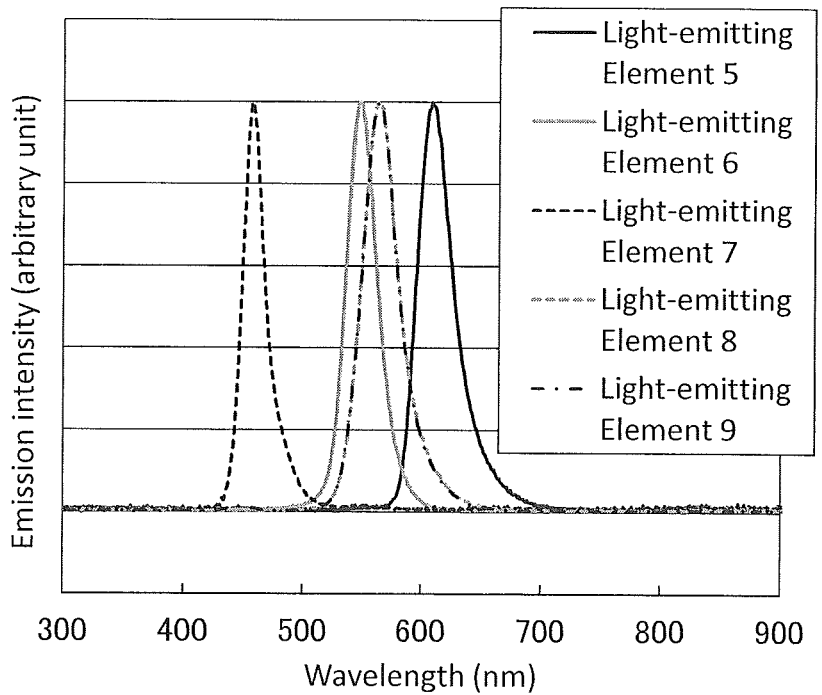

FIG. 34B shows emission spectra when a current at a current density of 2.5 mA/cm² was supplied to the light-emitting elements 5 to 9. As shown in FIG. 34B, an emission spectrum of the light-emitting element 5 has a peak in the red wavelength range, an emission spectrum of the light-emitting element 6 has a peak in the green wavelength range, an emission spectrum of the light-emitting element 7 has a peak in the blue wavelength range, and an emission spectrum of each of the light-emitting elements 8 and 9 has a peak in the yellow wavelength range. Thus, when the light-emitting elements 5 to 9 are used in combination, full-color light-emitting device can be achieved.

In each of the light-emitting elements 5 to 9, the distance between the bottom surface of the upper electrode 512 and the bottom surface of the first light-emitting layer 506 was 93.6 nm. In the light-emitting element 7, the distance between the bottom surface of the upper electrode 512 and the bottom surface of the second light-emitting layer 510 was 40 nm.

In each of the light-emitting elements 5 to 9, the distance between the top surface of the first light-emitting layer 506 and the bottom surface of the second light-emitting layer 510, that is, the total thickness of the electron-transport layer 533, the charge-generation layers 508(1) and 508(2), the hole-injection layer 534, and the hole-transport layer 535 was 23.6 nm. Thus, in the light-emitting elements 5 to 9 of one embodiment of the present invention, the distance between the top surface of the first light-emitting layer 506 and the bottom surface of the second light-emitting layer 510 was less than or equal to 40 nm.

As described above, when the distance between the bottom surface of the upper electrode 512 and the bottom surface of the first light-emitting layer 506 is less than or equal to 130 nm in each of the light-emitting elements 5 to 9, element characteristics having high efficiency and light emission in a desired wavelength range were obtained from the light-emitting elements 5 to 9 as shown in Table 7, FIGS. 33A and 33B, and FIGS. 34A and 34B.

The structure described in Example 2 can be combined with any of the structures described in the other examples and the embodiments as appropriate.

Reference Example

A method for synthesizing 1,6BnfAPrn-03 that is the organic compound used in any of the above examples is described below. Note that the structure of 1,6BnfAPrn-03 is shown below.

[Chemical Formulae 3]

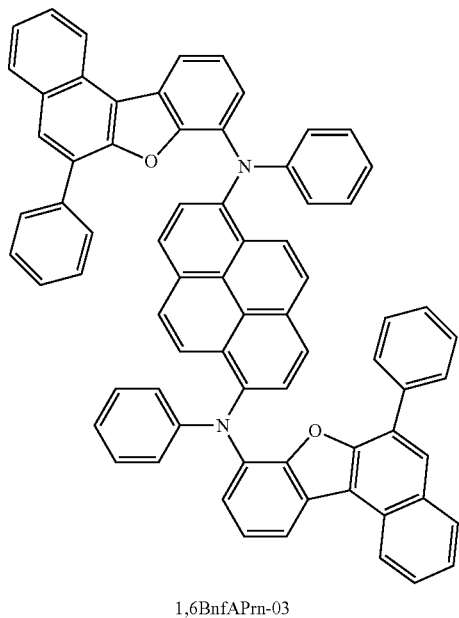

1,6BnfAPrn-03

Step 1: Synthesis of 6-iodobenzo[b]naphtho[1,2-d]furan

Into a 500 mL three-neck flask were put 8.5 g (39 mmol) of benzo[b]naphtho[1,2-d]furan, and the air in the flask was replaced with nitrogen. Then, 195 mL of tetrahydrofuran (THF) was added thereto. This solution was cooled to −75° C. Then, 25 mL (40 mmol) of n-butyllithium (a 1.59 mol/L n-hexane solution) was dropped into this solution. After the drop, the resulting solution was stirred at room temperature for one hour.

After a predetermined period of time, the resulting solution was cooled to −75° C. Then, a solution in which 10 g (40 mmol) of iodine had been dissolved in 40 mL of THF was dropped into this solution. After the drop, the resulting solution was stirred for 17 hours while the temperature of the solution was returned to room temperature. After a predetermined period of time, an aqueous solution of sodium thiosulfate was added to the mixture, and the resulting mixture was stirred for one hour. Then, an organic layer of the mixture was washed with water and dried with magnesium sulfate. After the drying, the mixture was gravity-filtered to give a solution. The resulting solution was suction-filtered through Celite (Catalog No. 531-16855 produced by Wako Pure Chemical Industries, Ltd.) and Florisil (Catalog No. 540-00135 produced by Wako Pure Chemical Industries, Ltd.) to give a filtrate. The resulting filtrate was concentrated to give a solid. The resulting solid was recrystallized from toluene to give 6.0 g (18 mmol) of a white powder of the target substance in 45% yield. A synthesis scheme of Step 1 is shown in (a-1).

[Chemical Formula 4]

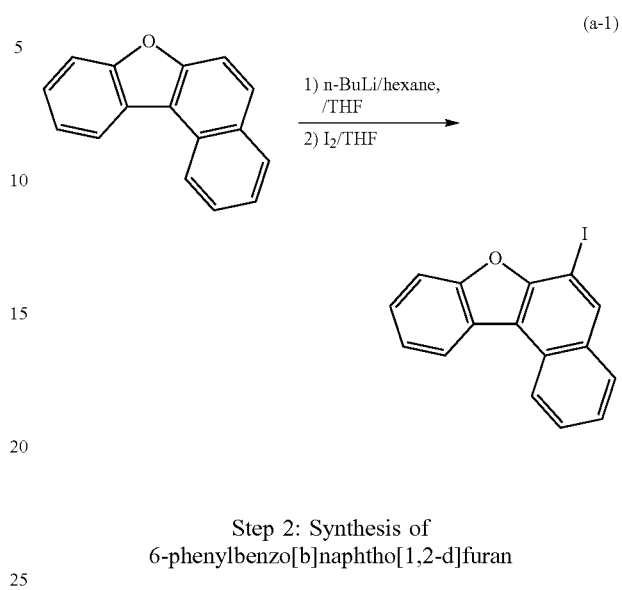

(a-1)

Step 2: Synthesis of 6-phenylbenzo[b]naphtho[1,2-d]furan

Into a 200 mL three-neck flask were put 6.0 g (18 mmol) of 6-iodobenzo[b]naphtho[1,2-d]furan, 2.4 g (19 mmol) of phenylboronic acid, 70 mL of toluene, 20 mL of ethanol, and 22 mL of an aqueous solution of potassium carbonate (2.0 mol/L). This mixture was degassed by being stirred while the pressure was reduced. After the degassing, the air in the flask was replaced with nitrogen, and then 480 mg (0.42 mmol) of tetrakis(triphenylphosphine)palladium(0) was added to the mixture. The resulting mixture was stirred at 90° C. under a nitrogen stream for 12 hours.

After a predetermined period of time, water was added to the mixture, and an aqueous layer was subjected to extraction with toluene. The extracted solution and an organic layer were combined, and the mixture was washed with water and then dried with magnesium sulfate. The mixture was gravity-filtered to give a filtrate. The resulting filtrate was concentrated to give a solid, and the resulting solid was dissolved in toluene. The resulting solution was suction-filtered through Celite (Catalog No. 531-16855 produced by Wako Pure Chemical Industries, Ltd.), Florisil (Catalog No. 540-00135 produced by Wako Pure Chemical Industries, Ltd.), and alumina to give a filtrate. The resulting filtrate was concentrated to give a solid. The resulting solid was recrystallized from toluene to give a 4.9 g (17 mmol) of a white solid of the target substance in 93% yield. A synthesis scheme of Step 2 is shown in (a-2).

[Chemical Formula 5]

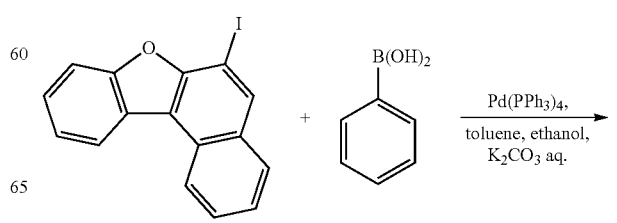

(a-2)

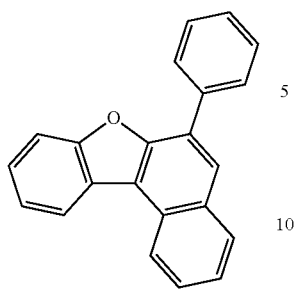

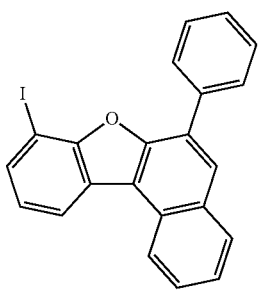

Step 3: Synthesis of
8-iodo-6-phenylbenzo[b]naphtho[1,2-d]furan

Into a 300 mL three-neck flask was put 4.9 g (17 mmol) of 6-phenylbenzo[b]naphtho[1,2-d]furan, and the air in the flask was replaced with nitrogen. Then, 87 mL of tetrahydrofuran (THF) was added thereto. The resulting solution was cooled to −75° C. Then, 11 mL (18 mmol) of n-butyllithium (a 1.59 mol/L n-hexane solution) was dropped into the solution. After the drop, the resulting solution was stirred at room temperature for one hour. Then, after a predetermined period of time, a solution in which 4.6 g (18 mmol) of iodine had been dissolved in 18 mL of THF was dropped into the resulting solution.

The resulting solution was stirred for 17 hours while the temperature of the solution was returned to room temperature. After a predetermined period of time, an aqueous solution of sodium thiosulfate was added to the mixture, and the resulting mixture was stirred for one hour. Then, an organic layer of the mixture was washed with water and dried with magnesium sulfate. The mixture was gravity-filtered to give a filtrate. The resulting filtrate was suction-filtered through Celite (Catalog No. 531-16855 produced by Wako Pure Chemical Industries, Ltd.), Florisil (Catalog No. 540-00135 produced by Wako Pure Chemical Industries, Ltd.), and alumina to give a filtrate. The resulting filtrate was concentrated to give a solid. The resulting solid was recrystallized from toluene to give 3.7 g (8.8 mmol) of a white solid of the target substance in 53% yield. A synthesis scheme of Step 3 is shown in (a-3).

Step 4: Synthesis of 1,6BnfAPrn-03

Into a 100 mL three-neck flask were put 0.71 g (2.0 mmol) of 1,6-dibromopyrene, 1.0 g (10.4 mmol) of sodium-tert-butoxide, 10 mL of toluene, 0.36 mL (4.0 mmol) of aniline, and 0.3 mL of tri(tert-butyl)phosphine (a 10 wt % hexane solution), and the air in the flask was replaced with nitrogen. To this mixture was added 50 mg (85 μmol) of bis(dibenzylideneacetone)palladium(0), and the resulting mixture was stirred at 80° C. for 2 hours.

After a predetermined period of time, to the resulting mixture were added 1.7 g (4.0 mmol) of 8-iodo-6-phenyl-benzo[b]naphtho[1,2-d]furan, 180 mg (0.44 mmol) of 2-di-cyclohexylphosphino-2',6'-dimethoxybiphenyl (abbreviation: S-Phos), and 50 mg (85 μmol) of bis(dibenzylideneacetone)palladium(0), and the resulting mixture was stirred at 100° C. for 15 hours. After a predetermined period of time, the resulting mixture was filtered through Celite (Catalog No. 531-16855 produced by Wako Pure Chemical Industries, Ltd.) to give a filtrate. The resulting filtrate was concentrated to give a solid. The resulting solid was washed with ethanol and recrystallized from toluene to give 1.38 g (1.4 mmol) of a yellow solid of the target substance in 71% yield.

By a train sublimation method, 1.37 g (1.4 mmol) of the resulting yellow solid was purified by sublimation. The purification by sublimation was conducted by heating the yellow solid at 370° C. at an argon flow rate of 10 mL/min under a pressure of 2.3 Pa. As a result of the purification by sublimation, 0.68 g (0.70 mmol) of the yellow solid was recovered at a collection rate of 50%. A synthesis scheme of Step 4 is shown in (a-4).

[Chemical Formula 6]

(a-3)

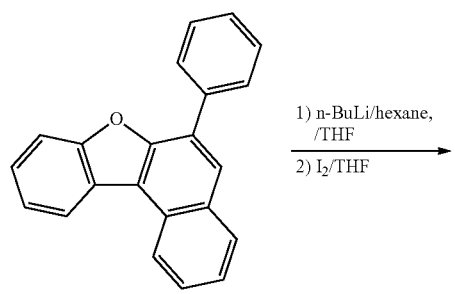

[Chemical Formulae 7]

(a-4)

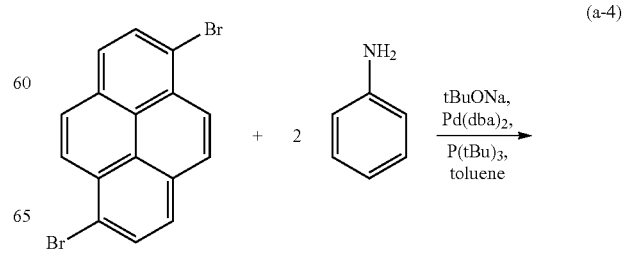

-continued

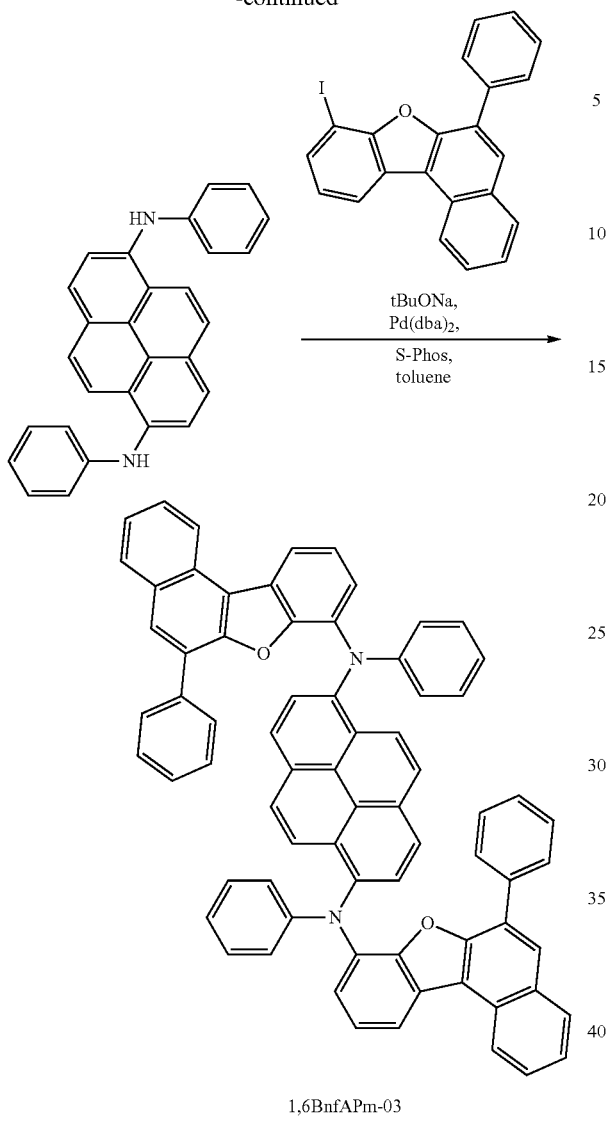

1,6BnfAPm-03

Analysis results by nuclear magnetic resonance ($^1$H NMR) spectroscopy of the yellow solid obtained in Step 4 are described below.

$^1$H NMR (dichloromethane-d2, 500 MHz): δ=6.88 (t, J=7.7 Hz, 4H), 7.03-7.06 (m, 6H), 7.11 (t, J=7.5 Hz, 2H), 7.13 (d, J=8.0 Hz, 2H), 7.28 (d, (in, 6H), 7.11 (t, J=8.0 Hz, 2H), 7.59 (t, J=7.2 Hz, 2H), 7.75 (t, J=7.7 Hz, 2H), 7.84 (d, J=9.0 Hz, 2H), 7.88 (d, J=8.0 Hz, 2H), 8.01 (s, 2H), 8.07 (d, J=8.0 Hz, 4H), 8.14 (d, J=9.0 Hz, 2H), 8.21 (d, J=8.0 Hz, 2H), 8.69 (d, J=8.5 Hz, 2H).

This application is based on Japanese Patent Application serial no. 2014-216876 filed with Japan Patent Office on Oct. 24, 2014, the entire contents of which are hereby incorporated by reference.

What is claimed is:

1. A light-emitting device comprising:
    a first light-emitting element emitting blue light;
    a second light-emitting element emitting green light; and
    a third light-emitting element emitting red light,
    the first light-emitting element comprising:
        a first lower electrode;
        a first transparent conductive layer over the first lower electrode;
        a first light-emitting layer over the first transparent conductive layer;
        a charge-generation layer over the first light-emitting layer;
        a second light-emitting layer over the charge-generation layer; and
        an upper electrode over the second light-emitting layer,
    the second light-emitting element comprising:
        a second lower electrode;
        a second transparent conductive layer over the second lower electrode;
        the first light-emitting layer over the second transparent conductive layer;
        the charge-generation layer over the first light-emitting layer;
        the second light-emitting layer over the charge-generation layer; and
        the upper electrode over the second light-emitting layer, and
    the third light-emitting element comprising:
        a third lower electrode;
        a third transparent conductive layer over the third lower electrode;
        the first light-emitting layer over the third transparent conductive layer;
        the charge-generation layer over the first light-emitting layer;
        the second light-emitting layer over the charge-generation layer; and
        the upper electrode over the second light-emitting layer,
    wherein an emission spectrum of the first light-emitting layer includes a peak at a longer wavelength than an emission spectrum of the second light-emitting layer, and
    wherein a distance between a bottom surface of the upper electrode and a bottom surface of the first light-emitting layer is less than or equal to 130 nm.

2. The light-emitting device according to claim 1, further comprising:
    a fourth light-emitting element emitting yellow light,
    the fourth light-emitting element comprising:
        a fourth lower electrode;
        a fourth transparent conductive layer over the fourth lower electrode;
        the first light-emitting layer over the fourth transparent conductive layer;
        the charge-generation layer over the first light-emitting layer;
        the second light-emitting layer over the charge-generation layer; and
        the upper electrode over the second light-emitting layer,
    wherein a distance between the fourth lower electrode and the upper electrode is less than or equal to 130 nm.

3. The light-emitting device according to claim 1,
    wherein the emission spectrum of the first light-emitting layer includes a peak in any one of a green wavelength range, a yellow green wavelength range, a yellow wavelength range, an orange wavelength range, and a red wavelength range, and
    wherein the emission spectrum of the second light-emitting layer includes a peak in any one of a violet wavelength range, a blue wavelength range, and a blue green wavelength range.

4. The light-emitting device according to claim 1,
wherein the first light-emitting layer includes a phosphorescent material, and
wherein the second light-emitting layer includes a fluorescent material.

5. The light-emitting device according to claim 1, wherein a distance between the bottom surface of the upper electrode and a bottom surface of the second light-emitting layer is less than 80 nm.

6. The light-emitting device according to claim 1, wherein a distance between a top surface of the first light-emitting layer and a bottom surface of the second light-emitting layer is less than or equal to 40 nm.

7. A lighting device comprising the light-emitting device according to claim 1 and a housing.

* * * * *